US011937496B2

(12) United States Patent
Kim et al.

(10) Patent No.: US 11,937,496 B2
(45) Date of Patent: Mar. 19, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Soyeon Kim, Seoul (KR); Jiyoun Lee, Anyang-si (KR); Yongsuk Cho, Hwaseong-si (KR); Jongwon Choi, Yongin-si (KR); Dmitry Kravchuk, Hwaseong-si (KR); Banglin Lee, Suwon-si (KR); Yoonhyun Kwak, Seoul (KR); Hyun Koo, Seongnam-si (KR); Seokhwan Hong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 779 days.

(21) Appl. No.: 16/831,696

(22) Filed: Mar. 26, 2020

(65) Prior Publication Data

US 2020/0313097 A1 Oct. 1, 2020

(30) Foreign Application Priority Data

Mar. 29, 2019 (KR) ........................ 10-2019-0037216
Mar. 25, 2020 (KR) ........................ 10-2020-0036053

(51) Int. Cl.

| | |
|---|---|
| ***C07F 15/00*** | (2006.01) |
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 101/10*** | (2023.01) |

(52) U.S. Cl.

CPC ....... *H10K 85/342* (2023.02); *C07F 15/0033* (2013.01); *C09K 11/06* (2013.01); *C09K 2211/1029* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search

CPC ............ C09K 11/06; C09K 2211/1029; C09K 2211/185; H01L 51/0085; C07F 15/0033
See application file for complete search history.

(56) References Cited

U.S. PATENT DOCUMENTS

| | | | | |
|---|---|---|---|---|
| 6,465,115 | B2 | 10/2002 | Shi et al. | |
| 6,596,415 | B2 | 7/2003 | Shi et al. | |
| 9,917,264 | B2 | 3/2018 | Horiuchi et al. | |
| 10,038,152 | B2 | 7/2018 | Kosuge et al. | |
| 10,615,350 | B2 | 4/2020 | Kamatani et al. | |
| 2001/0019782 | A1 | 9/2001 | Igarashi et al. | |
| 2015/0357587 | A1 | 12/2015 | Kishino et al. | |
| 2020/0111977 | A1* | 4/2020 | Choi | C07F 15/0033 |
| 2020/0212319 | A1* | 7/2020 | Choi | C09B 69/008 |
| 2020/0308201 | A1* | 10/2020 | Lee | C07F 15/0033 |
| 2020/0308202 | A1* | 10/2020 | Cho | H01L 51/0074 |
| 2020/0308203 | A1* | 10/2020 | Kim | H01L 51/0085 |
| 2020/0313095 | A1* | 10/2020 | Lee | C07D 403/14 |
| 2021/0047354 | A1* | 2/2021 | Shih | C07F 15/004 |
| 2021/0193938 | A1* | 6/2021 | Kwak | C09K 11/06 |
| 2022/0298190 | A1* | 9/2022 | Shih | C07F 15/0033 |
| 2022/0352476 | A1* | 11/2022 | Boudreault | C09K 11/06 |

FOREIGN PATENT DOCUMENTS

| | | | |
|---|---|---|---|
| JP | 2000003782 | A | 1/2000 |
| JP | 2014127687 | A | 7/2014 |
| JP | 2014127688 | A | 7/2014 |
| JP | 2014139147 | A | 7/2014 |
| KR | 101468065 | B1 | 12/2014 |
| KR | 1020200083198 | A | 7/2020 |

OTHER PUBLICATIONS

M. A. Baldo,, et al., Appl. Phys. Lett. 1999, 75(3), 4, Very high-efficiency green organic light-emitting devicesbased on electrophosphorescence.
Raymond C. Kwong, et al., Appl. Phys. Lett., vol. 81, No. 1, Jul. 1, 2002, High operational stability of electrophosphorescent devices.
Sergey Lamansky, et al., Inorg. Chem. 2001, 40, 1704-1711, Synthesis and Characterization of PhosphorescentCyclometalated Iridium Complexes.
Sergey Lamansky, et al., J. Am. Chem. Soc. 2001, 123, 4304-4312, Highly Phosphorescent Bis-Cyclometalated IridiumComplexes: Synthesis, Photophysical Characterization, andUse in Organic LightEmitting Diodes.

* cited by examiner

*Primary Examiner* — Amanda L. Aguirre
(74) *Attorney, Agent, or Firm* — CANTOR COLBURN LLP

(57) ABSTRACT

Provided is an organometallic compound represented by Formula 1, an organic light-emitting device including the same, and an electronic apparatus including the organic light-emitting device.

$$Ir(L_1)(L_2)(L_3) \quad \text{Formula 1}$$

$L_1$ to $L_3$ in Formula 1 are the same as described in the present specification.

19 Claims, 1 Drawing Sheet

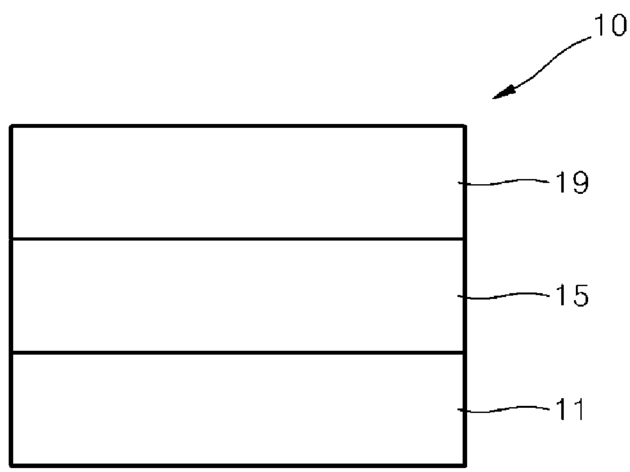
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims the priority to and benefit of Korean Patent Applications Nos. 10-2019-0037216, filed on Mar. 29, 2019, and 10-2020-0036053, filed on Mar. 25, 2020, in the Korean Intellectual Property Office, the content of which is incorporated herein in its entirety by reference.

BACKGROUND

1. Field

One or more embodiments relate to an organometallic compound, an organic light-emitting device including the same, and an electronic apparatus including the organic light-emitting device.

2. Description of Related Art

Organic light-emitting devices are self-emission devices, which have improved characteristics in terms of a viewing angle, a response time, brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to one aspect, an organometallic compound represented by Formula 1 is provided.

$$Ir(L_1)(L_2)(L_3) \quad \text{Formula 1}$$

In Formula 1, $L_1$ may be a ligand represented by Formula 1-1, $L_2$ may be a ligand represented by Formula 1-2, $L_3$ may be a ligand represented by Formula 1-3, and $L_1$ and $L_2$ may be different from each other.

Formula 1-1

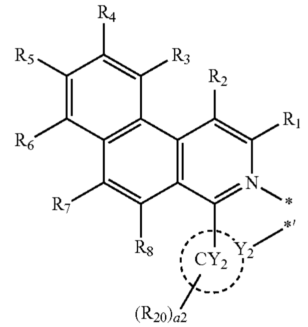

Formula 1-2

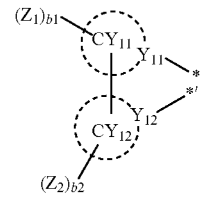

Formula 1-3

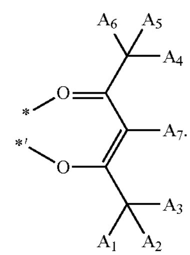

In Formulae 1-1 to 1-3, $Y_2$ may be C, $Y_{11}$ and $Y_{12}$ may each independently be C or N, ring $CY_2$, ring $CY_{11}$, and ring $CY_{12}$ may each independently be a $C_5$-$C_{30}$ carbocyclic group or a $C_1$-$C_{30}$ heterocyclic group, $R_1$ to $R_8$, $R_{20}$, $Z_1$, $Z_2$, and $A_1$ to $A_7$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a2, b1, and b2 may each independently be an integer from 0 to 20, wherein, when a2 is 2 or more, two or more of $R_{20}$(s) may be identical to or different from each other, when b1 is 2 or more, two or more of $Z_1$(s) may be identical to or different from each other, and when b2 is 2 or more, two or more of $Z_2$(s) may be identical to or different from each other, at least one of $R_1$ to $R_8$, at least one of $R_{20}$(s) in the number of a2, or any combination thereof may each independently be a fluoro group (—F) or a fluorinated group, two or more of $R_1$ to $R_8$ may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $R_{20}$(s) in the number of a2 may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $Z_1$(s) in the number of b1 may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $Z_2$(s) in the number of b2 may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $A_1$ to $A_7$ may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$,

* and *' each indicate a binding site to Ir in Formula 1, $R_{1a}$ may be the same as described in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof, $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$ or $—P(Q_{38})(Q_{39})$, or any combination thereof, wherein $Q_1$ to $Q_9$, $Q_{11}$ to $Q_{19}$, $Q_{21}$ to $Q_{29}$ and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group which is unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group which is unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Another aspect provides an organic light-emitting device including a first electrode, a second electrode, and an organic layer including an emission layer between the first electrode and the second electrode, wherein the organic layer includes at least one organometallic compound represented by Formula 1.

The organometallic compound may be included in the emission layer of the organic layer, and the organometallic compound included in the emission layer may act as a dopant.

Another aspect of the present disclosure provides an electronic apparatus including the organic light-emitting device.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

$$Ir(L_1)(L_2)(L_3) \qquad \text{Formula 1}$$

In Formula 1, $L_1$ may be a ligand represented by Formula 1-1, $L_2$ may be a ligand represented by Formula 1-2, and $L_3$ may be a ligand represented by Formula 1-3:

Formula 1-1

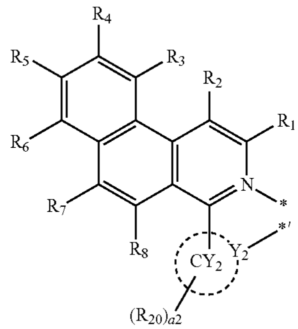

Formula 1-2

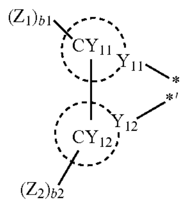

Formula 1-3

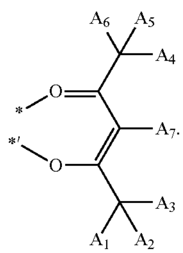

Formulae 1-1 to 1-3 are the same as described above.

$L_1$ and $L_2$ in Formula 1 may be different from each other. Accordingly, the organometallic compound represented by Formula 1 may include three different ligands.

$Y_2$ in Formula 1-1 may be C.

$Y_{11}$ and $Y_{12}$ in Formula 1-2 may each independently be C or N.

For example, $Y_{11}$ may be N, and $Y_{12}$ may be C.

In Formulae 1-1 and 1-2, ring $CY_2$, ring $CY_{11}$ and ring $CY_{12}$ may each independently be a $C_5$-$C_{30}$ carbocyclic group or a $C_1$-$C_{30}$ heterocyclic group.

For example, ring $CY_2$, ring $CY_{11}$, and ring $CY_{12}$ in Formulae 1-1 and 1-2 may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_2$, ring $CY_{11}$, and ring $CY_{12}$ in Formulae 1-1 and 1-2 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, cyclopentadiene group, a silole group, borole group, phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a pyridine group condensed with a cyclohexane group, a pyridine group condensed with an adamantane group, or a benzene group condensed with an adamantane group.

In one or more embodiments, ring $CY_2$, ring $CY_{11}$ and ring $CY_{12}$ in Formulae 1-1 and 1-2 may each independently be a benzene group, a naphthalene group, a 1,2,3,4-tetrahydronaphthalene group, a thiophene group, a furan group, a pyrrole group, cyclopentadiene group, a silole group, a benzothiophene group, a benzofuran group, an indole group, an indene group, a benzosilole group, a dibenzothiophene group, a dibenzofuran group, a carbazole group, a fluorene group, a dibenzosilole group, a pyridine group condensed with a cyclohexane group, a pyridine group condensed with an adamantane group, a benzene group condensed with an adamantane group, a pyridine group, a quinoline group, or an isoquinoline group.

In one or more embodiments, ring $CY_2$ and ring $CY_{12}$ in Formulae 1-1 and 1-2 may each independently be a benzene group, a dibenzothiophene group, a dibenzofuran group, a carbazole group, a fluorene group, or a dibenzosilole group.

In one or more embodiments, ring $CY_{11}$ in Formula 1-2 may be a pyridine group, a quinoline group, or an isoquinoline group.

$R_1$ to $R_8$, $R_{20}$, $Z_1$, $Z_2$ and $A_1$ to $A_7$ in Formulae 1-1 to 1-3 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ are the same as described in the present specification.

In one or more embodiments, $R_{20}$ in Formula 1-1 may not include a fluoro group (—F) or a cyano group. For example, $R_{20}$ in Formula 1-1 may be a group that does not include a fluoro group (—F) or a cyano group.

In one or more embodiments, $R_{20}$, $Z_1$, and $Z_2$ in Formulae 1-1 and 1-2 may not include a fluoro group (—F) or a cyano group. For example, $R_{20}$, $Z_1$ and $Z_2$ in Formulae 1-1 and 1-2 may be a group that does not include a fluoro group (—F) or a cyano group.

In one or more embodiments, $R_1$ to $R_8$, $R_{20}$, $Z_1$, $Z_2$ and $A_1$ to $A_7$ in Formulae 1-1 to 1-3 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —B($Q_6$)($Q_7$), —P(═O)($Q_8$)($Q_9$), or —P($Q_8$)($Q_9$), wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, $C_1$-$C_{10}$ alkyl group, a phenyl group, or any combination thereof.

In this regard, $R_{20}$ may not include a fluoro group or a cyano group.

In one or more embodiments, $R_1$ to $R_8$, $R_{20}$, $Z_1$, $Z_2$ and $A_1$ to $A_7$ in Formulae 1-1 to 1-3 may each independently be hydrogen, deuterium, —F, —$CH_3$, —$CD_3$, —$CD_2H$, —$CDH_2$, —$CF_3$, —$CF_2H$, —$CFH_2$, $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-237, a group represented by one of Formulae 9-201 to 9-237 in which at least one hydrogen is substituted with deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen of one is substituted with deuterium, or a group represented by one of Formulae 10-201 to 10-350 in which at least one hydrogen is substituted with —F.

In one or more embodiments, at least one of R, to $R_8$ of Formula 1-1 may each independently be —F, —$CF_3$, —$CF_2H$, —$CFH_2$, a group represented by one of Formulae 9-1 to 9-39 in which at least one hydrogen is substituted with —F, a group represented by one of Formulae 9-201 to 9-237 in which at least one hydrogen is substituted with —F, a group represented by one of Formulae 10-1 to 10-129 in which at least one hydrogen is substituted with —F, or a group represented by one of Formulae 10-201 to 10-350 in which at least one hydrogen is substituted with —F:

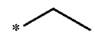
9-1

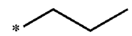
9-2

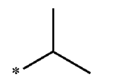
9-3

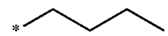
9-4

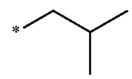
9-5

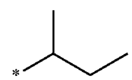
9-6

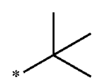
9-7

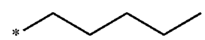
9-8

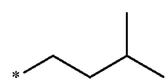
9-9

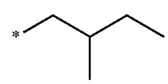
9-10

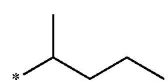
9-11

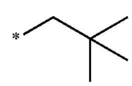
9-12

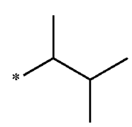
9-13

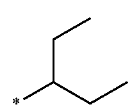
9-14

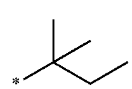
9-15

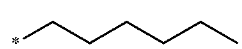
9-16

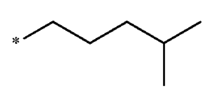
9-17

-continued
9-18
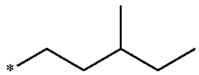
9-19
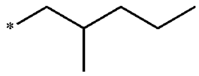
9-20
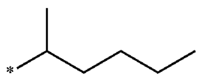
9-21
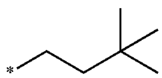
9-22
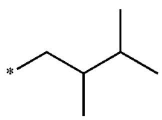
9-23
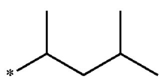
9-24
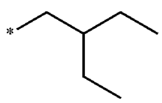
9-25
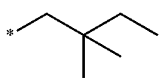
9-26
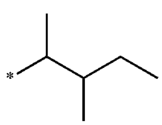
9-27
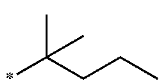
9-28
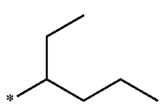
9-29
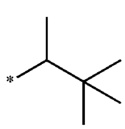
9-30
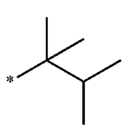
9-31
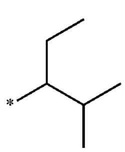
9-32
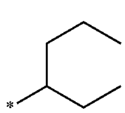
-continued
9-33
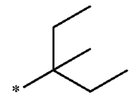
9-34
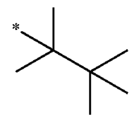
9-35
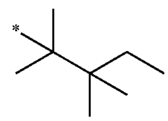
9-36
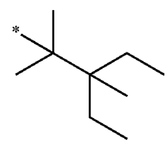
9-37
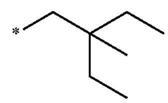
9-38
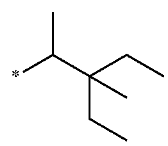
9-39
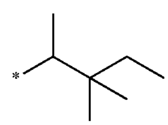
9-201
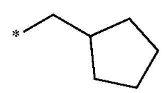
9-202
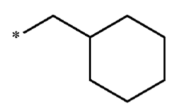
9-203
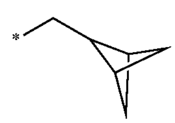
9-204
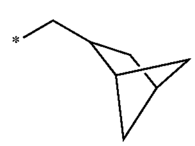
9-205
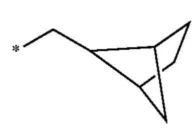

-continued
9-206
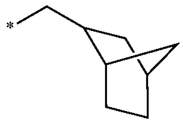
9-207
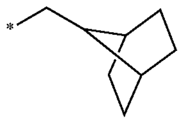
9-208
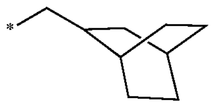
9-209
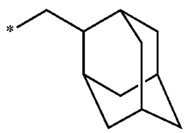
9-210
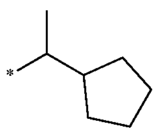
9-211
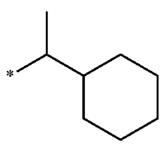
9-212
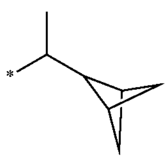
9-213
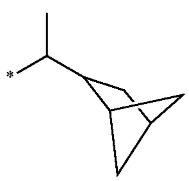
9-214
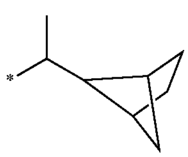
9-215
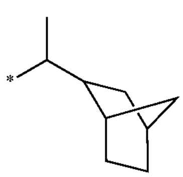
-continued
9-216
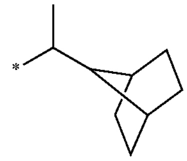
9-217
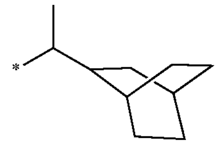
9-218
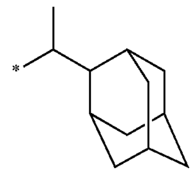
9-219
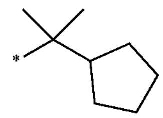
9-220
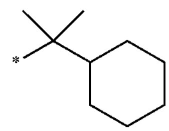
9-221
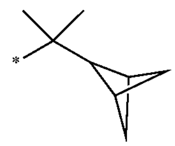
9-222
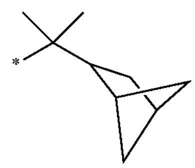
9-223
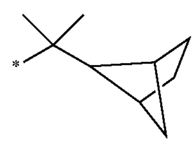
9-224
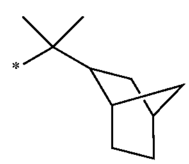
9-225
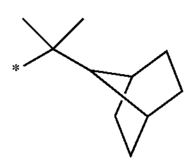

-continued
9-226
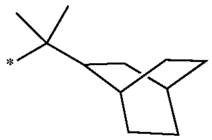
9-227
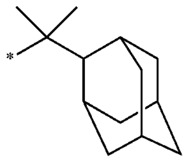
9-228
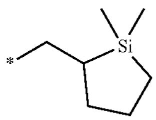
9-229
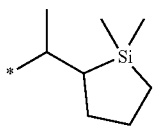
9-230
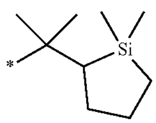
9-231
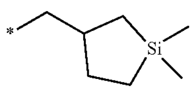
9-232
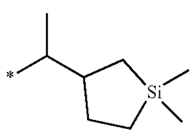
9-233
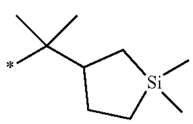
9-234
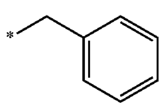
9-235
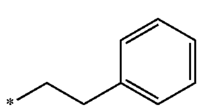
9-236
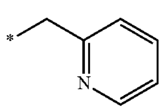
9-237
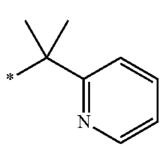
-continued
10-1
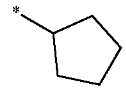
10-2
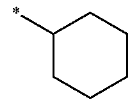
10-3
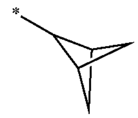
10-4
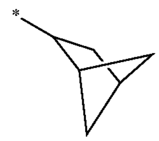
10-5
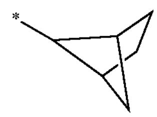
10-6
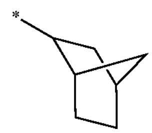
10-7
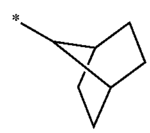
10-8
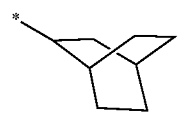
10-9
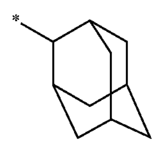
10-10
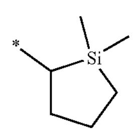
10-11
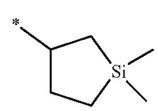
10-12
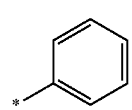
10-13
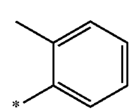

-continued
10-14
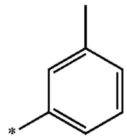
10-15
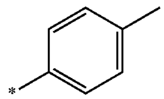
10-16
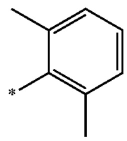
10-17
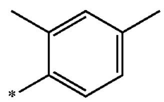
10-18
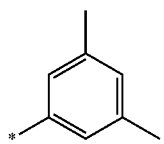
10-19
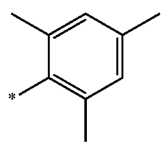
10-20
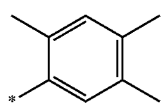
10-21
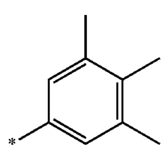
10-22
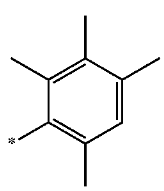
10-23
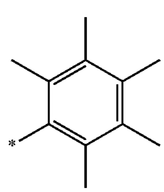
10-24
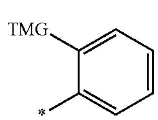
-continued
10-25
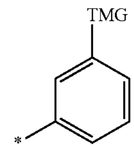
10-26
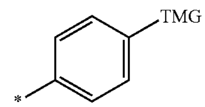
10-27
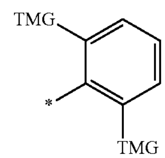
10-28
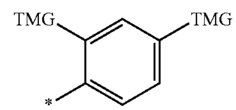
10-29
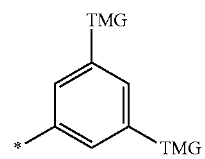
10-30
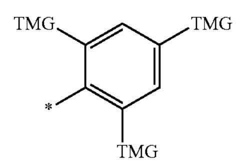
10-31
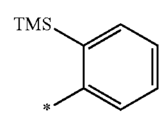
10-32
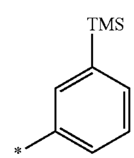
10-33
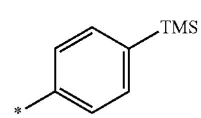
10-34
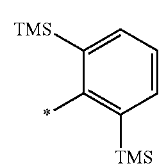
10-35
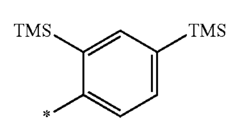

-continued
10-36
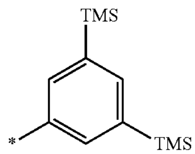
10-37
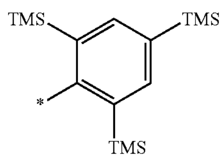
10-38
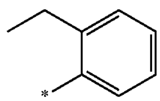
10-39
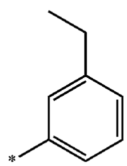
10-40
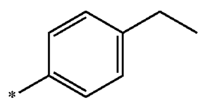
10-41
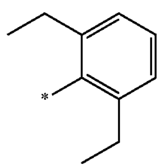
10-42
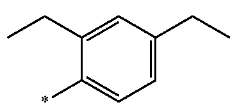
10-43
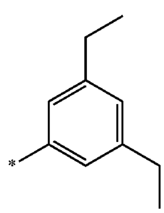
10-44
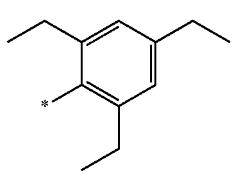
10-45
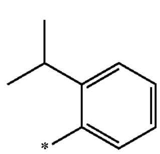
-continued
10-46
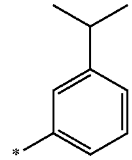
10-47
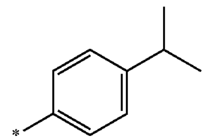
10-48
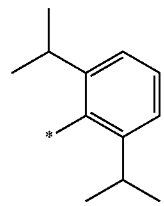
10-49
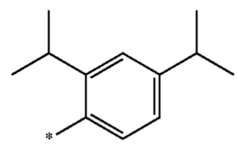
10-50
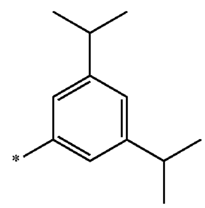
10-51
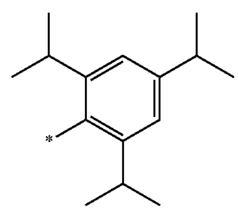
10-52
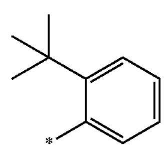
10-53
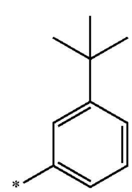
10-54
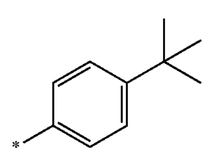

-continued
10-55
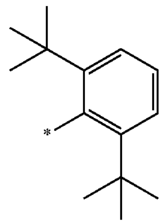
10-56
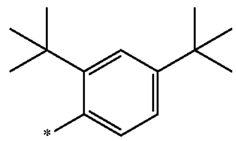
10-57
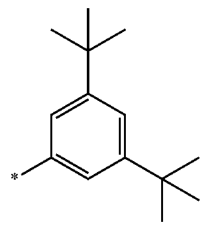
10-58
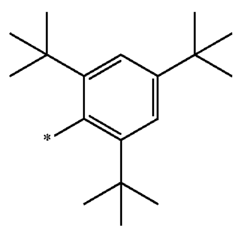
10-59
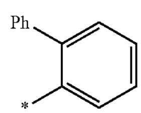
10-60
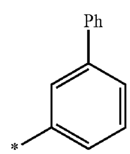
10-61
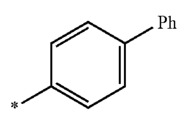
10-62
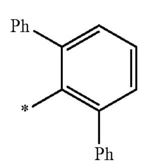
10-63
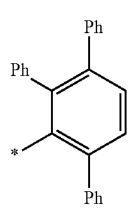
-continued
10-64
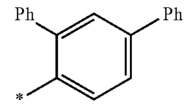
10-65
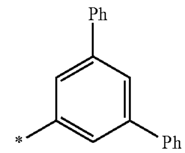
10-66
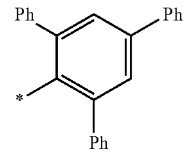
10-67
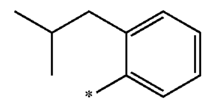
10-68
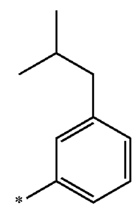
10-69
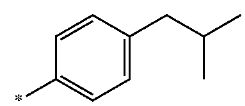
10-70
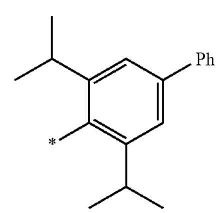
10-71
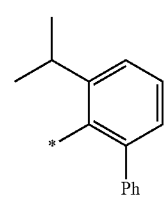
10-72
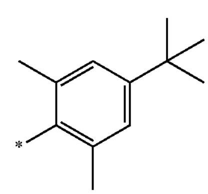

-continued
10-73
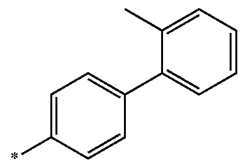
10-74
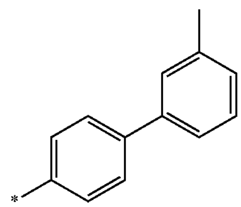
10-75
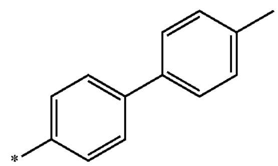
10-76
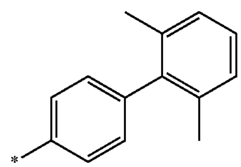
10-77
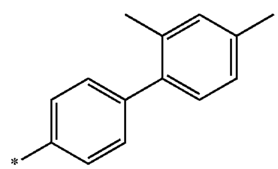
10-78
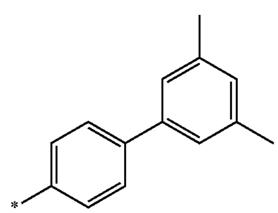
10-79
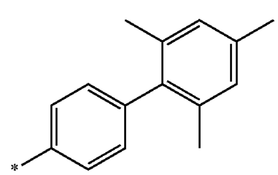
10-80
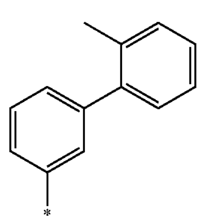
-continued
10-81
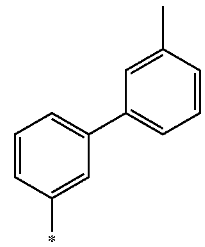
10-82
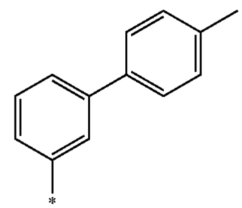
10-83
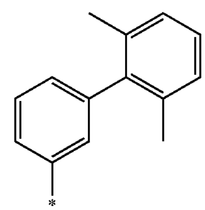
10-84
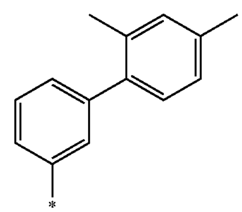
10-85
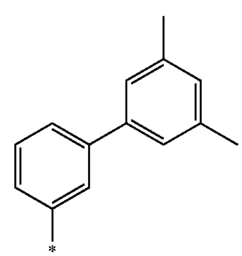
10-86
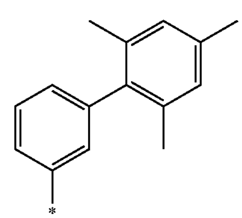
10-87
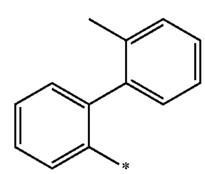

-continued
10-88
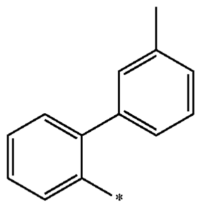
10-89
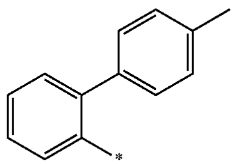
10-90
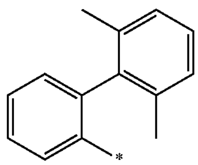
10-91
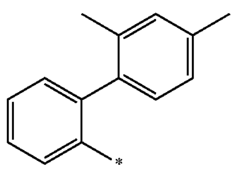
10-92
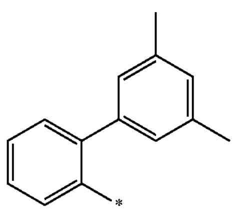
10-93
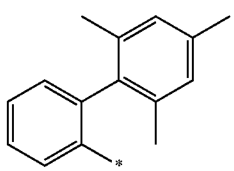
10-94
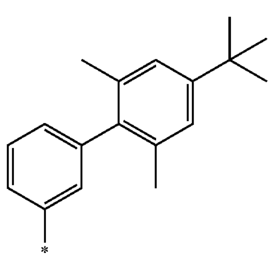
10-95
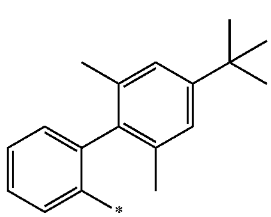
-continued
10-96
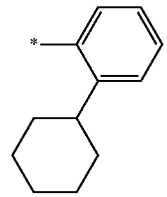
10-97
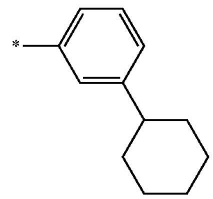
10-98
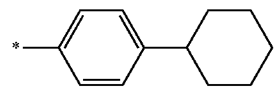
10-99
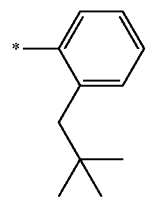
10-100
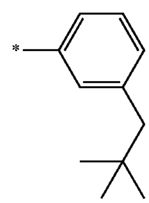
10-101
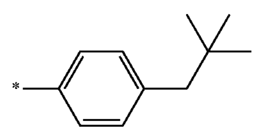
10-102
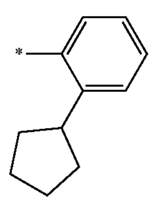
10-103
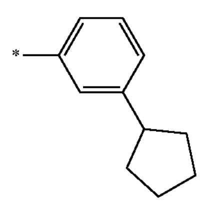
10-104
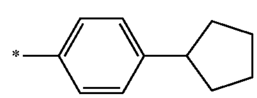

-continued
10-105
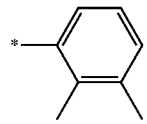
10-106
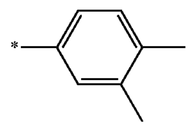
10-107
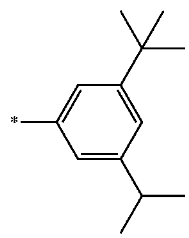
10-108
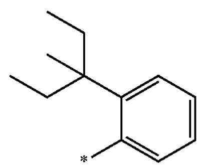
10-109
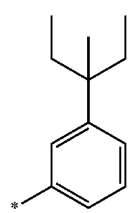
10-110
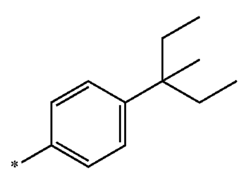
10-111
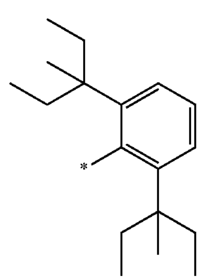
10-112
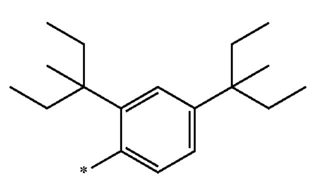
-continued
10-113
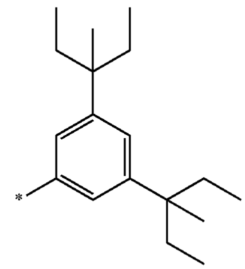
10-114
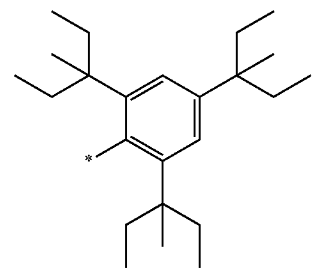
10-115
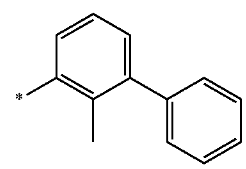
10-116
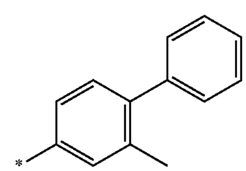
10-117
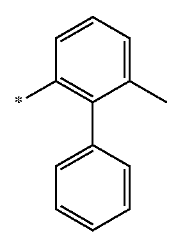
10-118
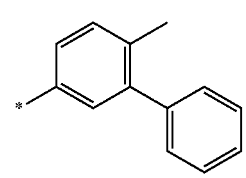
10-119
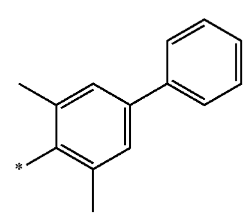

-continued
10-120
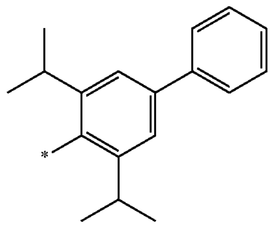
10-121
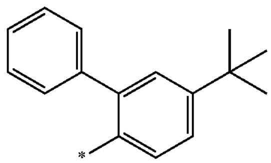
10-122
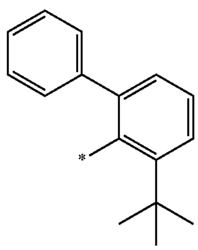
10-123
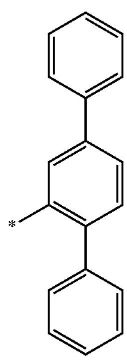
10-124
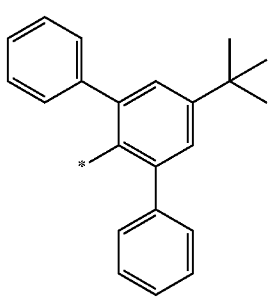
10-125
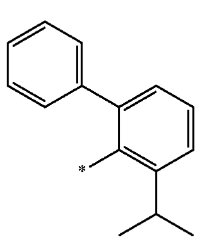
-continued
10-126
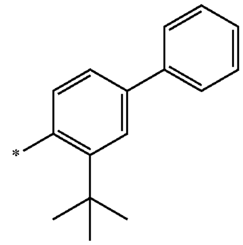
10-127
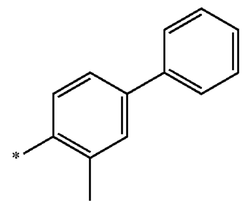
10-128
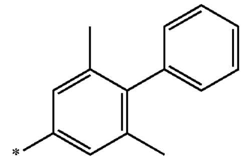
10-129
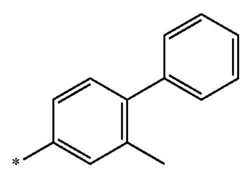
10-201
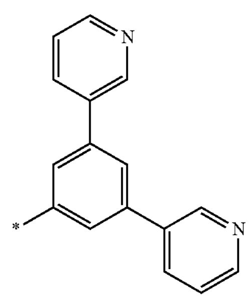
10-202
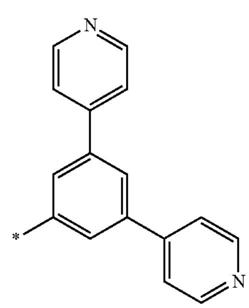

-continued
10-203
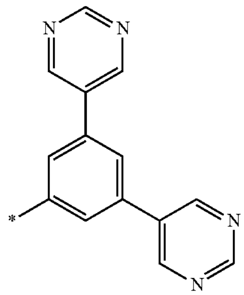
10-204
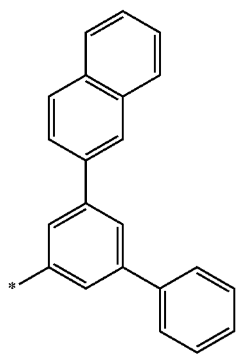
10-205
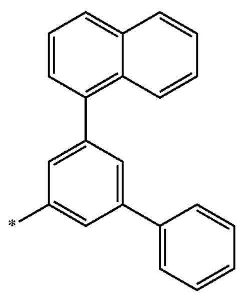
10-206
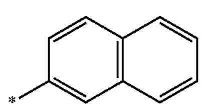
10-207
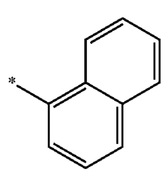
10-208
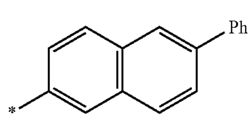
10-209
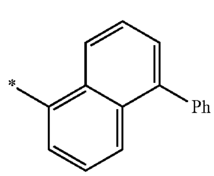
-continued
10-210
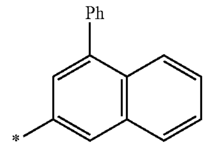
10-211
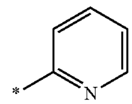
10-212
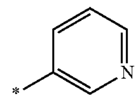
10-213
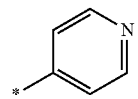
10-214
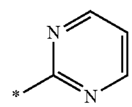
10-215
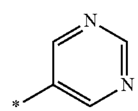
10-216
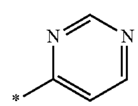
10-217
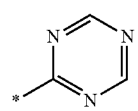
10-218
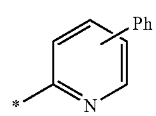
10-219
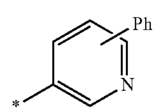
10-220
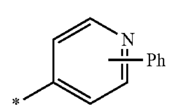
10-221
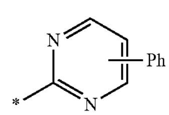
10-222
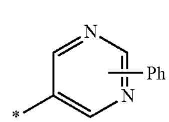

-continued
10-223
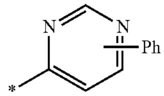
10-224
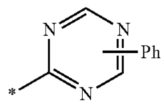
10-225
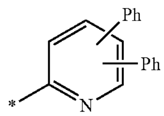
10-226
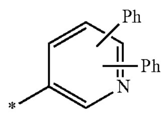
10-227
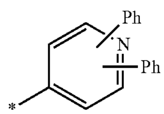
10-228
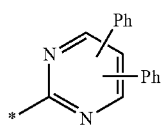
10-229
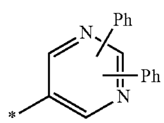
10-230
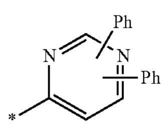
10-231
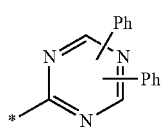
10-232
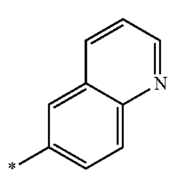
10-233
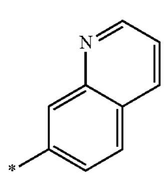
10-234
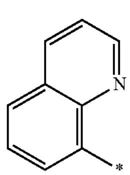
-continued
10-235
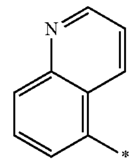
10-236
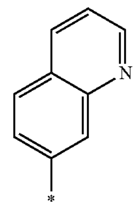
10-237
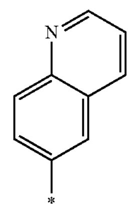
10-238
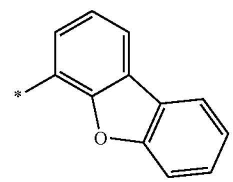
10-239
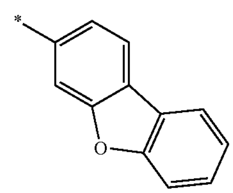
10-240
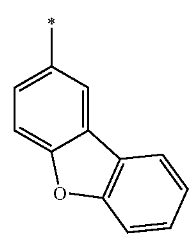
10-241
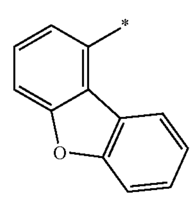
10-242
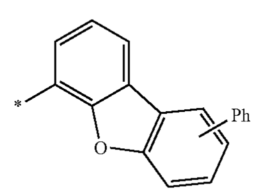

-continued
10-243
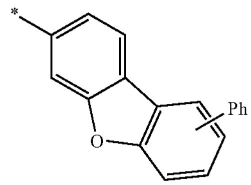
10-244
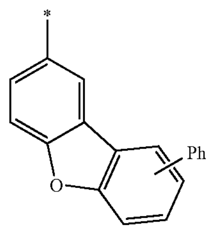
10-245
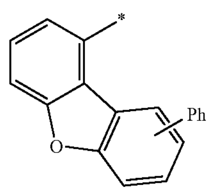
10-246
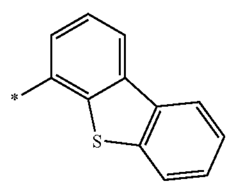
10-247
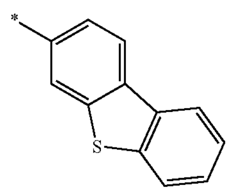
10-248
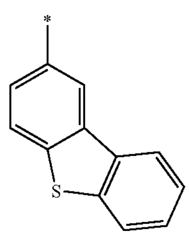
10-249
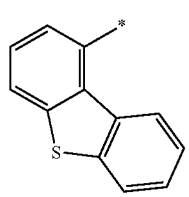
10-250
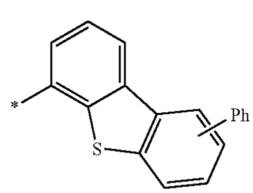
-continued
10-251
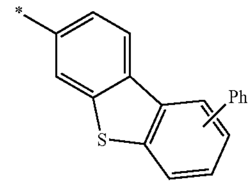
10-252
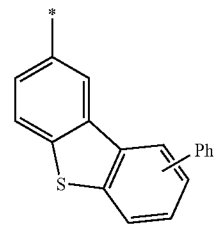
10-253
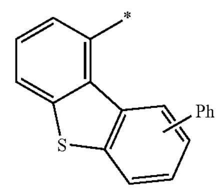
10-254
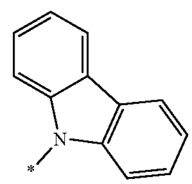
10-255
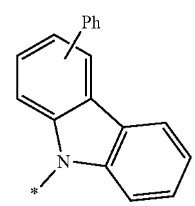
10-256
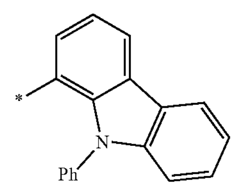
10-257
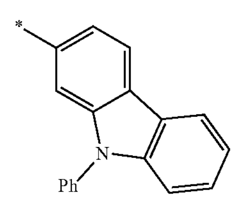
10-258
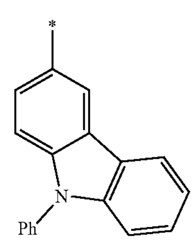

-continued
10-259
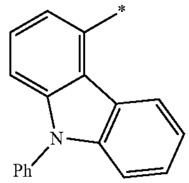
10-260
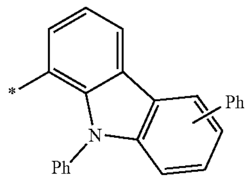
10-261
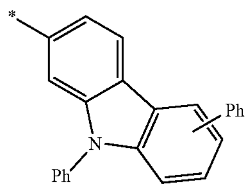
10-262
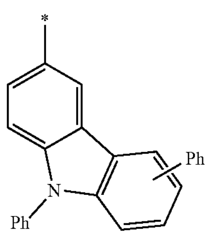
10-263
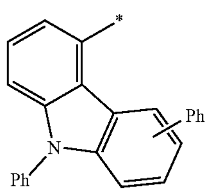
10-264
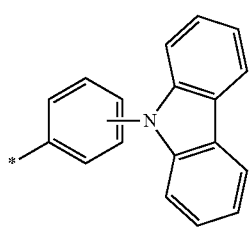
10-265
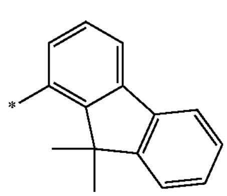
10-266
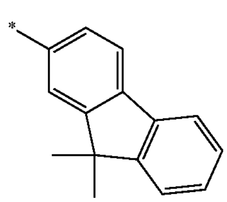
-continued
10-267
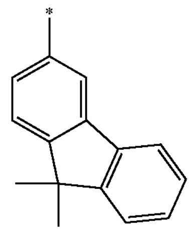
10-268
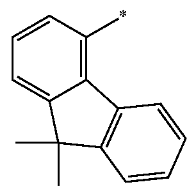
10-269
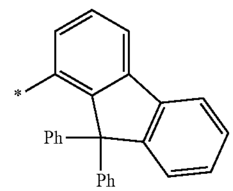
10-270
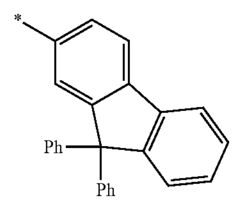
10-271
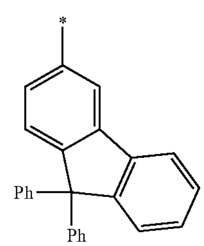
10-272
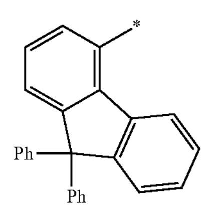
10-273
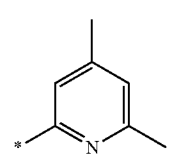
10-274
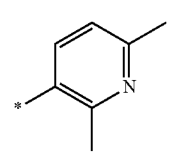

-continued
10-275
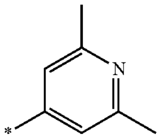
10-276
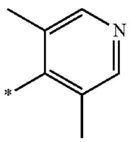
10-277
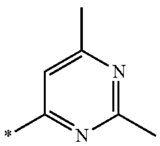
10-278
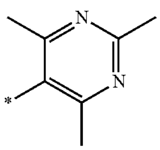
10-279
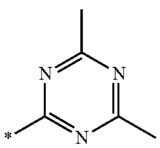
10-280
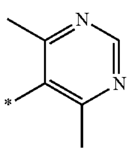
10-281
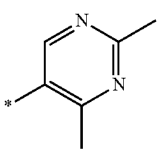
10-282
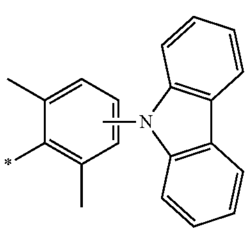
10-283
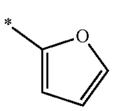
10-284
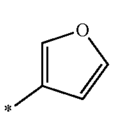
-continued
10-285
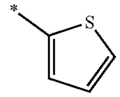
10-286
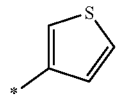
10-287
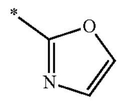
10-288
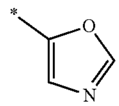
10-289
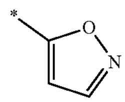
10-290
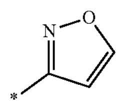
10-291
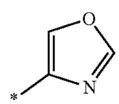
10-292
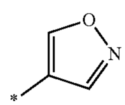
10-293
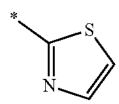
10-294
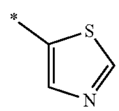
10-295
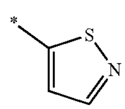
10-296
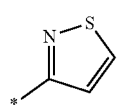
10-297
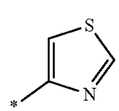
10-298
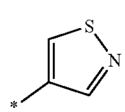

-continued
10-299
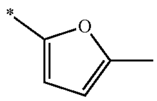
10-300
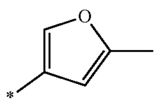
10-301
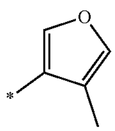
10-302
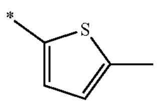
10-303
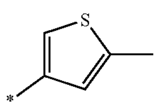
10-304
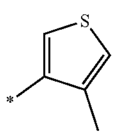
10-305
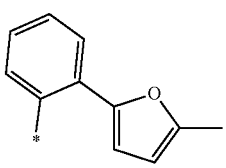
10-306
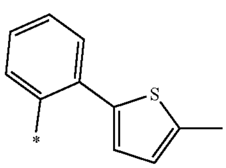
10-307
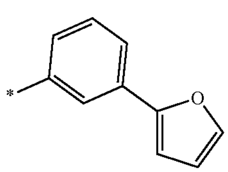
10-308
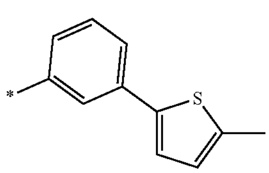
10-309
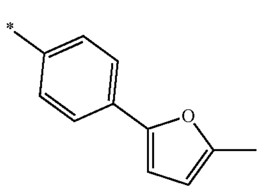
-continued
10-310
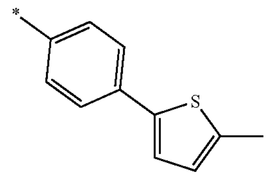
10-311
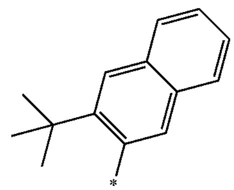
10-312
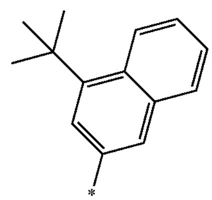
10-313
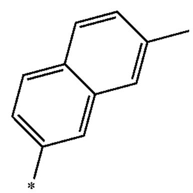
10-314
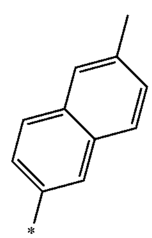
10-315
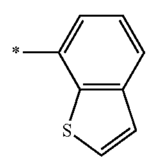
10-316
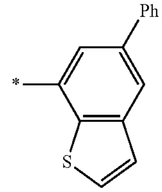
10-317
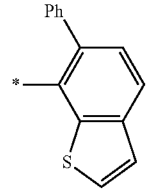

-continued
10-318
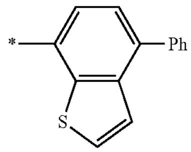
10-319
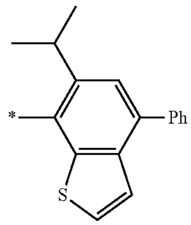
10-320
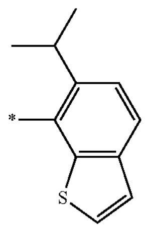
10-321
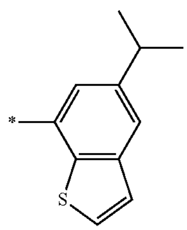
10-322
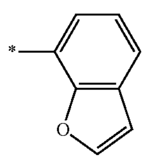
10-323
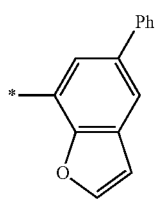
10-324
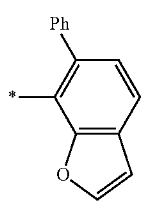
10-325
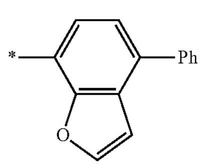
-continued
10-326
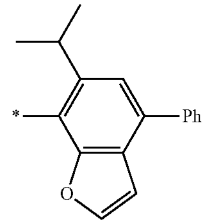
10-327
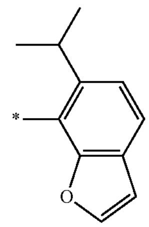
10-328
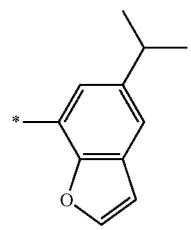
10-329
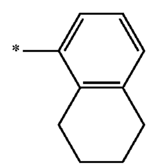
10-330
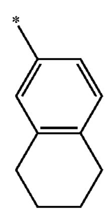
10-331
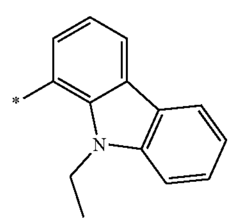
10-332
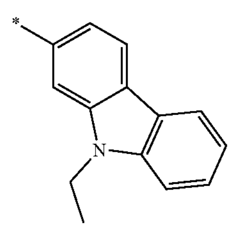

-continued 10-333

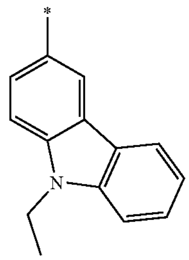

10-334

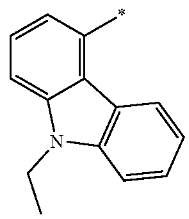

10-335

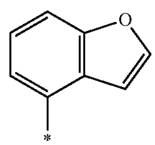

10-336

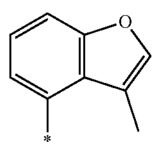

10-337

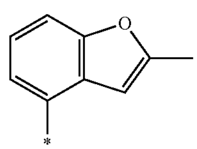

10-338

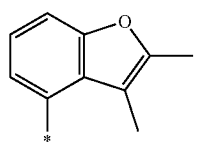

10-339

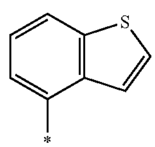

10-340

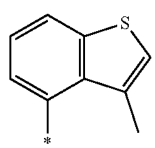

10-341

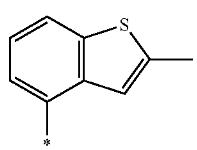

-continued 10-342

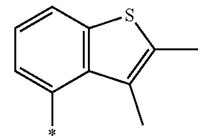

10-343

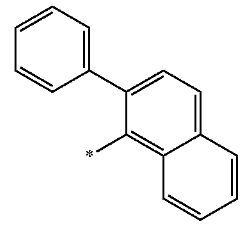

10-344

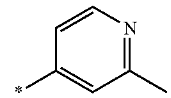

10-345

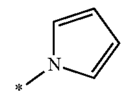

10-346

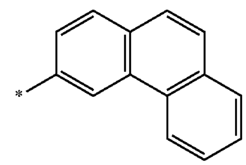

10-347

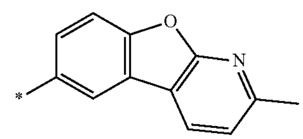

10-348

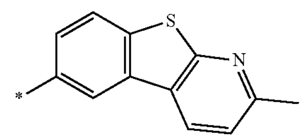

10-349

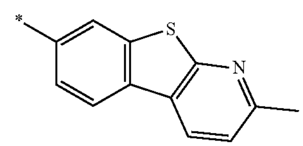

10-350

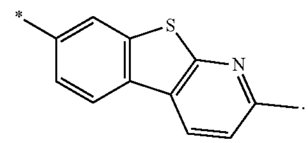

In Formula 9-1 to 9-39, 9-201 to 9-237, 10-1 to 10-129 and 10-201 to 10-350, * indicates a binding site to a neighboring atom, Ph is a phenyl group, TMS is a trimethylsilyl group, and TMG is a trimethylgermyl.

The "the group represented by one of Formulae 9-1 to 9-39 in which at least one hydrogen is substituted with deuterium" and "the group represented by one of Formulae 9-201 to 9-237 in which at least one hydrogen is substituted with deuterium" may be, for example, a group represented by one of Formulae 9-501 to 9-514 and 9-601 to 9-636:

9-501
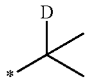
9-502
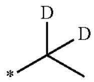
9-503
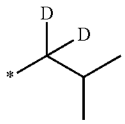
9-504
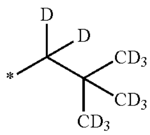
9-505
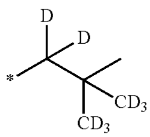
9-506
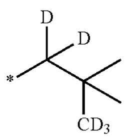
9-507
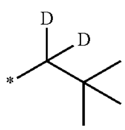
9-508
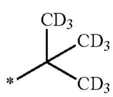
9-509
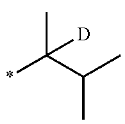
9-510
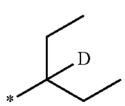
9-511
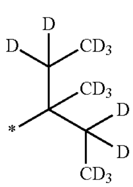
5-512
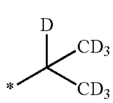
9-513
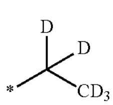
-continued
9-514
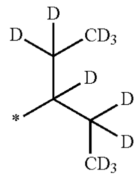
9-601
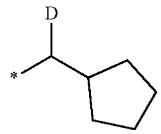
9-602
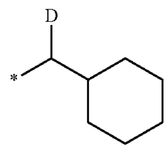
9-603
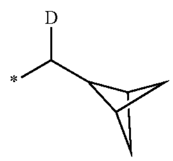
9-604
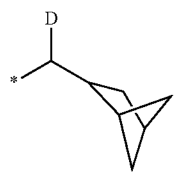
9-605
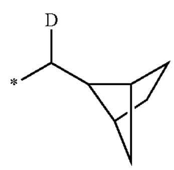
9-606
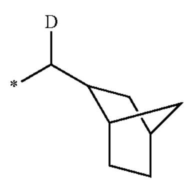
9-607
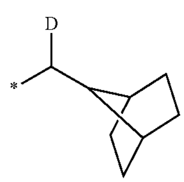
9-608
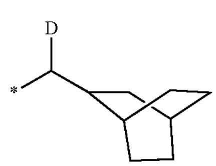

-continued
9-609
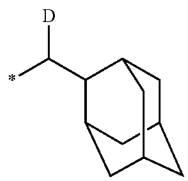
9-610
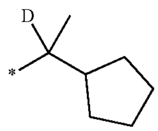
9-611
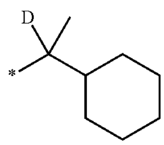
9-612
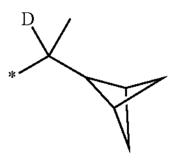
9-613
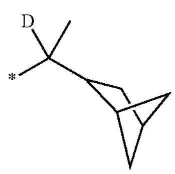
9-614
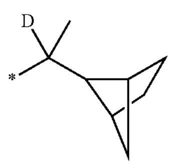
9-615
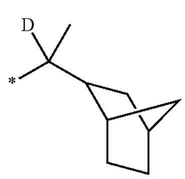
6-616
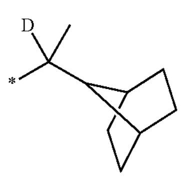
9-617
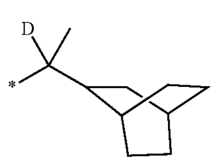
-continued
9-618
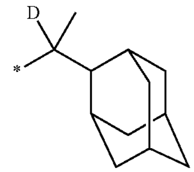
9-619
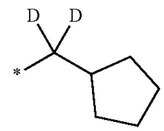
9-620
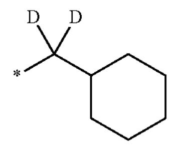
9-621
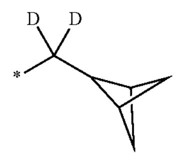
9-622
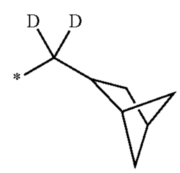
9-623
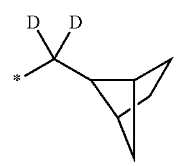
9-624
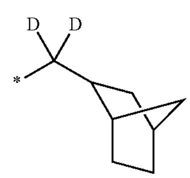
9-625
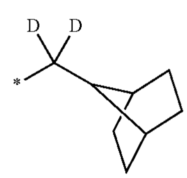
9-626
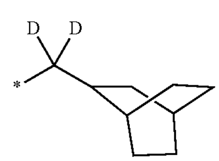

-continued 9-627

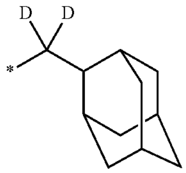

9-628

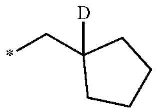

9-629

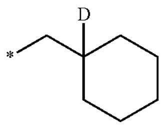

9-230

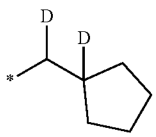

9-631

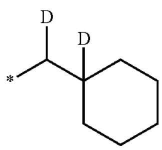

9-632

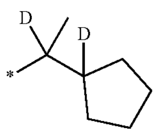

9-633

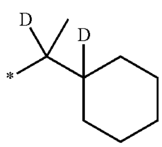

9-634

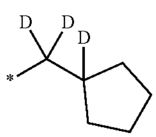

9-635

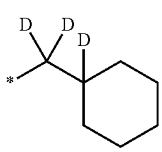

9-636

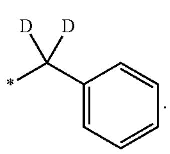

The "the group represented by one of Formulae 9-1 to 9-39 in which at least one hydrogen is substituted with —F" and "the group represented by one of Formulae 9-201 to 9-237 in which at least one hydrogen is substituted with —F" may be, for example, a group represented by one of Formulae 9-701 to 9-710:

9-701

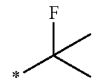

9-702

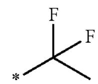

9-703

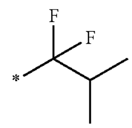

9-704

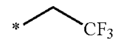

9-705

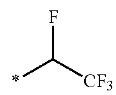

9-706

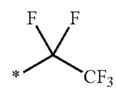

9-707

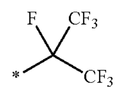

9-708

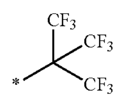

9-709

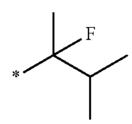

9-710

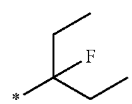

The "the group represented by one of Formulae 10-1 to 10-129 in which at least one hydrogen is substituted with deuterium" and "the group represented by one of Formulae 10-201 to 10-350 in which at least one hydrogen is substituted with deuterium" may be, for example, a group represented by one of Formulae 10-501 to 10-553:

10-501

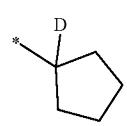

10-502

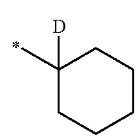

-continued
10-503
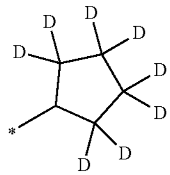
10-504
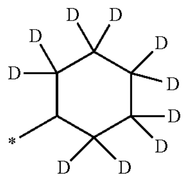
10-505
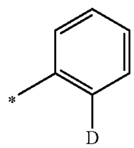
10-506
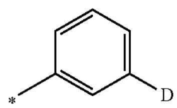
10-507
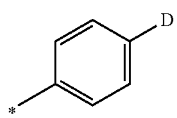
10-508
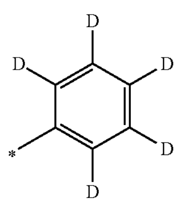
10-509
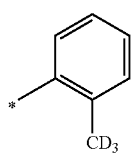
10-510
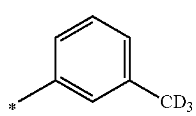
10-511
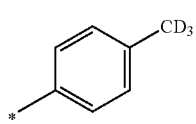
10-512
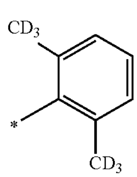
-continued
10-513
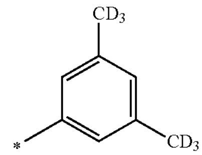
10-514
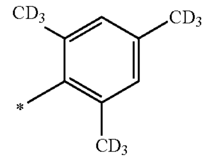
10-515
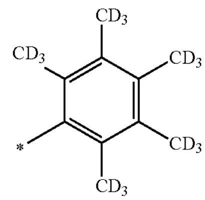
10-516
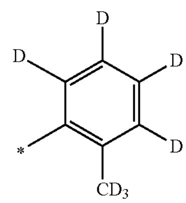
10-517
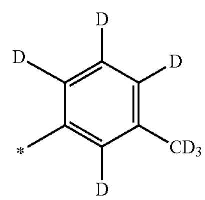
10-518
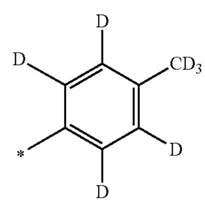
10-519
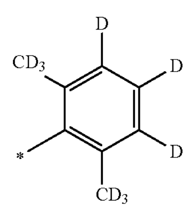
10-520
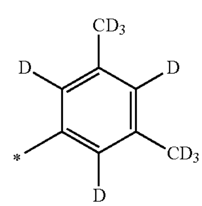

-continued
10-521
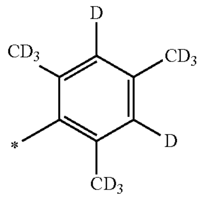
10-522
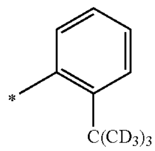
10-523
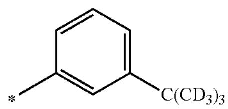
10-524
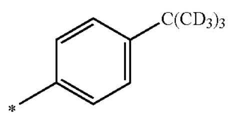
10-525
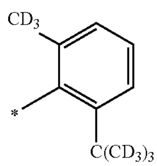
10-526
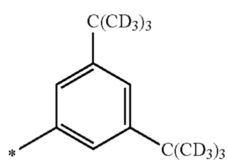
10-527
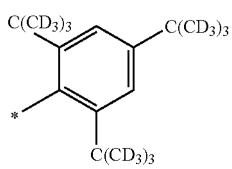
10-528
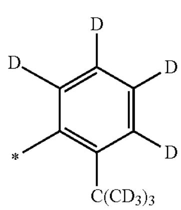
10-529
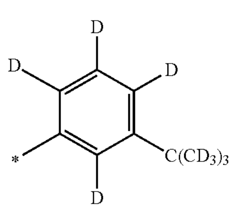
-continued
10-530
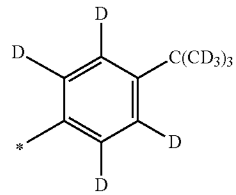
10-531
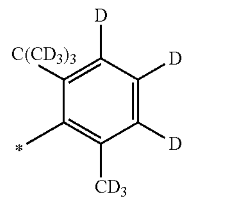
10-532
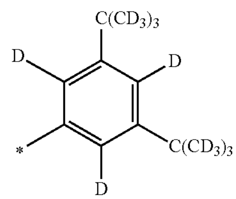
10-533
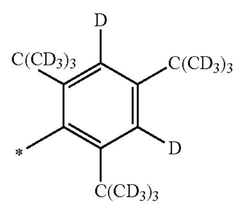
10-534
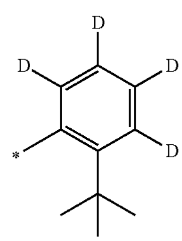
10-535
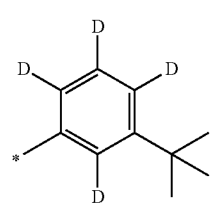
10-536
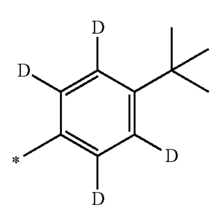

-continued
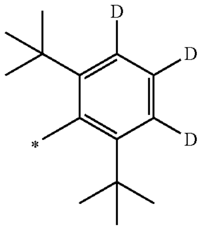
10-537
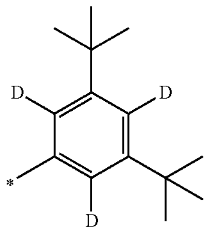
10-538
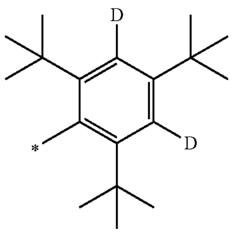
10-540
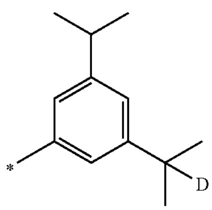
10-541
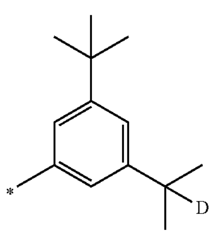
10-542
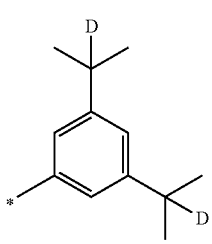
10-543
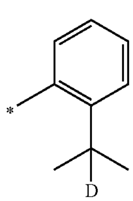
10-544
-continued
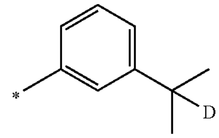
10-545
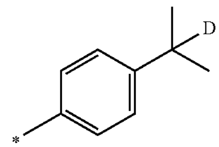
10-546
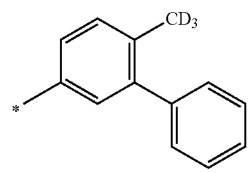
10-547
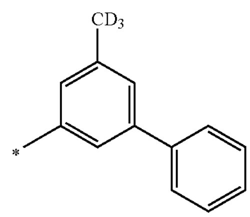
10-548
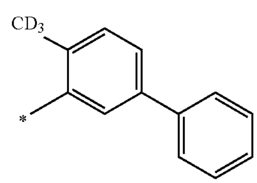
10-549
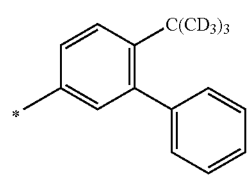
10-550
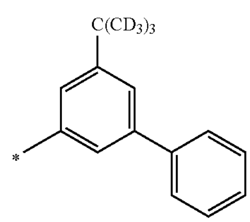
10-551
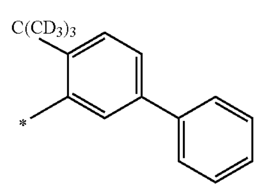
10-552

-continued
10-553
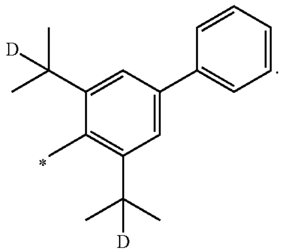
The "the group represented by one of Formulae 10-1 to 10-129 in which at least one hydrogen is substituted with —F" and "the group represented by one of Formulae 10-201 to 10-350 in which at least one hydrogen is substituted with —F" may be, for example, a group represented by one of Formulae 10-601 to 10-617:
10-601
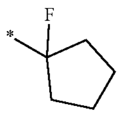
10-602
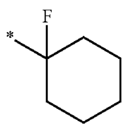
10-603
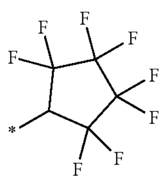
10-604
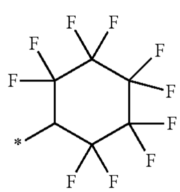
10-605
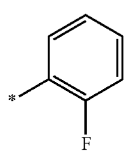
10-606
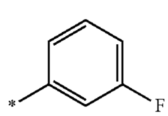
10-607
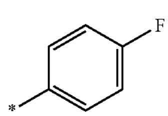
-continued
10-608
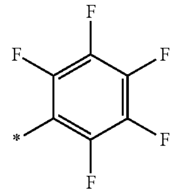
10-609
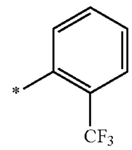
10-610
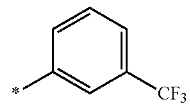
10-611
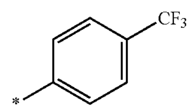
10-612
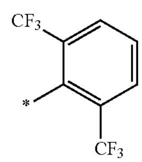
10-613
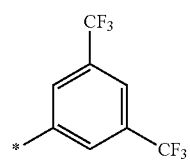
10-614
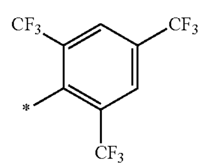
10-615
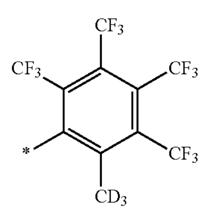
10-616
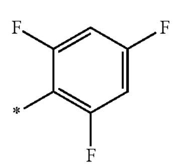

-continued 10-617

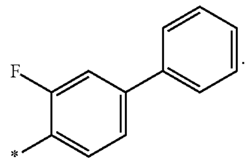

In Formula 1, i) two or more of $R_1$ to $R_8$ may optionally be linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, ii) two or more of $R_{20}$(s) in the number of a2 may optionally be linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, iii) two or more of $Z_1$(s) in the number of b1 may optionally be linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, iv) two or more of $Z_2$ (s) in the number of b2 may optionally be linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, and v) two or more of $A_1$ to $A_7$ may optionally be linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$.

*' in Formulae 1-1 to 1-3 are each a binding site to Ir in Formula 1.

$R_{1a}$ is the same as described in connection with $A_7$.

For example, $R_1$ to $R_8$, $R_{20}$, $Z_1$, $Z_2$, and $A_1$ to $A_7$ in Formulae 1-1 to 1-3 may each independently be hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, a substituted or unsubstituted biphenyl group, —Si($Q_3$)($Q_4$)($Q_5$), or —Ge($Q_3$)($Q_4$)($Q_5$).

In one or more embodiments, $R_1$ to $R_8$ and $A_7$ in Formulae 1-1 and 1-3 may each independently be:

hydrogen, deuterium, or —F;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or any combination thereof; or —Si($Q_3$)($Q_4$)($Q_5$) or —Ge($Q_3$)($Q_4$)($Q_5$).

In one or more embodiments, $R_{20}$, $Z_1$, and $Z_2$ in Formulae 1-1 and 1-2 may each independently be:

hydrogen or deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each substituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, or any combination thereof; or —Si($Q_3$)($Q_4$)($Q_5$) or —Ge($Q_3$)($Q_4$)($Q_5$).

In Formulae 1-1 and 1-2, a2, b1, and b2 indicate the numbers of $R_{20}$, $Z_1$, and $Z_2$, respectively, and may each independently an integer from 0 to 20. When a2 is 2 or more, two or more of $R_{20}$(s) may be identical to or different from each other, when b1 is 2 or more, two or more of $Z_1$(s) may be identical to or different from each other, and when b2 is 2 or more, two or more of $Z_2$(s) may be identical to or different from each other. For example, a2, b1, and b2 may each independently be an integer from 0 to 6.

At least one of $R_1$ to $R_8$ in Formula 1-1 (for example, one or two of $R_1$ to $R_8$), at least one of $R_{20}$(s) in the number of a2, or any combination thereof may each independently be a fluoro group (—F) or fluorinated group. The "fluorinated group" refers to any group that is substituted with at least one fluoro group (—F). The term "any group" is the same as described in connection with $A_7$.

In one or more embodiments, at least one of $R_4$ to $R_7$ in Formula 1-1 (for example, one or two of $R_4$ to $R_7$) may each independently be a fluoro group (—F) or a fluorinated group.

In one or more embodiments, at least one of $R_1$ to $R_8$ in Formula 1-1 (for example, one or two of $R_1$ to $R_8$, or one or two of $R_4$ to $R_7$) may each independently be:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, or a fluorinated biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or any combination thereof.

In one or more embodiments, in Formula 1-1,

1) $R_4$ may be a fluoro group or a fluorinated $C_1$-$C_{60}$ alkyl group, and $R_1$ to $R_3$ and $R_5$ to $R_8$ may each be hydrogen, 2) $R_5$ may be a fluoro group or a fluorinated $C_1$-$C_{60}$ alkyl group, and $R_1$ to $R_4$ and $R_6$ to $R_8$ may be hydrogen, 3) $R_6$ may be a fluoro group or a fluorinated $C_1$-$C_{60}$ alkyl group, and $R_1$ to $R_5$, $R_7$, and $R_8$ may be hydrogen, 4) $R_7$ may be a fluoro group or a fluorinated $C_1$-$C_{60}$ alkyl group, and $R_1$ to $R_6$ and $R_8$ may be hydrogen, 5) $R_4$ may be a fluoro group or a fluorinated $C_1$-$C_{60}$ alkyl group, $R_5$ may be a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, or —Si($Q_3$)($Q_4$)($Q_5$), and $R_1$ to $R_3$ and $R_6$ to $R_8$ may each be hydrogen, 6) $R_5$ may be a fluoro group or a fluorinated $C_1$-$C_{60}$ alkyl group, $R_4$ may be a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, or —Si($Q_3$)($Q_4$)($Q_5$), and $R_1$ to $R_3$ and $R_6$ to $R_8$ may each be hydrogen, 7) $R_4$ and $R_5$ may each independently be a fluoro group or a fluorinated $C_1$-$C_{60}$ alkyl group, and $R_1$ to $R_3$ and $R_6$ to $R_8$ may each be hydrogen, 8) $R_4$ and $R_6$ may each independently be a fluoro group or a fluorinated $C_1$-$C_{60}$ alkyl group, and $R_1$ to $R_3$, $R_5$, $R_7$ and $R_8$ may each be hydrogen, 9) $R_5$ and $R_6$ may each independently be a fluoro group or a fluorinated $C_1$-$C_{60}$ alkyl group, and $R_1$ to $R_4$, $R_7$, and $R_8$ may each be hydrogen, 10) $R_4$ and $R_7$ may each independently be a fluoro group or a fluorinated $C_1$-$C_{60}$ alkyl group, and $R_1$ to $R_3$, $R_5$, $R_6$ and $R_8$ may each be hydrogen, 11) $R_4$ and $R_6$ may each independently be a fluoro group or a fluorinated $C_1$-$C_{60}$ alkyl group, $R_2$ may be a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, or —Si($Q_3$)($Q_4$)($Q_5$), and $R_1$, $R_3$, $R_5$, $R_7$ and $R_8$ may each be hydrogen, or 12) $R_7$ may be a fluoro group or fluorinated $C_1$-$C_{60}$ alkyl group, $R_2$ may be a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, or —Si($Q_3$)($Q_4$)($Q_5$), and $R_1$, $R_3$ to $R_6$ and $R_8$ may each be hydrogen.

In one or more embodiments, $Z_1$ and $Z_2$ in Formula 1-2 may each be hydrogen.

In one or more embodiments, b1 and b2 in Formula 1-2 may each independently be an integer from 1 to 20, and at least one of $Z_1$ and $Z_2$ may not be hydrogen. When b1 and b2 in Formula 1-2 may each independently be an integer from 1 to 20, and at least one of $Z_1$ and $Z_2$ is not hydrogen, the intermolecular interaction between organometallic compounds represented by Formula 1 may be reduced, and thus, the sublimation temperature of the organometallic compound represented by Formula 1 may be lowered. As the sublimation temperature of the organometallic compound represented by Formula 1 is lowered, the difference between the sublimation temperature and Td of the organometallic compound is increased, so that, when the organometallic compound represented by Formula 1 is subjected to the sublimation and purification, excellent thermal stability and processability may be obtained.

In one or more embodiments, at least one of $Z_1$ and $Z_2$ in Formula 1-2 may each independently be:

deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each substituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, or any combination thereof; or —Si($Q_3$)($Q_4$)($Q_5$) or —Ge($Q_3$)($Q_4$)($Q_5$).

In one or more embodiments, at least one of $A_1$ to $A_6$ in Formula 1-3 may not be hydrogen.

In one or more embodiments, $A_7$ in Formula 1-3 may not be hydrogen.

In one or more embodiments, $A_7$ in Formula 1 may be an electron-withdrawing group.

In one or more embodiments, a group represented by *—C($A_1$)($A_2$)($A_3$) and a group represented by *—C($A_4$)($A_5$)($A_6$) in Formula 1-3 may be identical to each other.

In one or more embodiments, a group represented by *—C($A_1$)($A_2$)($A_3$) and a group represented by *—C($A_4$)($A_5$)($A_6$) in Formula 1-3 may be different from each other.

In one or more embodiments, the organometallic compound represented by Formula 1 may satisfy at least one of Condition 1, Condition 2, Condition 3, or any combination thereof:

Condition 1

$A_1$ to $A_6$ of Formula 1-3 may each independently be a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, Condition 2 at least one of $A_1$ to $A_6$ of Formula 1-3 may be a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, and Condition 3

$A_7$ of Formula 1-3 may each independently be deuterium, —F, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, the organometallic compound represented by Formula 1 may satisfy Condition 1. When Condition 1 is satisfied, two advantages can be obtained:

(1) Although not intended to be limited by a specific theory, since an α-proton has about 105 times greater chemical reactivity than a β-proton, an α-proton may form various forms of intermediates during synthesis of compounds and/or storage, causing side reactions. However, since $A_1$ to $A_6$ of Formula 1-3 are defined as in Condition 1, carbon linked to $A_1$ to $A_6$ in Formula 1-3 may not include an α-proton. Accordingly, the organometallic compound represented by Formula 1 may have a stable chemical structure that minimizes the occurrence of side reactions before and after synthesis, and at the same time, may minimize the interaction between the organometallic compound molecules during operation of the electronic device (for example, an organic light emitting device) including the same.

(2) Furthermore, since Formula 1 contains an ancillary ligand (OˆO ligand which is a group represented by Formula 1-3) that is structurally bulky and has a strong electron-donating capability, the interaction between the ancillary ligand and a main ligand (N^C ligand which is a group represented by one of Formulae 1-1 and 1-2) may be enhanced, and thus, the rigidity of the organometallic compound represented by Formula 1 may be improved. Thus, the full width at half maximum (FWHM) of the emission peak in the photoluminescence PL spectrum or electroluminescence EL spectrum of the organometallic compound represented by Formula 1 may be decreased, and the vibronic state of the molecule of the organometallic compound represented by Formula 1 may be reduced and thus, emission transition and photoalignment ability can be improved.

In one or more embodiments, the organometallic compound represented by Formula 1 may satisfy at least one of Condition 4, Condition 5, or any combination thereof:

Condition 4

Two or more of $A_1$ to $A_3$ of Formula 1-3 may be linked together so that a group represented by *—C($A_1$)($A_2$)($A_3$) becomes a $C_5$-$C_{30}$ carbocyclic group that is unsubstituted or substituted with at least one $R_{1a}$ or a $C_1$-$C_{30}$ heterocyclic group that is unsubstituted or substituted with at least one $R_{1a}$.

Condition 5

Two or more of $A_4$ to $A_6$ of Formula 1-3 may be linked together so that a group represented by *—C($A_4$)($A_5$)($A_6$) becomes a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$.

In one or more embodiments, the organometallic compound represented by Formula 1 may include at least one deuterium.

In one or more embodiments, at least one of $R_1$ to $R_8$ of Formula 1-1 may include at least one deuterium.

In one or more embodiments, at least one of $R_{20}$(s) in the number of a2 of Formula 1-1 may include deuterium.

In one or more embodiments, at least one of $Z_1$(s) in the number of b1 in Formula 1-2 may include at least one deuterium.

In one or more embodiments, at least one of $Z_2$(s) in the number of b2 of Formula 1-1 may include deuterium.

In one or more embodiments, a group represented by

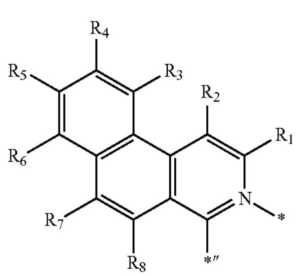

in Formula 1-1 may be a group represented by one of Formulae CY1 to CY112:

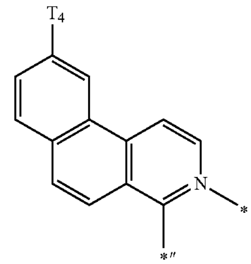

CY1

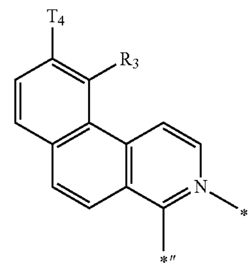

CY2

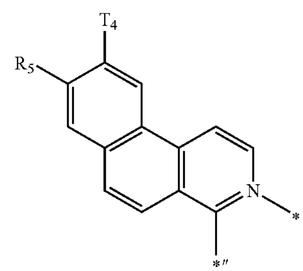

CY3

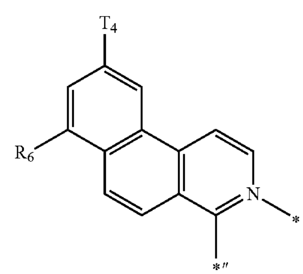

CY4

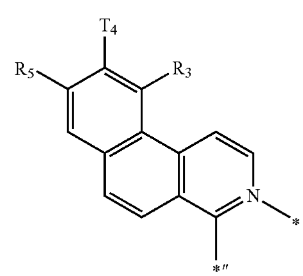

CY5

-continued
CY6
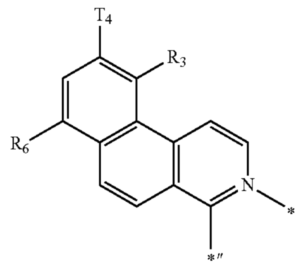
CY7
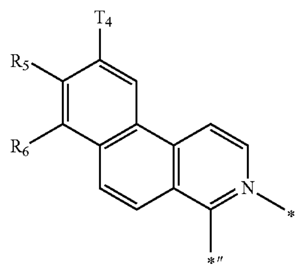
CY8
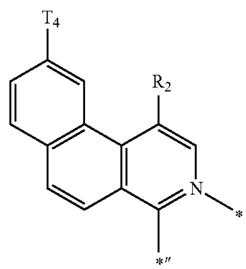
CY9
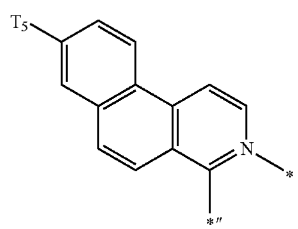
CY10
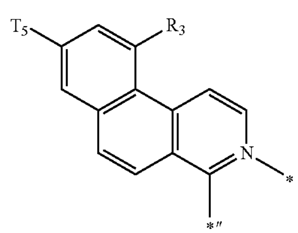
CY11
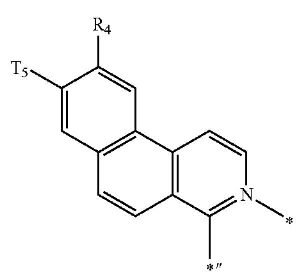
-continued
CY12
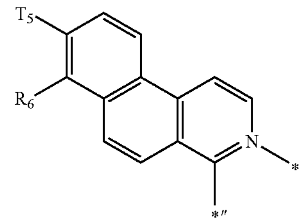
CY13
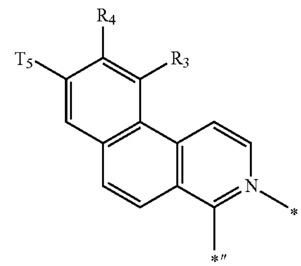
CY14
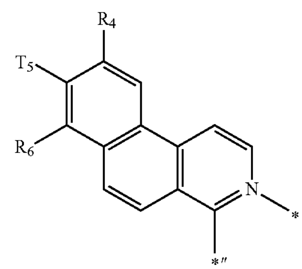
CY15
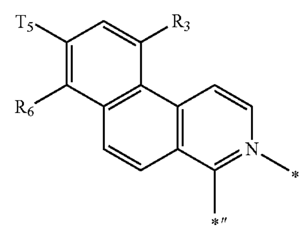
CY16
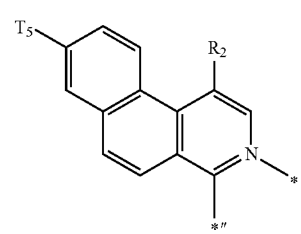
CY17
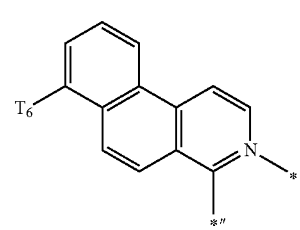

-continued
CY18
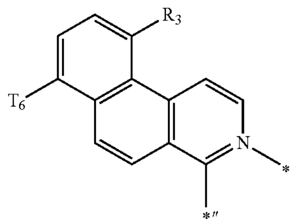
CY19
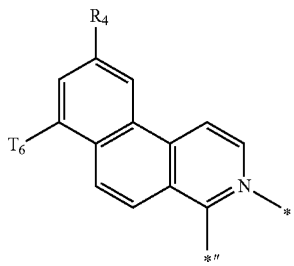
CY20
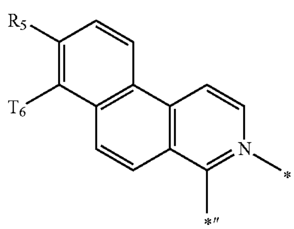
CY21
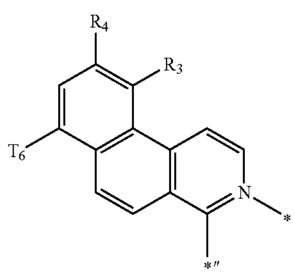
CY22
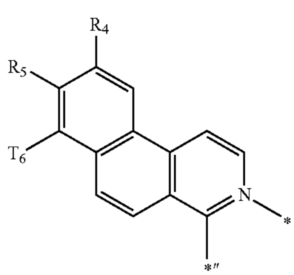
CY23
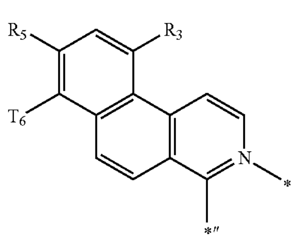
-continued
CY24
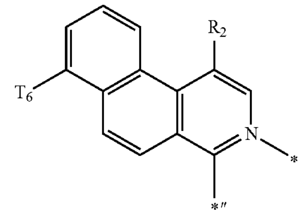
CY25
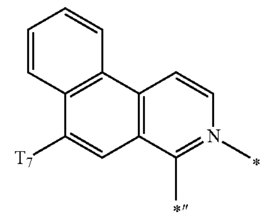
CY26
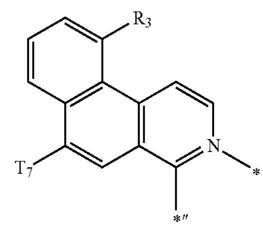
CY27
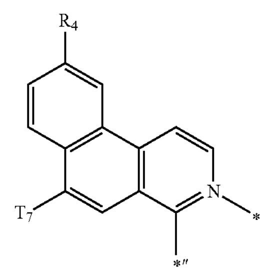
CY28
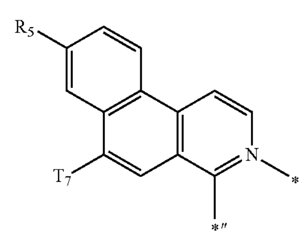
CY29
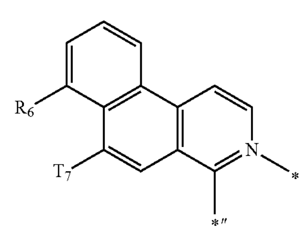

-continued
CY30
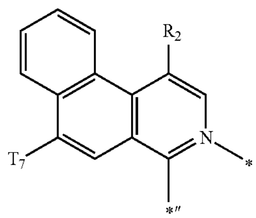
CY31
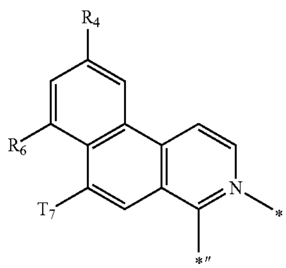
CY32
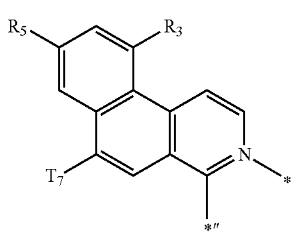
CY33
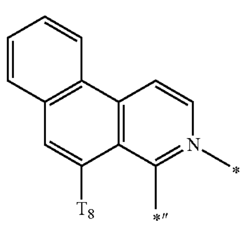
CY34
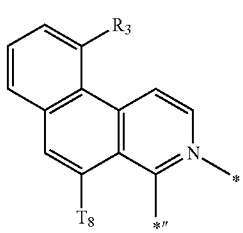
CY35
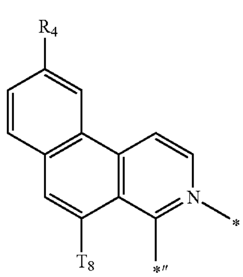
-continued
CY36
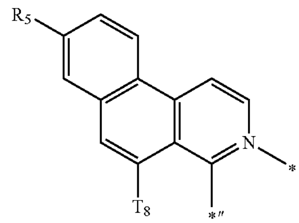
CY37
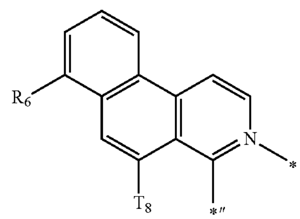
CY38
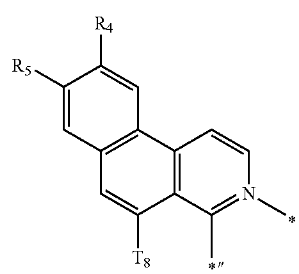
CY39
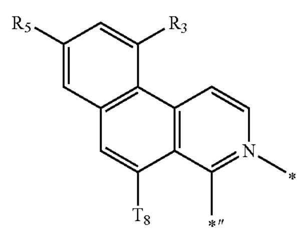
CY40
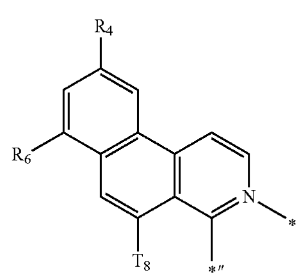
CY41
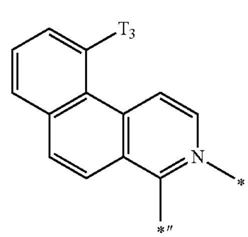

-continued
CY42
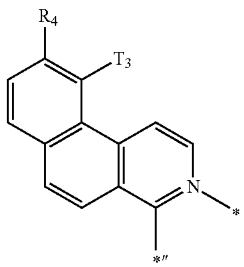
CY43
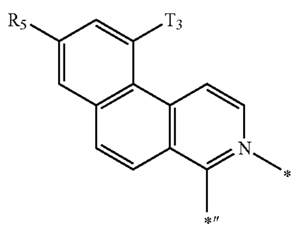
CY44
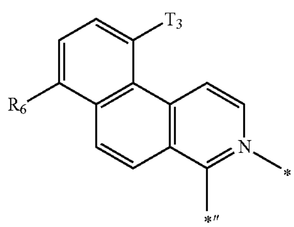
CY45
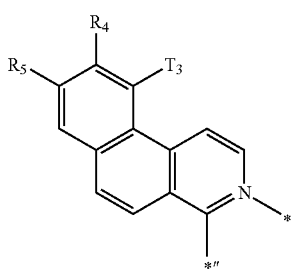
CY46
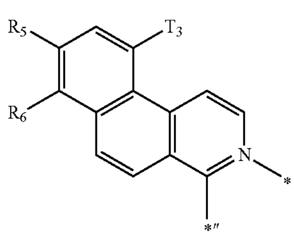
CY47
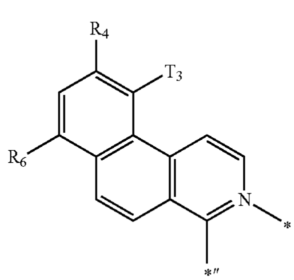
-continued
CY48
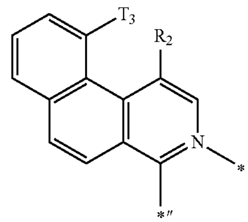
CY49
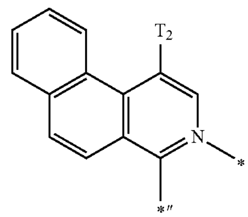
CY50
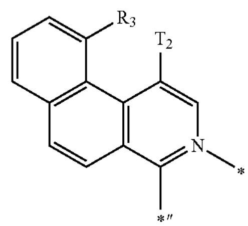
CY51
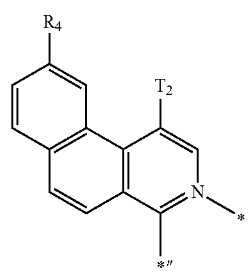
CY52
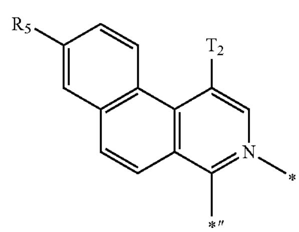
CY53
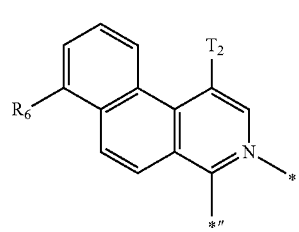

-continued
CY54
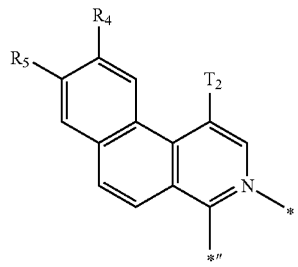
CY55
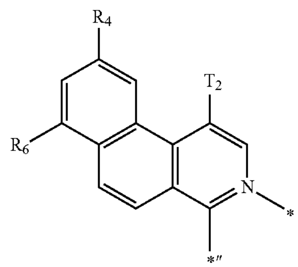
CY56
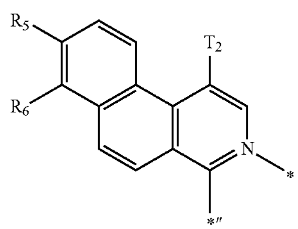
CY57
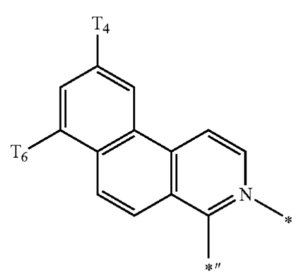
CY58
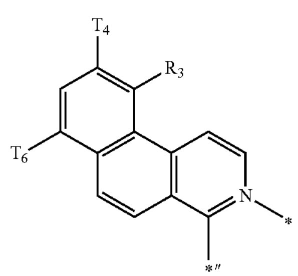
CY59
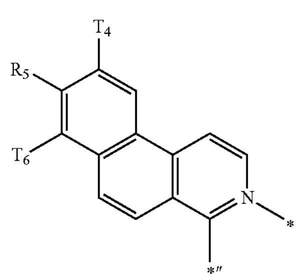
-continued
CY60
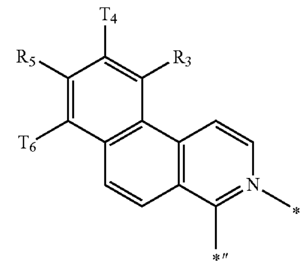
CY61
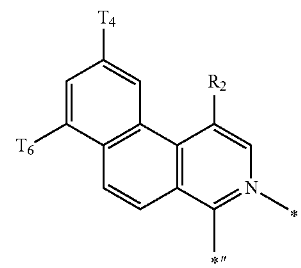
CY62
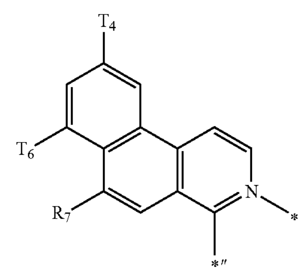
CY63
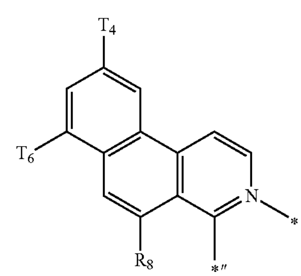
CY64
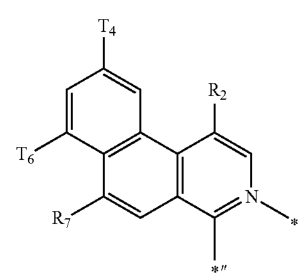

CY65
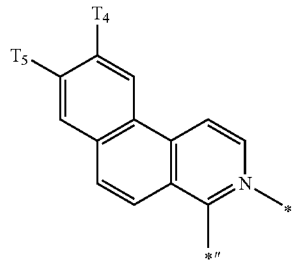
CY66
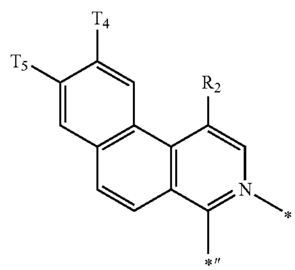
CY67
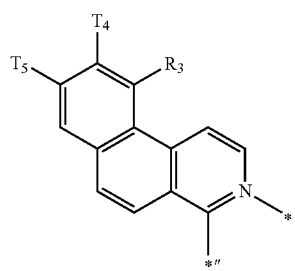
CY68
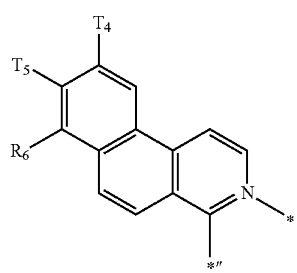
CY69
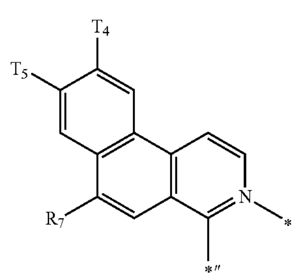
CY70
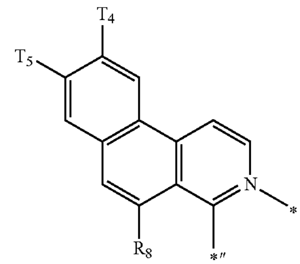
CY71
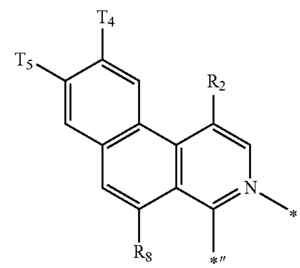
CY72
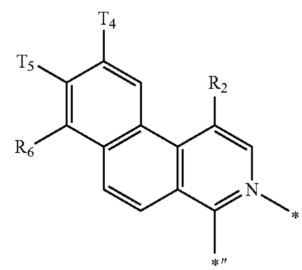
CY73
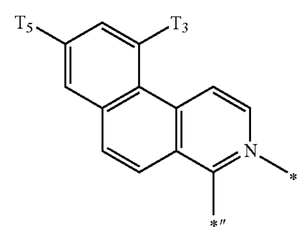
CY74
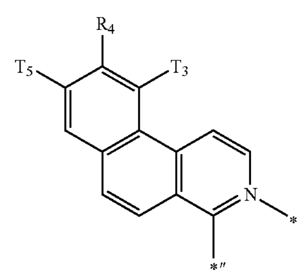
CY75
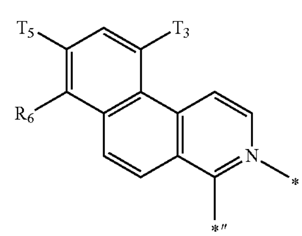

-continued
CY76
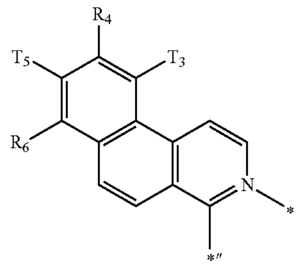
CY77
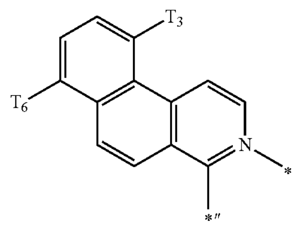
CY78
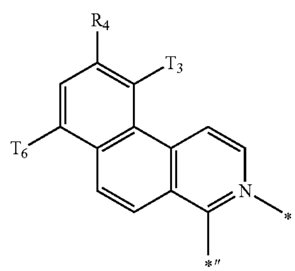
CY79
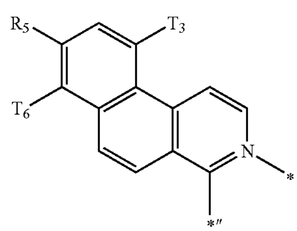
CY80
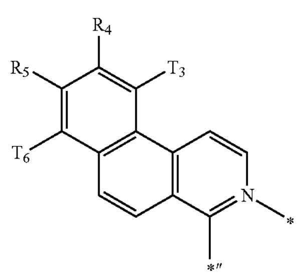
CY81
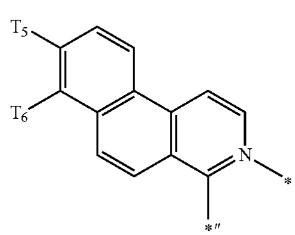
-continued
CY82
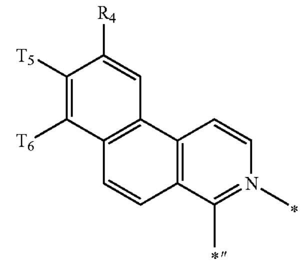
CY83
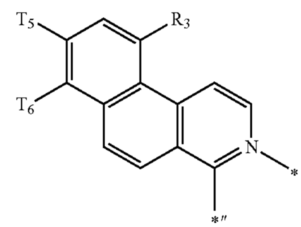
CY84
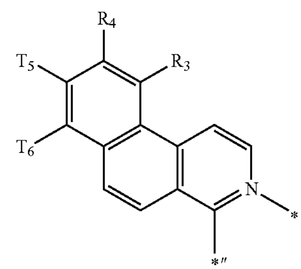
CY85
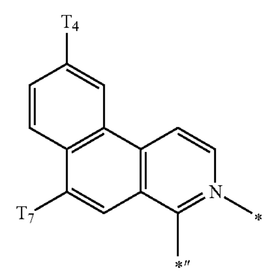
CY86
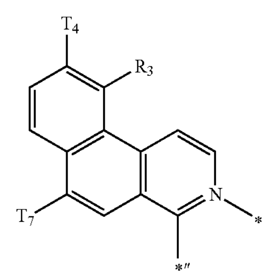
CY87
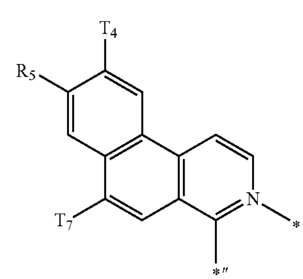

-continued
CY88
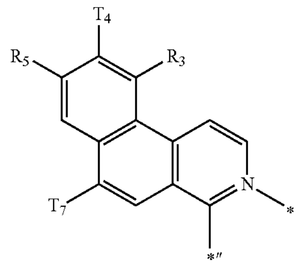
CY89
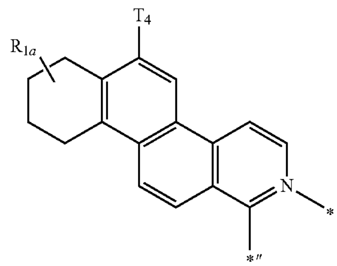
CY90
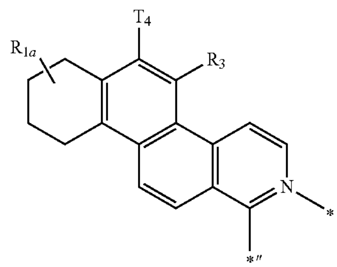
CY91
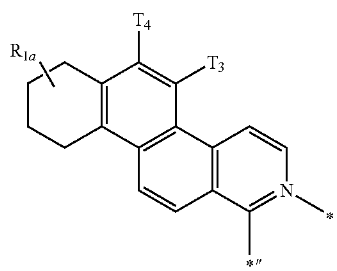
CY92
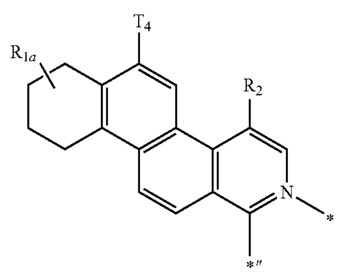
CY93
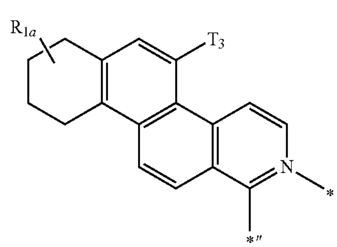
-continued
CY94
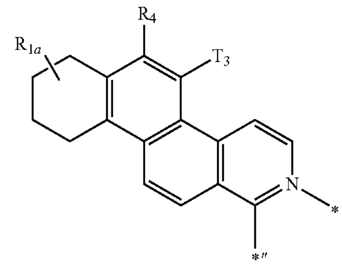
CY95
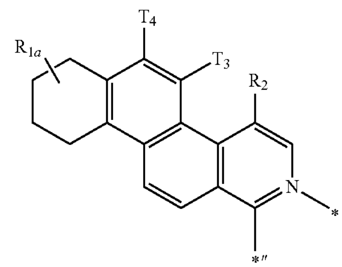
CY96
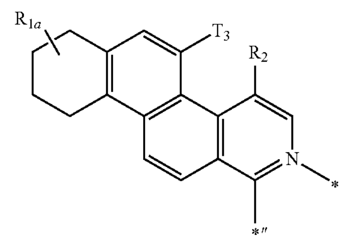
CY97
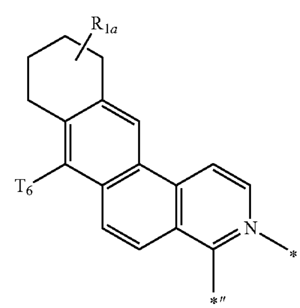
CY98
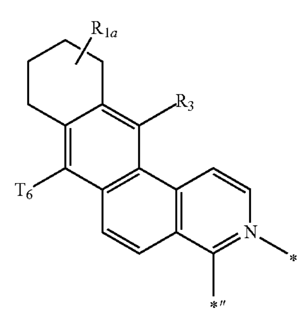

-continued
CY99
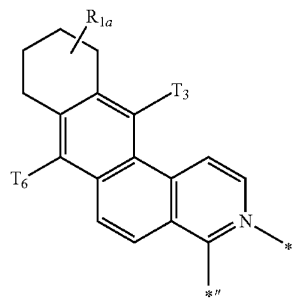
CY100
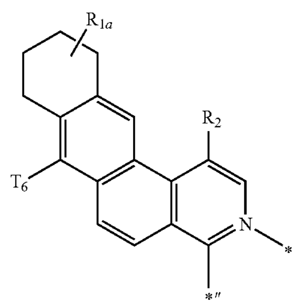
CY101
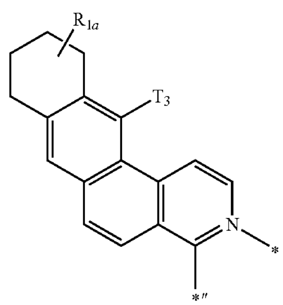
CY102
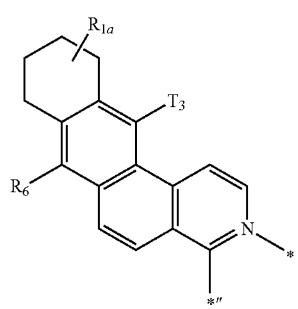
CY103
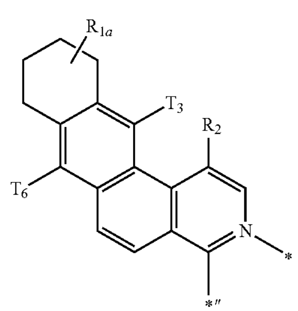
-continued
CY104
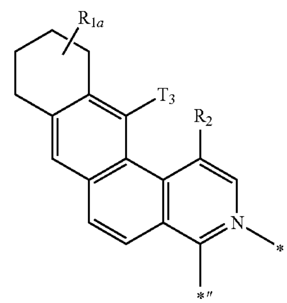
CY105
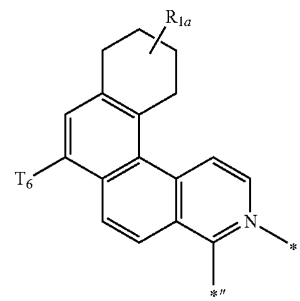
CY106
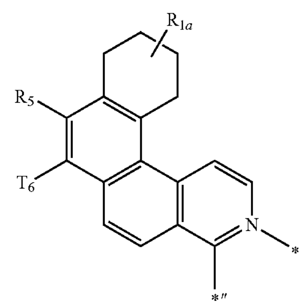
CY107
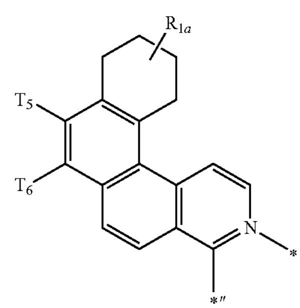
CY108
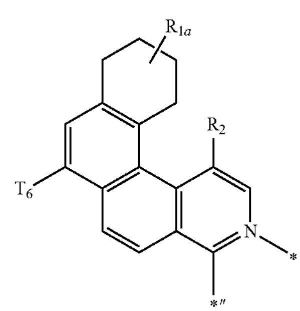

-continued

CY109

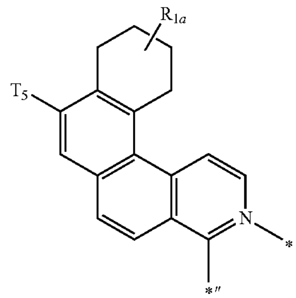

CY110

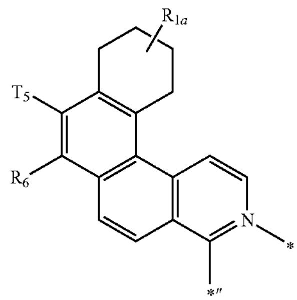

CY111

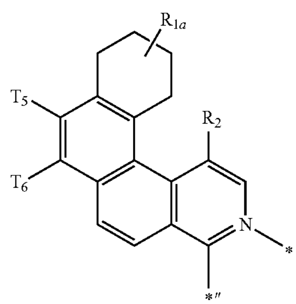

CY112

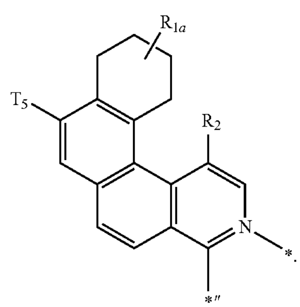

In Formulae CY1 to CY112, $T_2$ to $T_8$ may each independently be a fluoro group or a fluorinated group, $R_2$ to $R_8$ and $R_{1a}$ are the same as described in the present specification, and each of $R_2$ to $R_8$ is not hydrogen,

* is a binding site to Ir in Formula 1, and

*" is a binding site to a neighboring atom in Formula 1-1.

In one or more embodiments, the group represented by

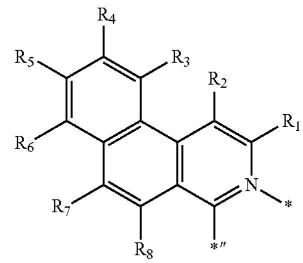

in Formula 1-1 may be a group represented by one of Formula CY1, CY9, CY11, CY17, CY19, CY25, CY30, CY57, CY64, or CY85.

In one or more embodiments, a group represented by

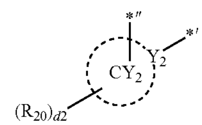

in Formula 1-1 may be a group represented by one of Formulae A(1) to A(10):

A(1)

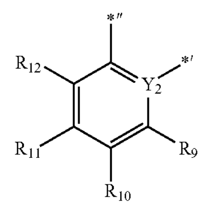

A(2)

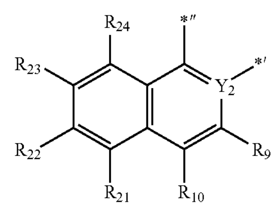

A(3)

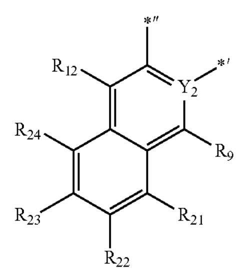

A(4)

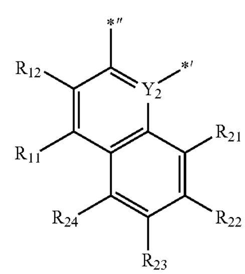

-continued

A(5)

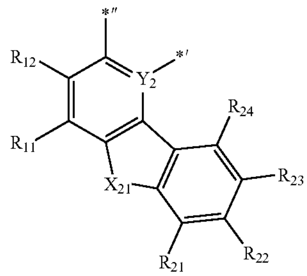

A(6)

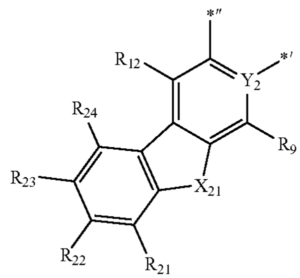

A(7)

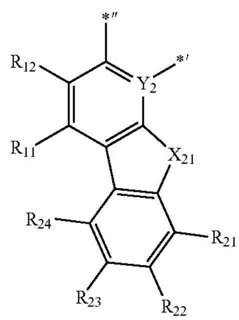

A(8)

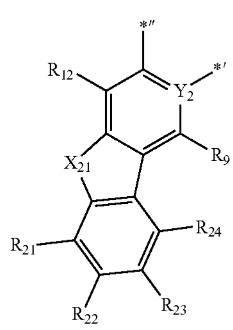

A(9)

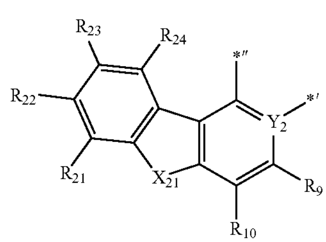

-continued

A(10)

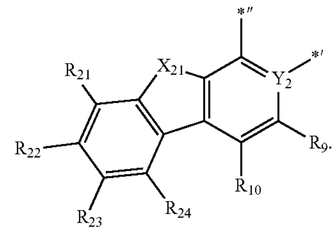

In Formulae A(1) to A(10), $Y_2$ is C, $X_{21}$ may be O, S, $N(R_{25})$, $C(R_{25})(R_{26})$, or $Si(R_{25})(R_{26})$, $R_9$ to $R_{12}$ and $R_{21}$ to $R_{26}$ are the same as described in connection with $R_{20}$,

*' is a binding site to Ir in Formula 1, and

*" is a binding site to a neighboring atom in Formula 1.

In one or more embodiments, $R_9$ and $R_{11}$ in Formula A(1) may not be hydrogen.

In one or more embodiments, $R_{10}$ and $R_{12}$ in Formula A(1) may each independently be hydrogen or deuterium.

In one or more embodiments, $R_9$ and $R_{11}$ in Formula A(1) may not be hydrogen, and $R_{10}$ and $R_{12}$ may each be hydrogen.

In one or more embodiments, $R_9$ and $R_{11}$ in Formula A(1) may be identical to each other.

In one or more embodiments, $R_9$ and $R_{11}$ in Formula A(1) may be different from each other.

In one or more embodiments, $R_9$ and $R_{11}$ in Formula A(1) may be different from each other, and the number of carbons included in $R_9$ may be different from the number of carbons included in $R_{11}$.

In one or more embodiments, $R_9$ and $R_{11}$ in Formula A(1) may be different from each other, and the number of carbons included in $R_{11}$ may be greater than the number of carbons included in $R_9$.

In one or more embodiments, $R_9$ and $R_{11}$ in Formula A(1) may each independently be:

deuterium; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each substituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a $(C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a $(C_1$-$C_{20}$ alkyl)$C_1$-$C_{10}$ heterocycloalkyl group, a phenyl group, a deuterated a phenyl group, a $(C_1$-$C_{20}$ alkyl)phenyl group, a biphenyl group, a deuterated biphenyl group, a $(C_1$-$C_{20}$ alkyl)biphenyl group, or any combination thereof.

In one or more embodiments, i) at least one of $R_9$ to $R_{12}$ in Formula A(1), ii) $R_9$, $R_{10}$, one of $R_{21}$ to $R_{26}$ or any combination thereof in Formulae A(2), A(9), and A(10), iii) $R_9$, $R_{12}$, one of $R_{21}$ to $R_{26}$ or any combination thereof in Formulae A(3), A(6), and A(8), and iv) $R_{11}$, $R_{12}$, one of $R_{21}$ to $R_{26}$ or any combination thereof in Formulae A(4), A(5), and A(7) may each independently be deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, or deuterated biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a $(C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, or any combination thereof.

In one or more embodiments, at least one of $R_9$ and $R_{11}$ in Formula A(1) (for example, $R_9$ and $R_{11}$ in Formula A(1)) may each independently be a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, or a deuterated biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, or any combination thereof.

In one or more embodiments, the group represented by

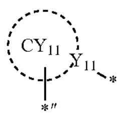

in Formula 1-2 may be a group represented by one of Formulae CY11-1 to CY11-16, the group represented by

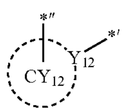

in Formula 1-2 may be a group represented by one of Formulae CY12-1 to CY12-22:

CY11-1

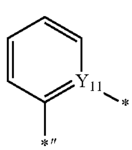

CY11-2

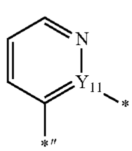

CY11-3

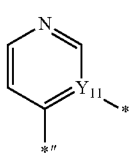

CY11-4

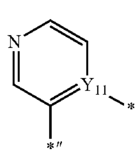

-continued

CY11-5

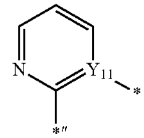

CY11-6

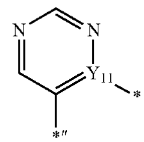

CY11-7

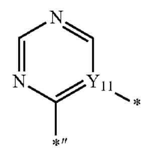

CY11-8

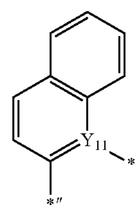

CY11-9

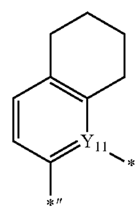

CY11-10

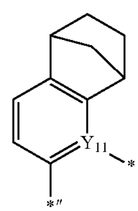

CY11-11

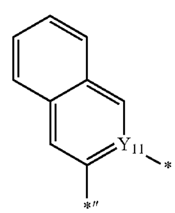

CY11-12

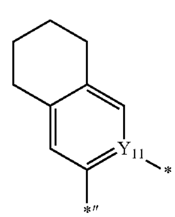

-continued
CY11-13
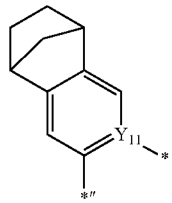
CY11-14
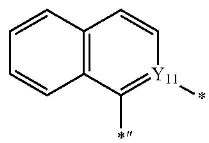
CY11-15
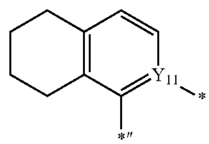
CY11-16
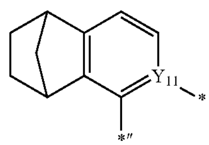
CY12-1
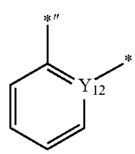
CY12-2
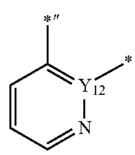
CY12-3
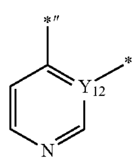
CY12-4
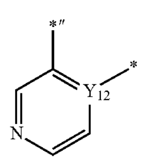
CY12-5
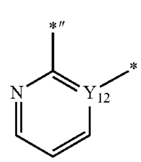
CY12-6
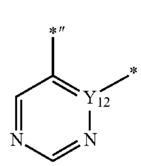
-continued
CY12-7
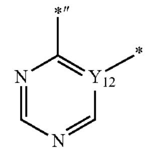
CY12-8
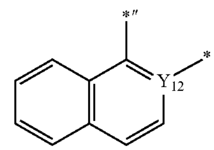
CY12-9
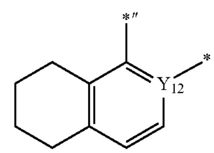
CY12-10
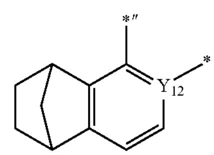
CY12-11
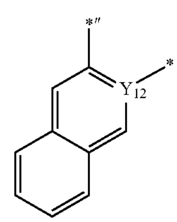
CY12-12
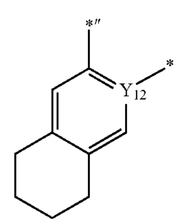
CY12-13
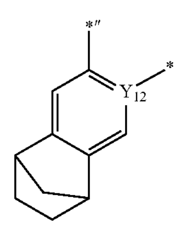
CY12-14
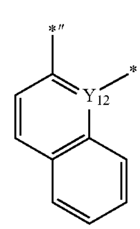

-continued

CY12-15

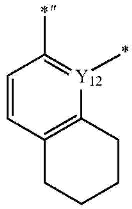

CY12-16

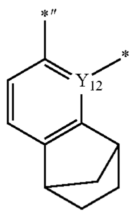

CY12-17

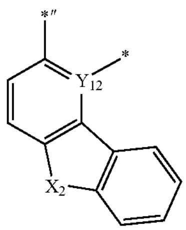

CY12-18

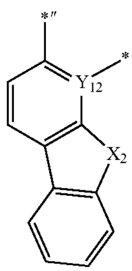

CY12-19

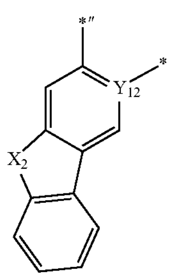

CY12-20

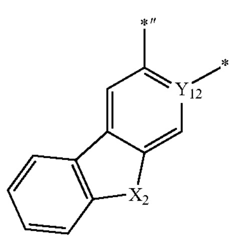

CY12-21

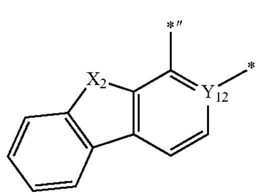

-continued

CY12-22

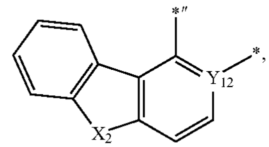

or a combination thereof.

In Formulae CY11-1 to CY11-16 and Formulae CY12-1 to CY12-22, $Y_{11}$ may be N, $Y_{12}$ may be C, $X_2$ may be O, S, $N(Z_{25})$, $C(Z_{25})(Z_{26})$, or $Si(Z_{25})(Z_{26})$, $Z_{25}$ and $R_{26}$ are the same as described in connection with $Z_2$,

* and *' each indicate a binding site to Ir in Formula 1, and each *" indicates a binding site to a neighboring atom.

In one or more embodiments, the group represented by

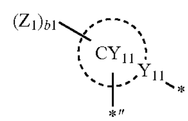

in Formula 1-2 may be a group represented by one of Formulae CY11(1) to CY11(22) and CY11-8 to CY11-16, the group represented by

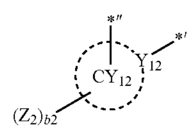

in Formula 1-2 may be a group represented by one of Formulae CY12(1) to CY12-(16) and CY12-8 to CY12-22:

CY11(1)

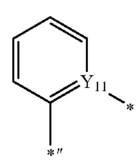

CY11(2)

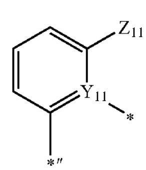

CY11(3)

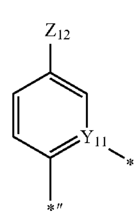

-continued
CY11(4)
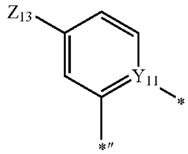
CY11(5)
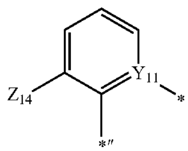
CY11(6)
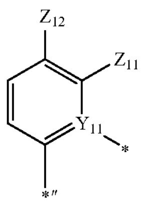
CY11(7)
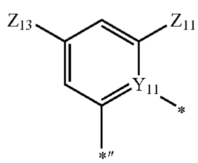
CY11(8)
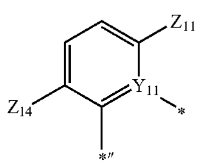
CY11(9)
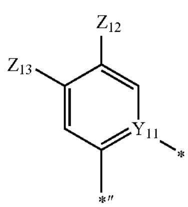
CY11(10)
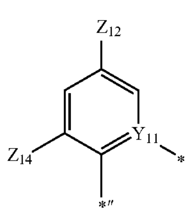
CY11(11)
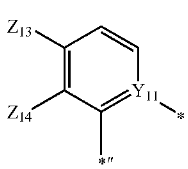
-continued
CY11(12)
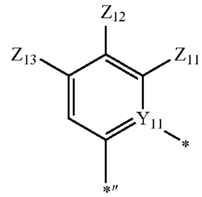
CY11(13)
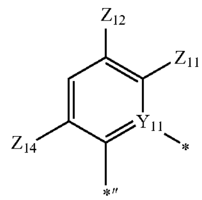
CY11(14)
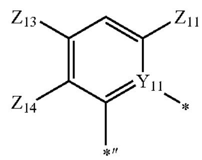
CY11(15)
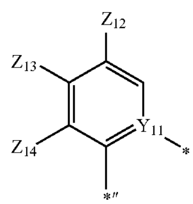
CY11(16)
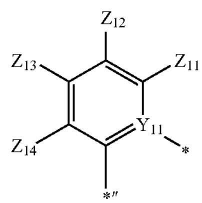
CY11(17)
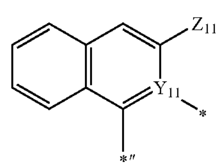
CY11(18)
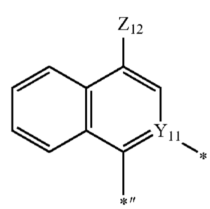
CY11(19)
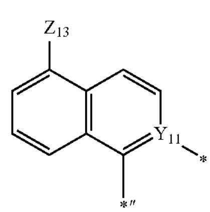

-continued
CY11(20)
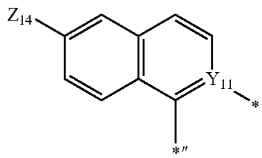
CY11(21)
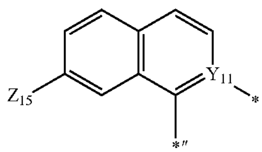
CY11(22)
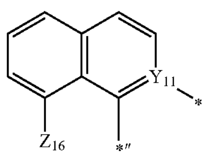
CY11-8
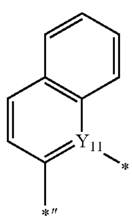
CY11-9
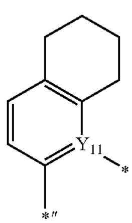
CY11-10
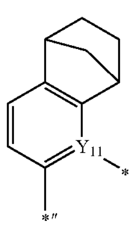
CY11-11
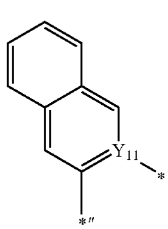
-continued
CY11-12
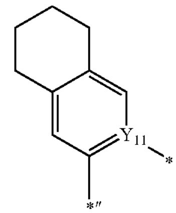
CY11-13
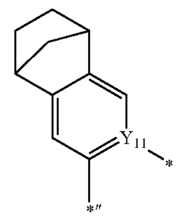
CY11-14
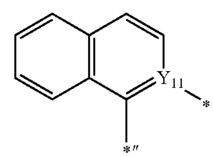
CY11-15
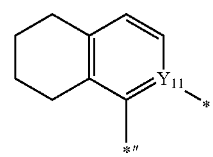
CY11-16
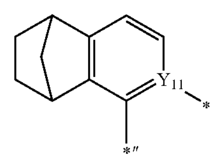
CY12(1)
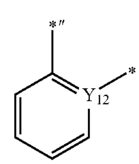
CY12(2)
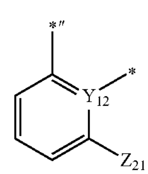
CY12(3)
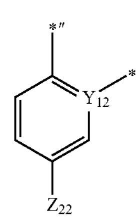

-continued
CY12(4)
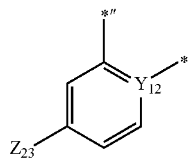
CY12(5)
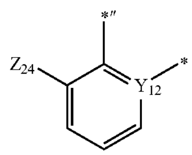
CY12(6)
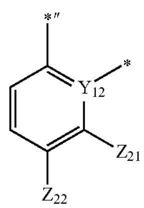
CY12(7)
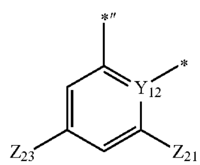
CY12(8)
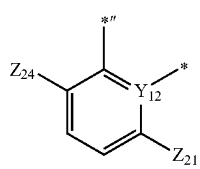
CY12(9)
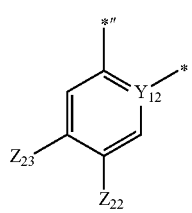
CY12(10)
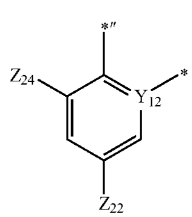
CY12(11)
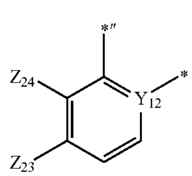
-continued
CY12(12)
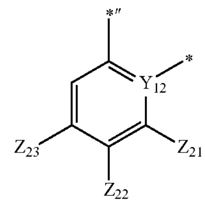
CY12(13)
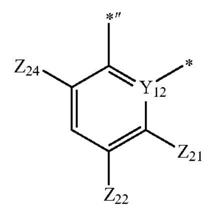
CY12(14)
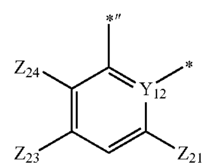
CY12(15)
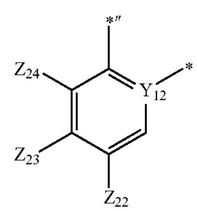
CY12(16)
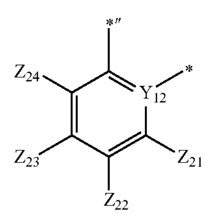
CY12-8
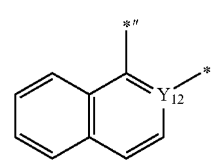
CY12-9
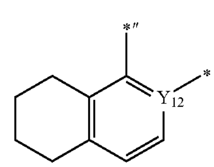
CY12-10
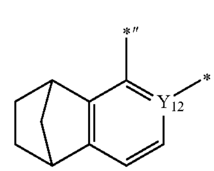

-continued

CY12-11

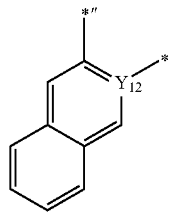

CY12-12

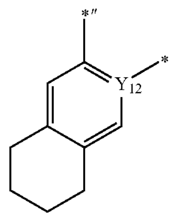

CY12-13

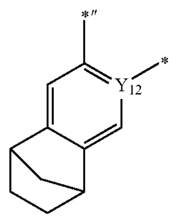

CY12-14

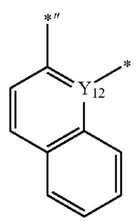

CY12-15

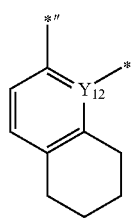

CY12-16

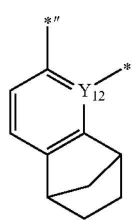

CY12-17

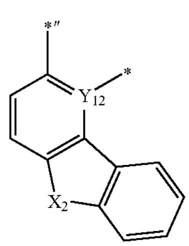

-continued

CY12-18

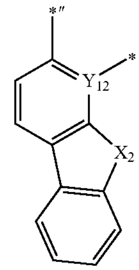

CY12-19

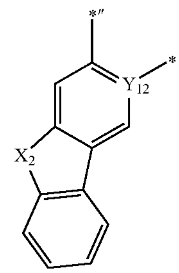

CY12-20

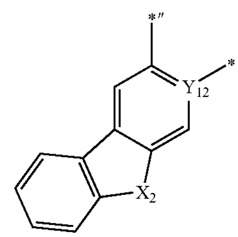

CY12-21

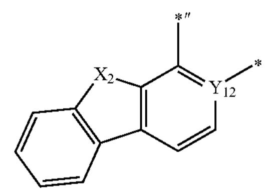

CY12-22

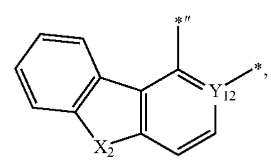

or a combination thereof.

In Formulae CY11(1) to CY11(16), CY11-8 to CY11-16, CY12(1) to CY12-(16) and CY12-8 to CY12-22, $Y_{11}$ may be N, $Y_{12}$ may be C, $X_2$ may be O, S, $N(Z_{25})$, $C(Z_{25})(Z_{26})$, or $Si(Z_{25})(Z_{26})$, $Z_{11}$ to $Z_{16}$ are the same as described in connection with $Z_1$, and each of $Z_{11}$ to $Z_{16}$ is not hydrogen, $Z_{21}$ to $R_{26}$ are the same as described in connection with $Z_2$, and each of $Z_{21}$ to $Z_{24}$ is not hydrogen,

* and *' each indicate a binding site to Ir in Formula 1, and each *" indicates a binding site to a neighboring atom.

In one or more embodiments, the group represented by
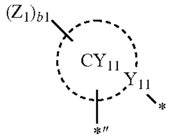
in Formula 1-2 may be a group represented by one of Formulae CY11(3), CY11(6), CY11(9) to CY11(13), CY11(15), and CY11(16), and $R_{12}$ may be —Si($Q_3$)($Q_4$)($Q_5$) or —Ge($Q_3$)($Q_4$)($Q_5$).
The organometallic compound represented by Formula 1 may be one of Compounds 1 to 27:
1
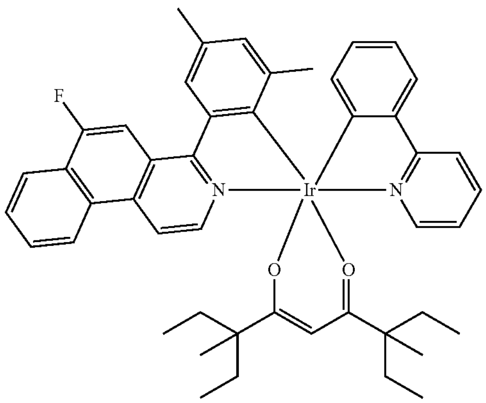
2
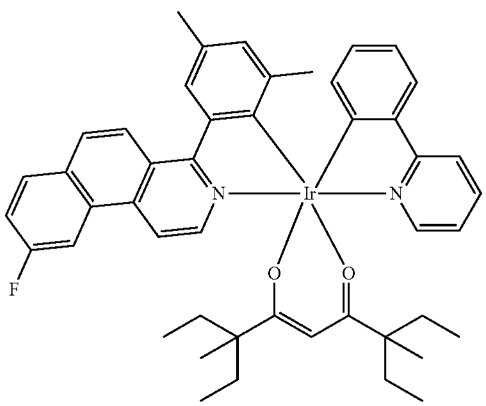
3
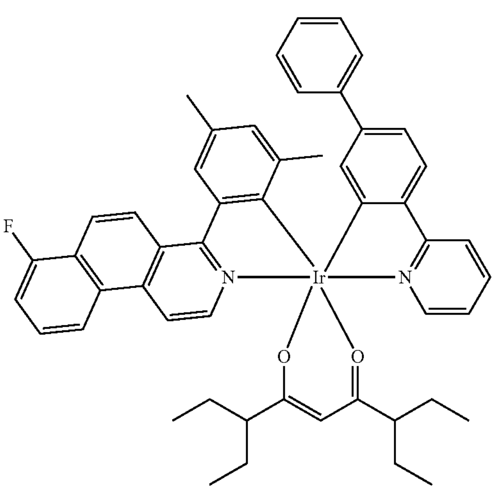
-continued
4
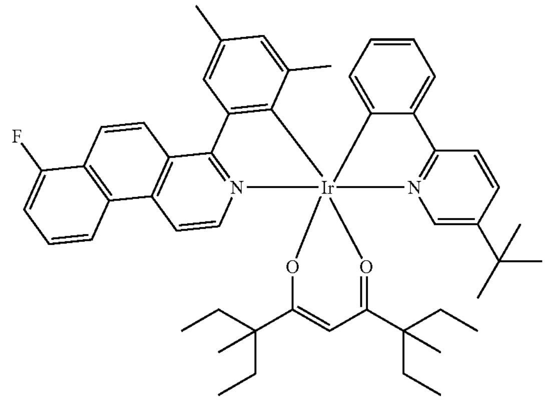
5
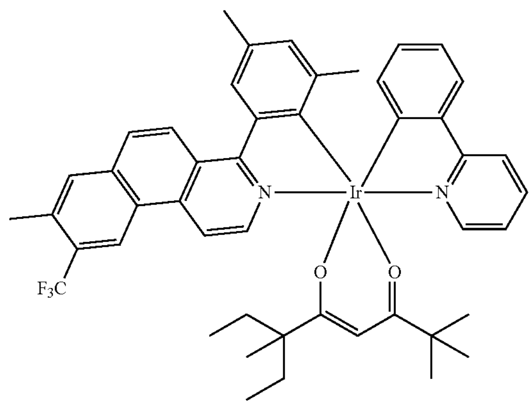
6
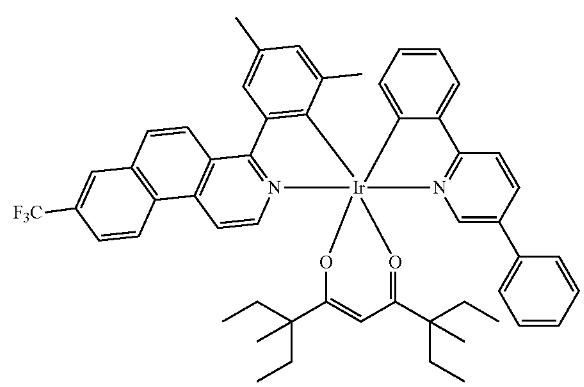

-continued
7
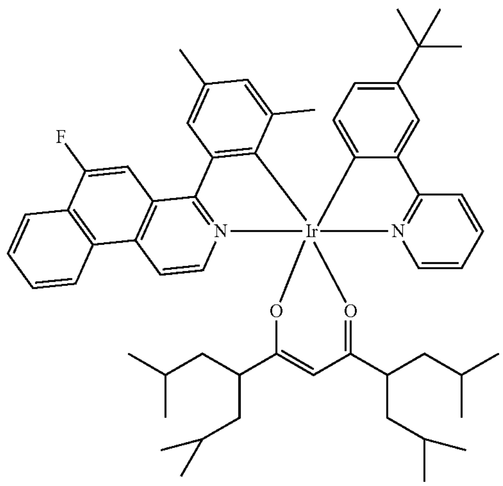
8
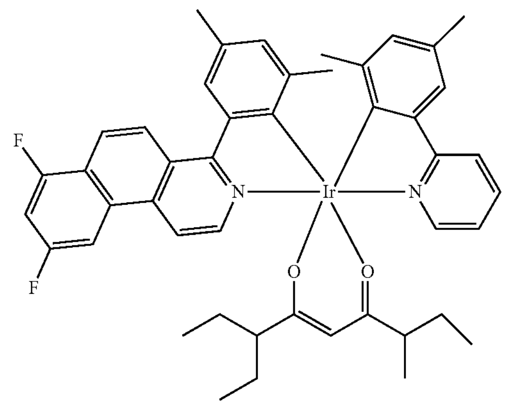
9
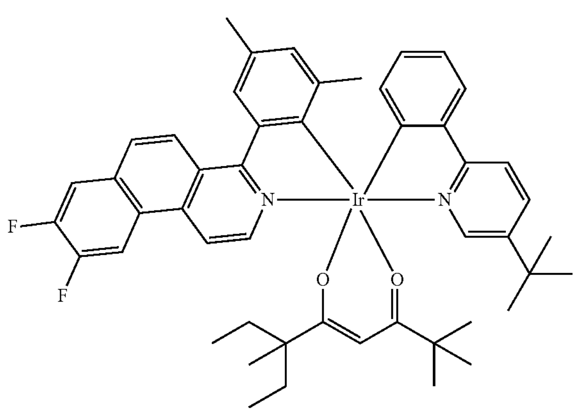
-continued
10
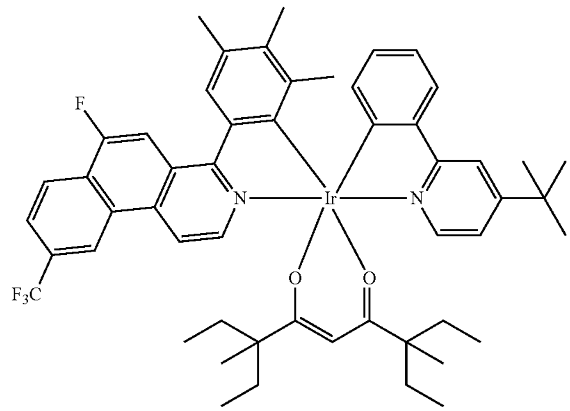
11
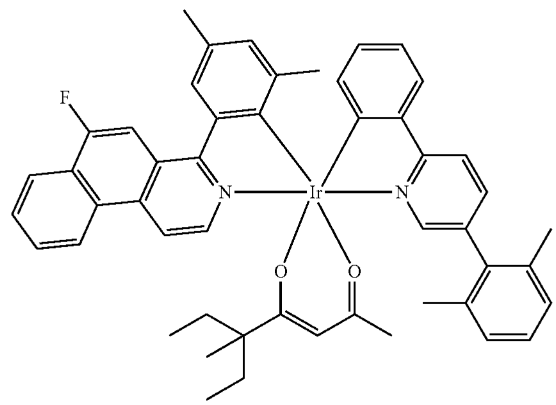
12
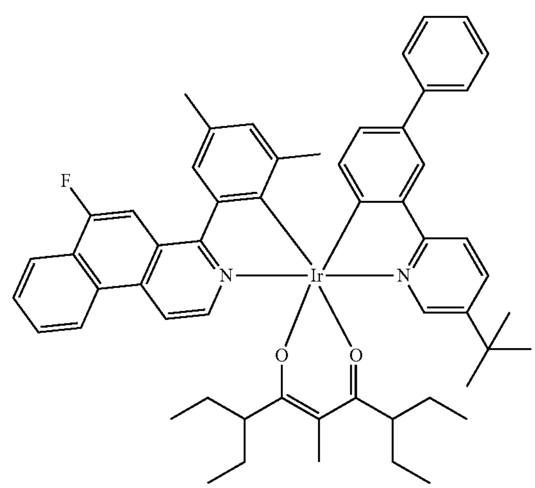

13
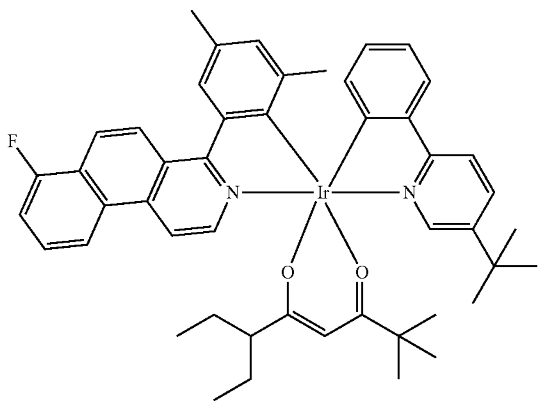
14
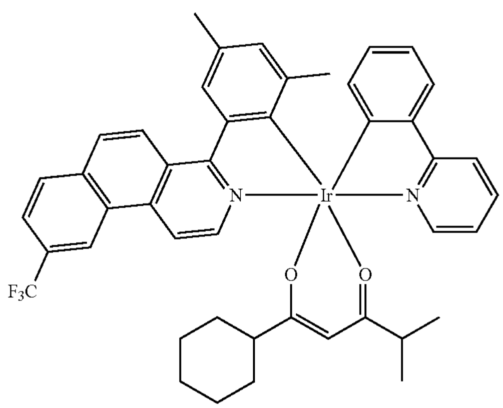
15
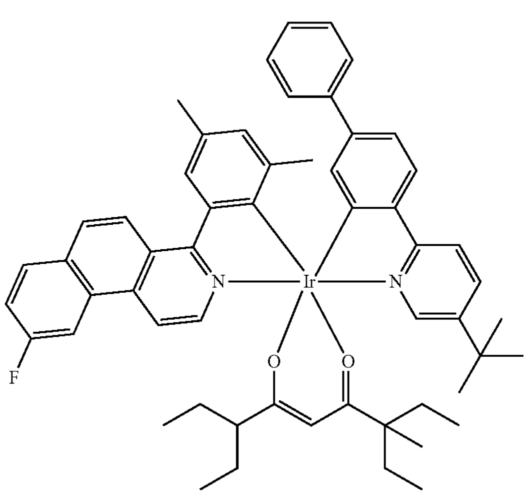
16
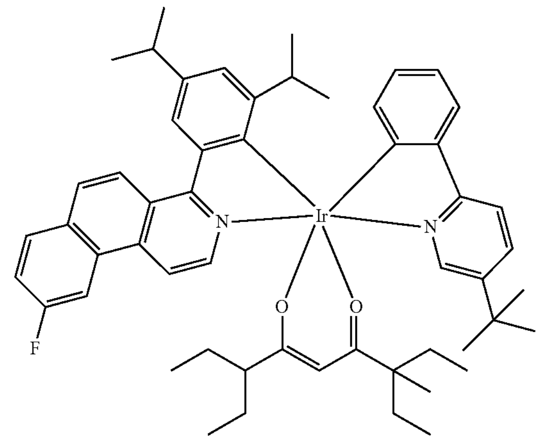
17
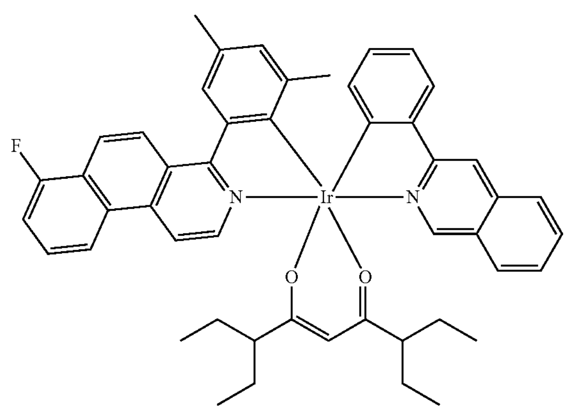
18
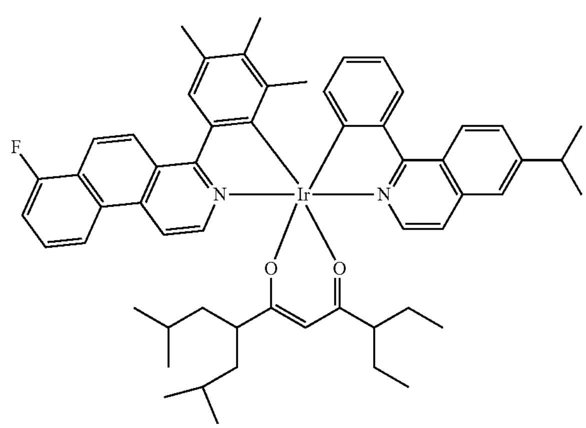

19
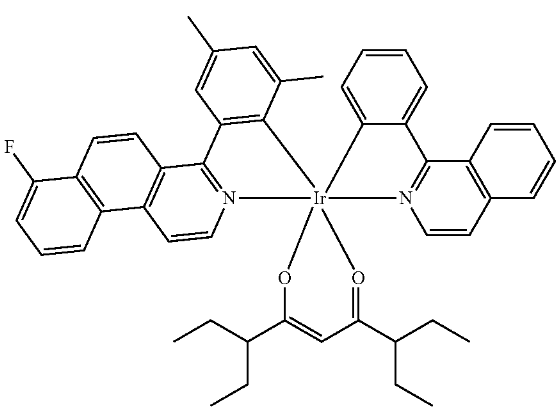
20
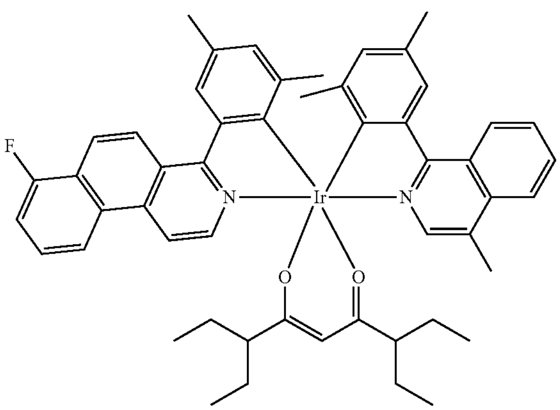
21
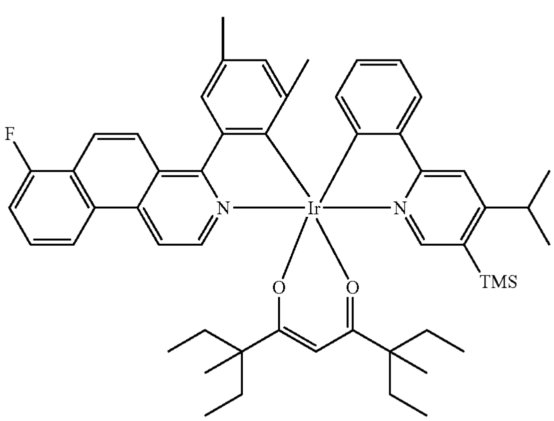
22
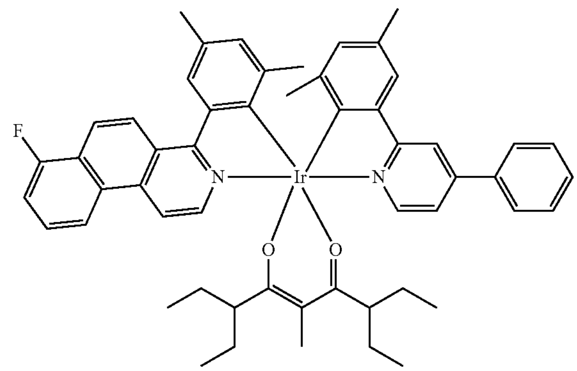
23
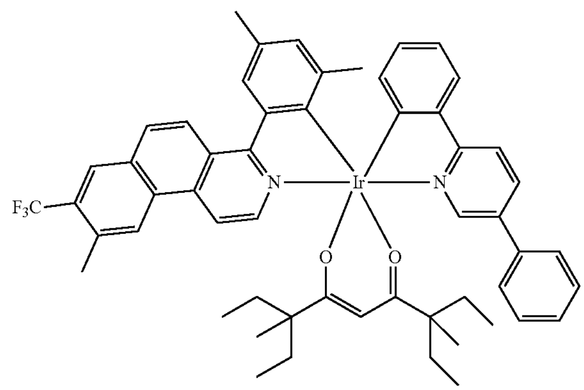
24
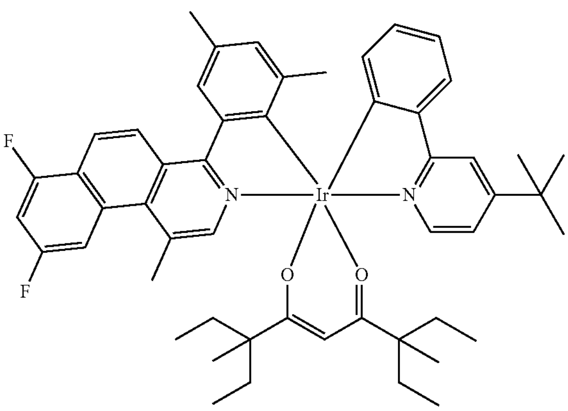
25
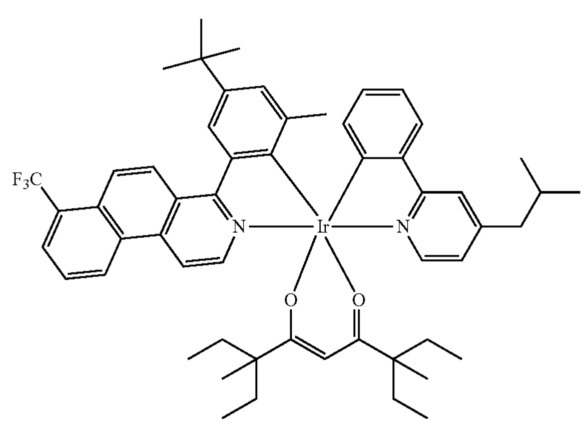

-continued

26

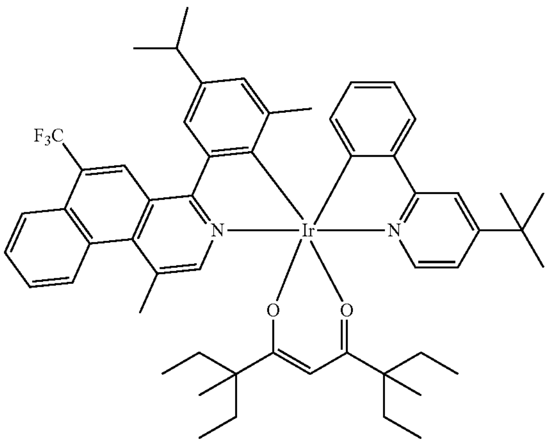

27

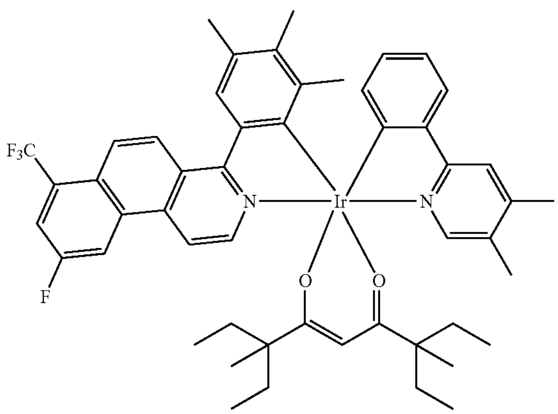

Regarding the organometallic compound represented by Formula 1, at least one of $R_1$ to $R_8$, at least one of $R_{20}$(s) in the number of a2, or any combination thereof may each independently be a group represented by Formula 1-1, which is a fluoro group (—F) or a fluorinated group. As such, electronic devices, such as organic light-emitting devices, including organometallic compounds represented by Formula 1 may have high emission efficiency.

In one or more embodiments, the organometallic compound represented by Formula 1 may include ligand $L_2$ represented by Formula 1-2. As a result, the organometallic compound represented by Formula 1 may have an appropriate molecular weight that facilitates the manufacture of organic light-emitting devices.

Accordingly, an electronic device using the organometallic compound represented by Formula 1, for example, an organic light-emitting device using the organometallic compound represented by Formula 1 may have high emission efficiency and/or a long lifespan.

In one or more embodiments, the full width at half maximum (FWHM) of the emission peak of the emission spectrum or the electroluminescence spectrum of the organometallic compound may be 55 nm or less. For example, the FWHM of the emission peak of the emission spectrum or the electroluminescence spectrum of the organometallic compound may be from about 30 nm to about 55 nm, or about 40 nm to about 53 nm.

In one or more embodiments, the maximum emission wavelength (emission peak wavelength, $\lambda_{max}$) of the emission peak of the emission spectrum or the electroluminescence spectrum of the organometallic compound may be from about 610 nm to about 640 nm. In one or more embodiments, the maximum emission wavelength (emission peak wavelength, $\lambda_{max}$) of the emission peak of the emission spectrum or the electroluminescence spectrum of the organometallic compound may be from about 615 nm to about 635 nm.

In one or more embodiments, the HOMO energy level of the organometallic compound represented by Formula 1 may be from about −5.200 eV to about −5.000 eV. The HOMO energy level may be measured by using cyclic voltamemetry.

In one or more embodiments, the LUMO energy level of the organometallic compound represented by Formula 1 may be from about −2.700 eV to about −2.300 eV. The LUMO energy level may be measured by using cyclic voltammetry.

In one or more embodiments, the decay time of the organometallic compound represented by Formula 1 may be about 0.8 μs or less, for example, from about 0.6 μs to about 0.8 μs. The decay time may be estimated from the time-resolved photoluminescence (TRPL) spectrum of the organometallic compound.

In one or more embodiments, the horizontal orientation ratio of the transition dipole moment of the organometallic compound represented by Formula 1 may be from about 90% to about 100%.

For example, the horizontal orientation ratio of the transition dipole moment of the organometallic compound may be, for example, from about 90% to about 100%, from about 91% to about 100%, from about 92% to about 100%, from about 93% to about 100%, from about 94% to about 100%, from about 95% to about 100%, from about 96% to about 100%, from about 97% to about 100%, from about 98% to about 100%, or from about 99% to about 100%, or about 100%.

The horizontal orientation ratio of the transition dipole moment may be evaluated, for example, using an angle-dependent PL measurement apparatus. For a description of the angle-dependent PL measurement apparatus may refer to, for example, the angle-dependent PL measurement apparatus described in KR Application No. 2013-0150834. The KR Application No. 2013-0150834 is incorporated herein by reference.

As described above, since the horizontal orientation ratio of the transition dipole moment of the organometallic compound is high, when an organic light-emitting device including the organometallic compound is driven, an electric field is emitted in a direction that is substantially parallel with respect to the film containing the organometallic compound, and thus, the light loss due to the waveguide mode and/or surface plasmon polariton mode can be reduced. The light emitted according to this mechanism may have high external extraction efficiency (that is, the external extraction efficiency of light emitted from the organometallic compound from a device (for example, an organic light-emitting device) including a film (for example, an emission layer to be described later) containing the organometallic compound). Accordingly, an electronic device including the organometallic compound, for example, an organic light-emitting device including the organometallic compound may have high emission efficiency.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is located between the first electrode and the second electrode and includes an emission layer, wherein the organic layer includes at least one organometallic compound represented by Formula 1.

Since the organic light-emitting device has an organic layer containing the organometallic compound represented by Formula 1 as described above, improved characteristics may be obtained with respect to driving voltage, external quantum efficiency, and lifespan, and the FWHM of the emission peak of the EL spectrum is relatively narrow.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than an amount of the host).

In one or more embodiments, the emission layer may emit red light.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region between the first electrode and the emission layer and an electron transport region between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIG. 1*s* a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may be m-MTDATA, TDATA, 2-TNATA, NPB, R-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly (4-styrenesulfonate) (PANI/PSS), a compound represented by Formula 201 below, a compound represented by Formula 202 below, or any combination thereof:

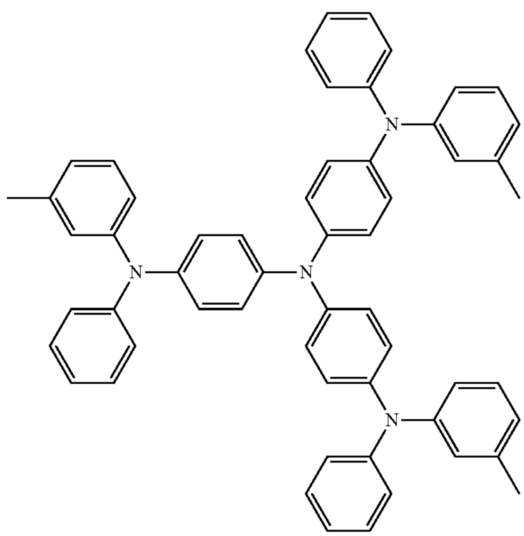

m-MTDATA

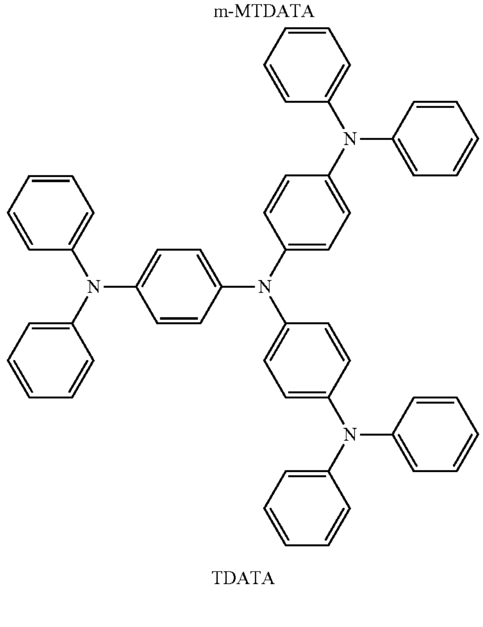

TDATA

-continued

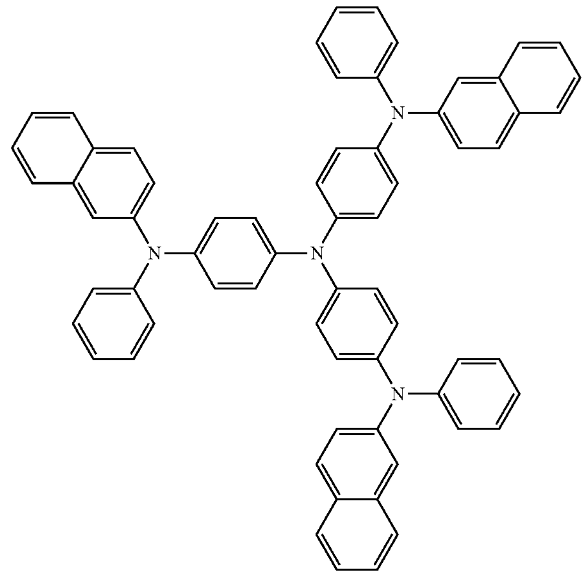

2-TNATA

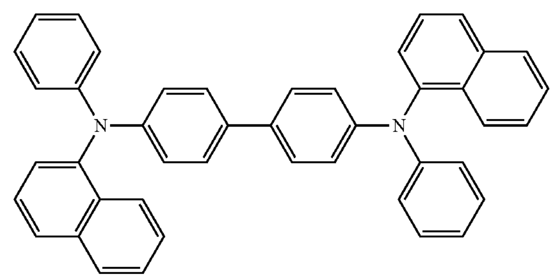

NPB

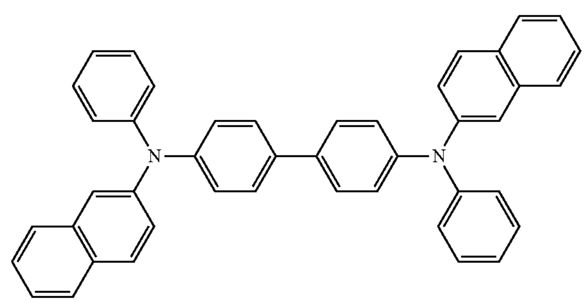

β-NPB

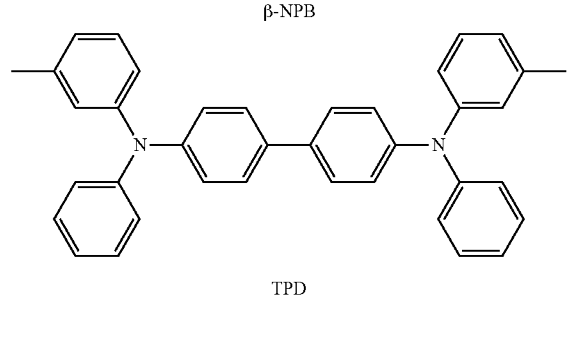

TPD

-continued

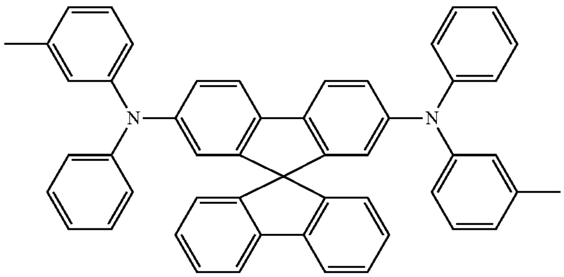

Spiro-TPD

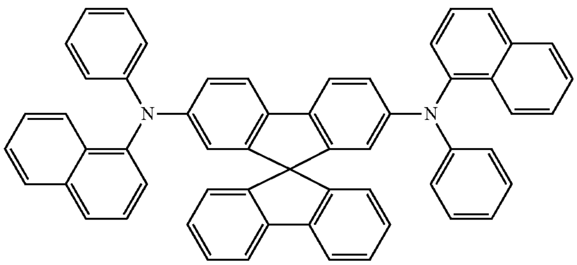

Spiro-NPB

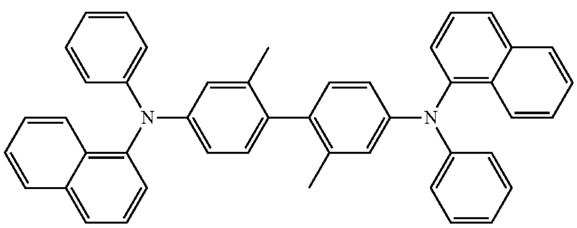

methylated NPB

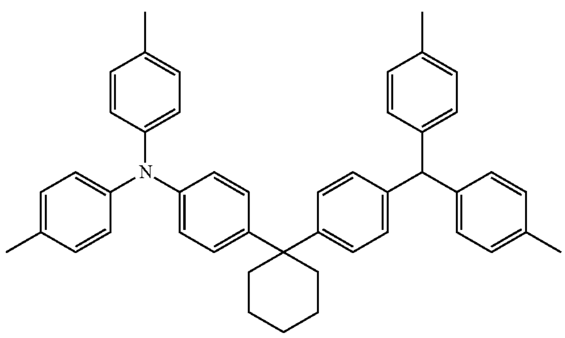

TAPC

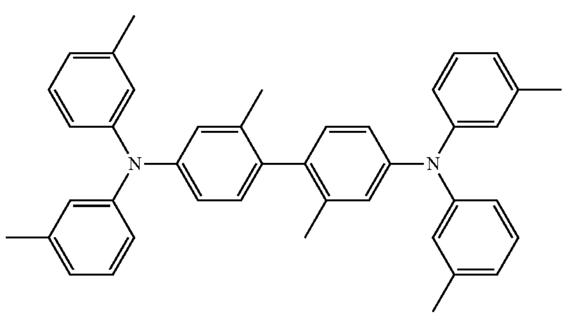

HMTPD

-continued

Formula 201

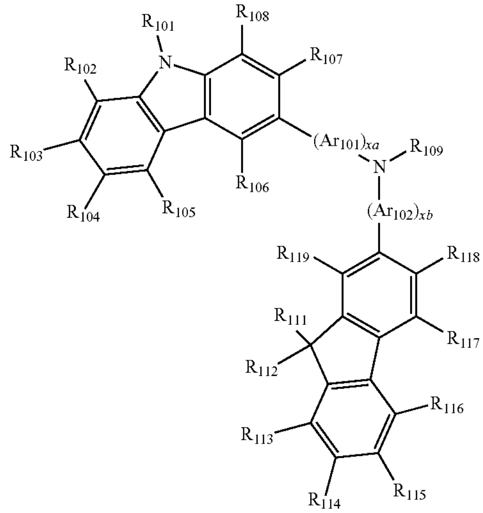

Formula 202

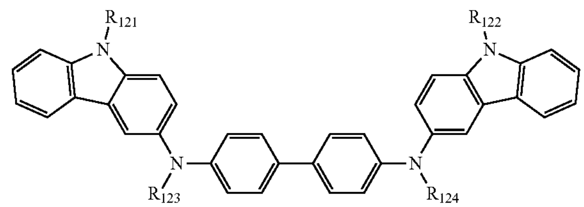

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:

Formula 201A

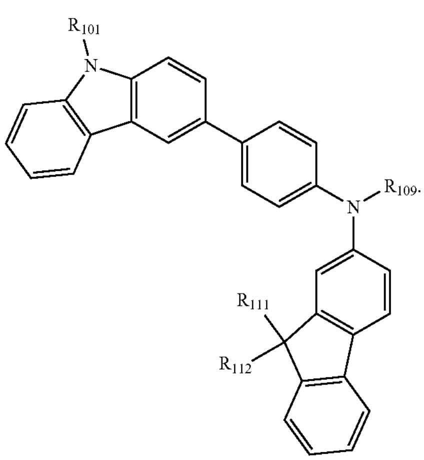

$R_{101}$, $R_{111}$, $R_{112}$, and $R_{109}$ in Formula 201A may be understood by referring to the description provided herein.

For example, the hole transport region may include one of Compounds HT1 to HT21 or any combination thereof:

HT1

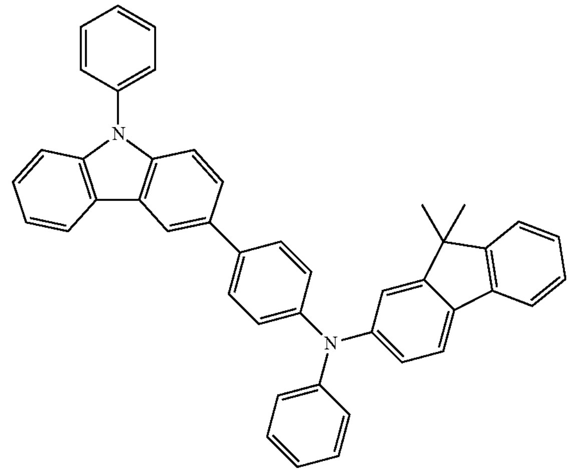

HT2

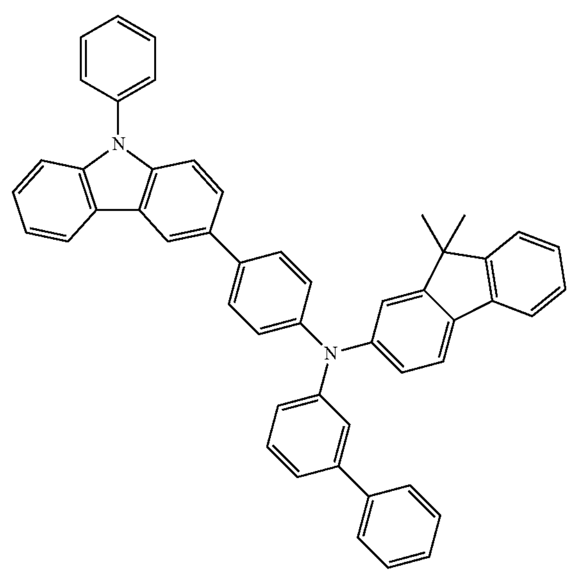

HT3
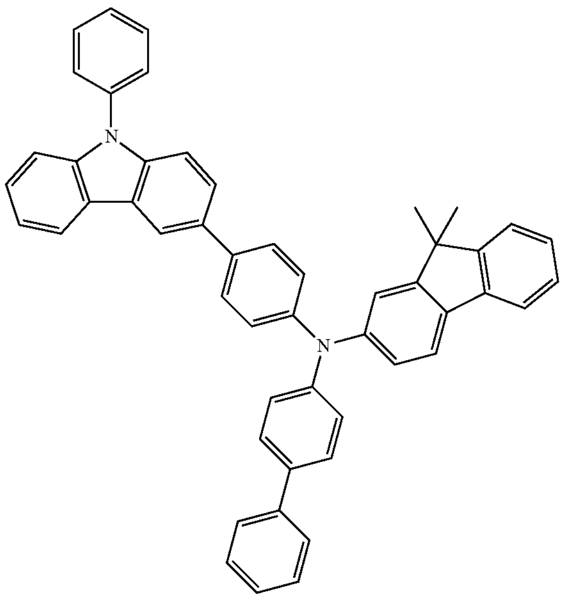
HT4
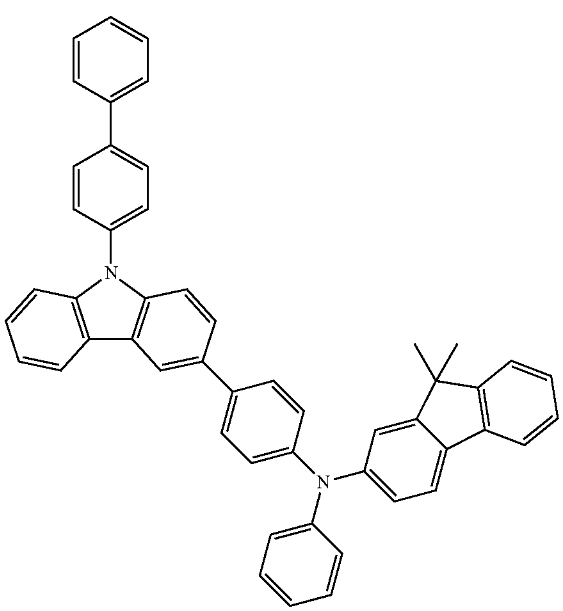
HT5
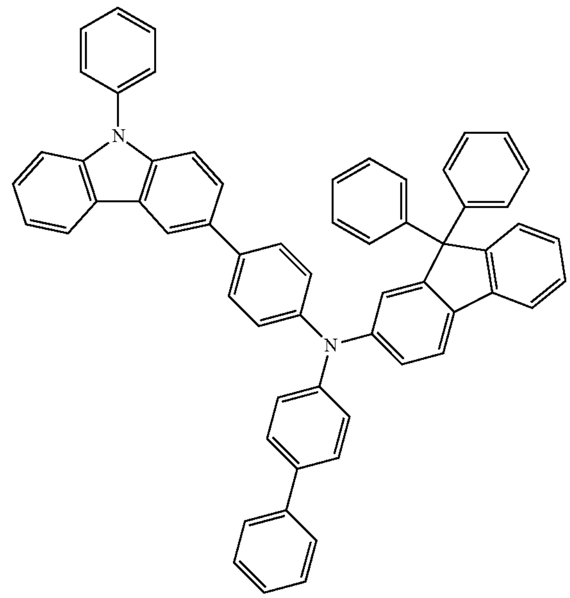
HT6
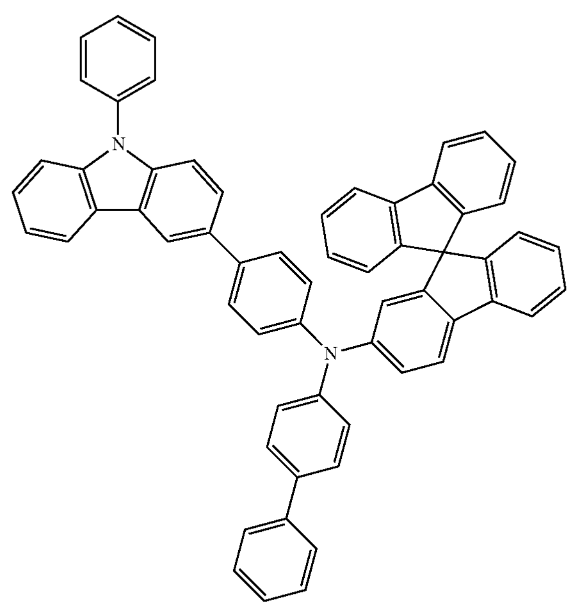

-continued
HT7
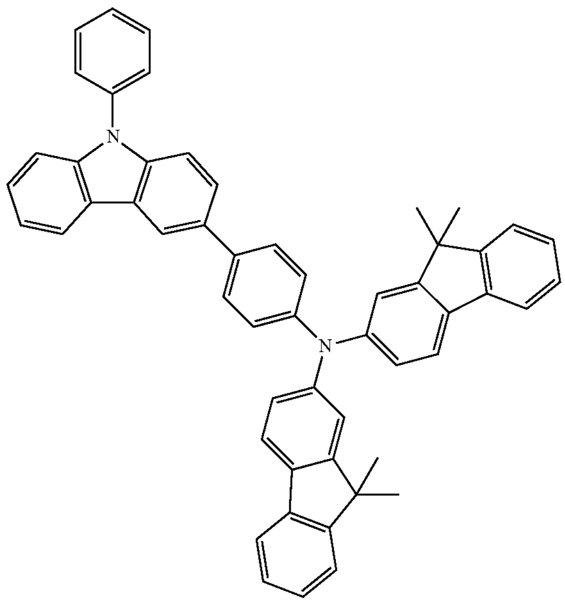
HT8
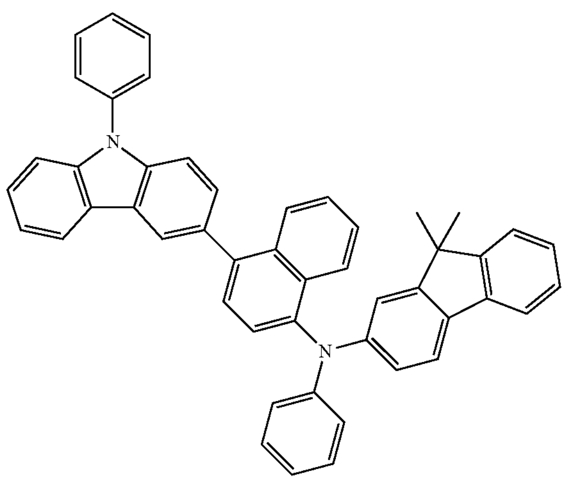
HT9
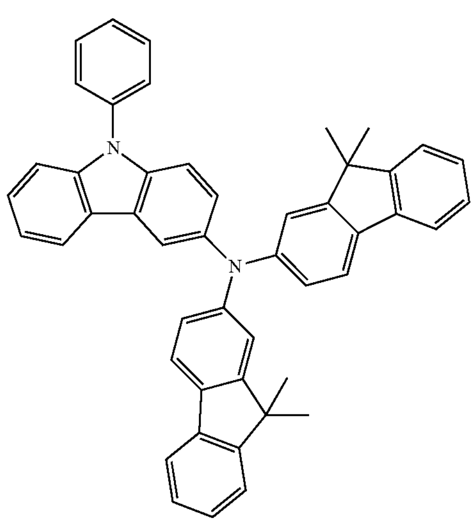
-continued
HT10
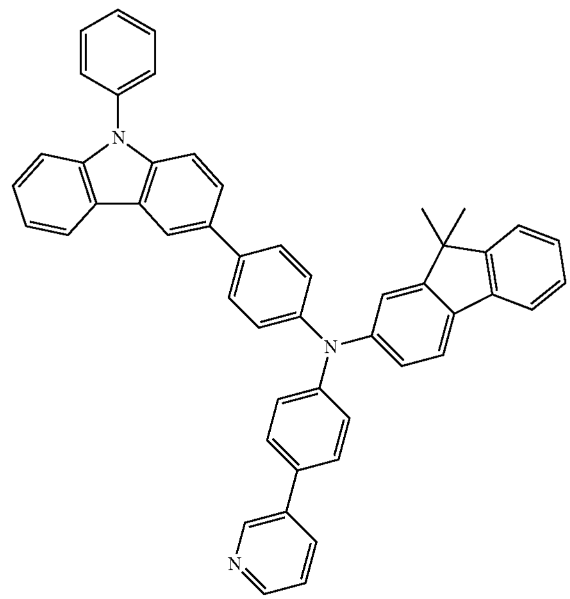
HT11
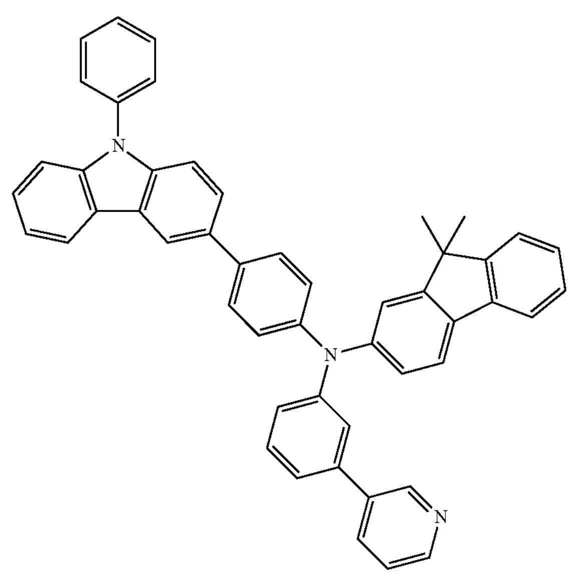

-continued
HT12
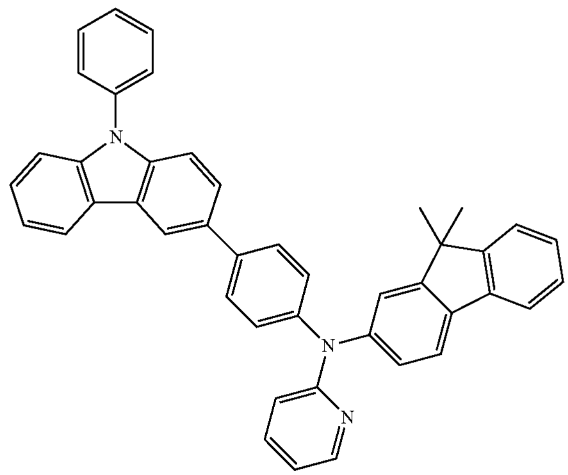
HT13
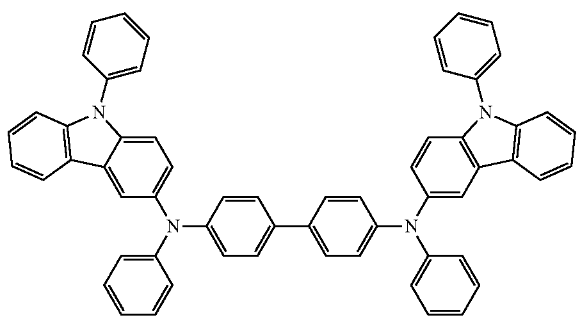
HT14
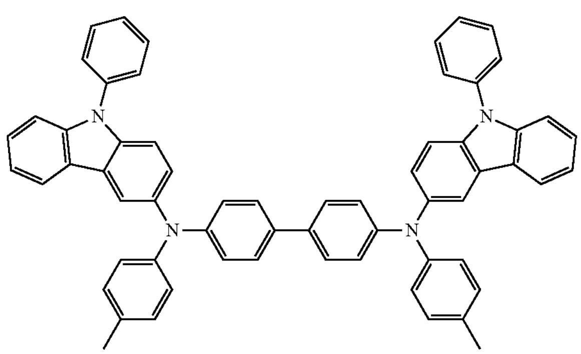
HT15
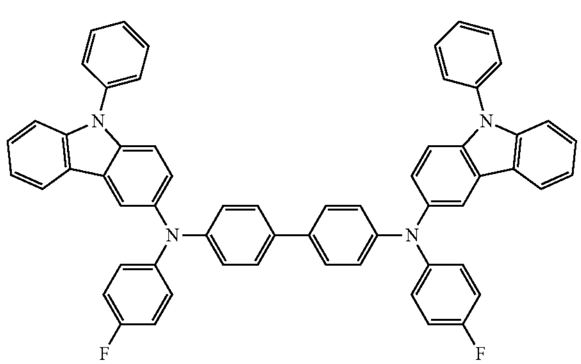
-continued
HT16
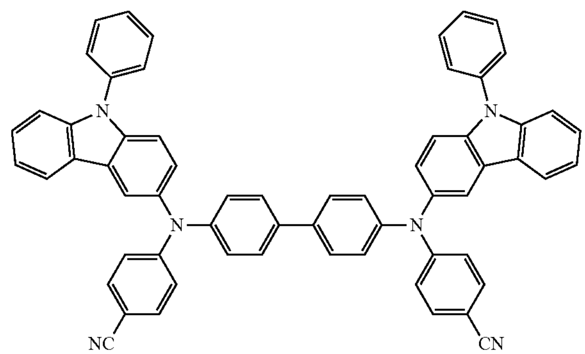
HT17
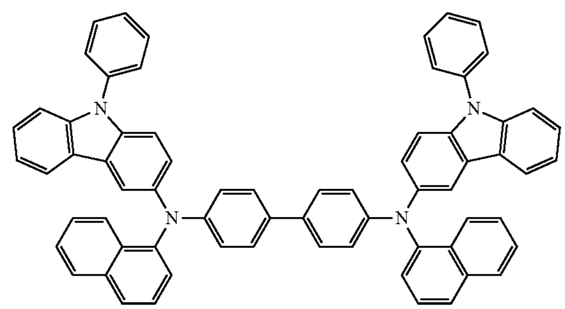
HT18
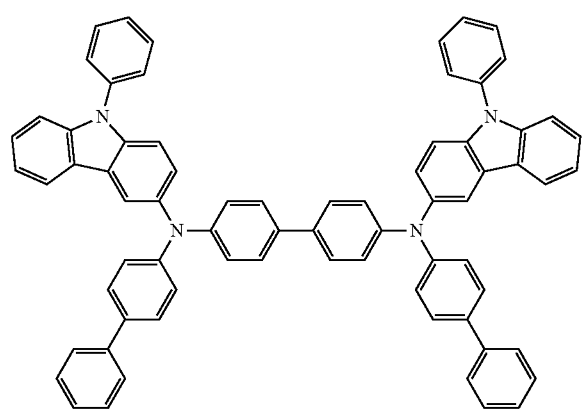
HT19
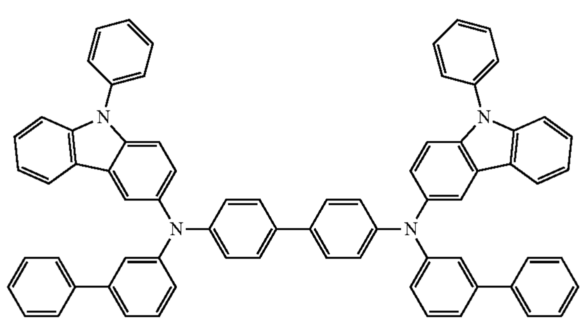

-continued

HT20

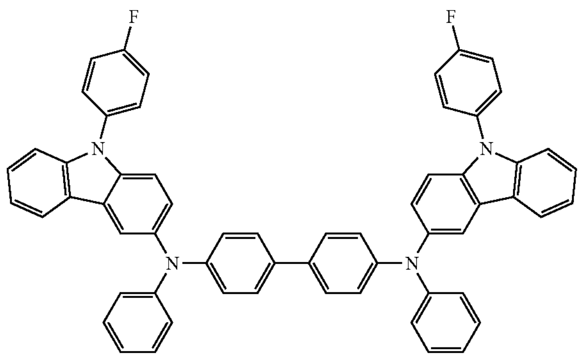

HT21

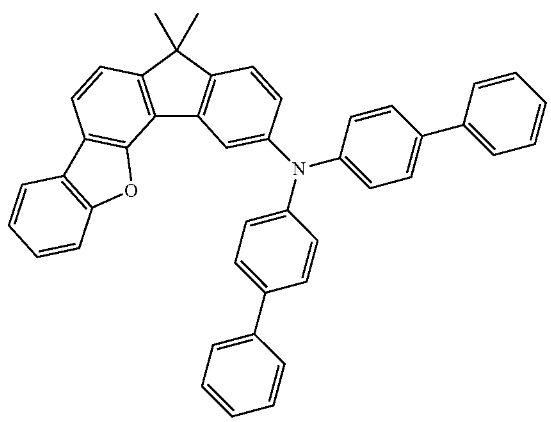

HT-D1

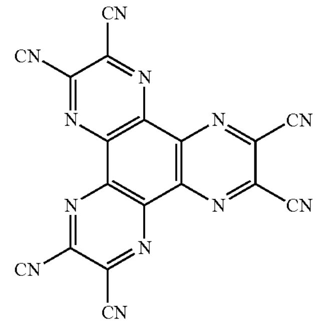

F4-TCNQ

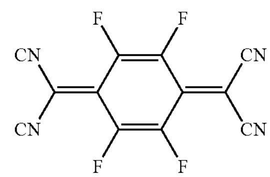

F6-TCNNQ

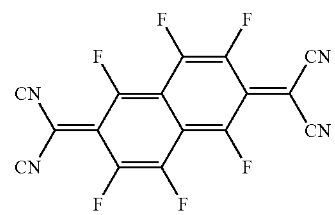

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination particular, but embodiments of the present disclosure are not limited thereto. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or any combination thereof. For example, when the hole transport region includes an electron blocking layer, mCP, the Compound HT21, or any combination described below may be used as the material for forming an electron blocking layer.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, or any combination thereof:

-continued
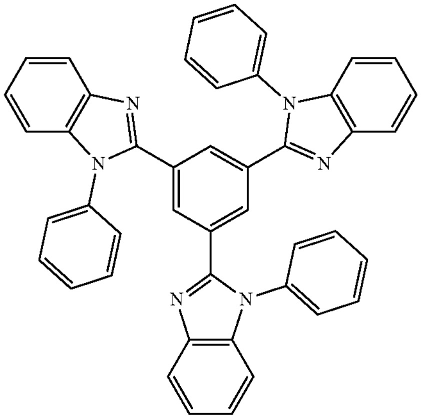
TPBi
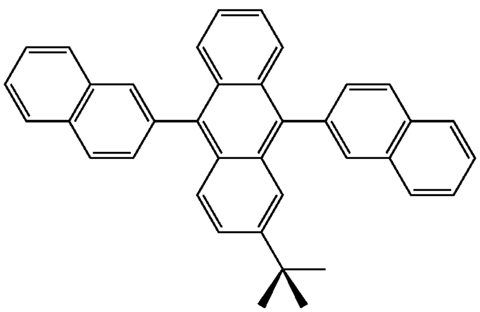
TBADN
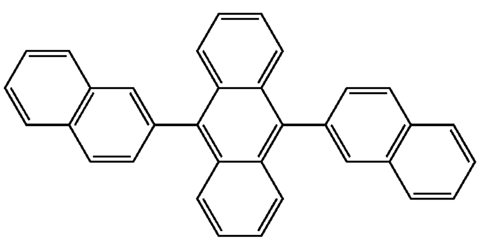
ADN
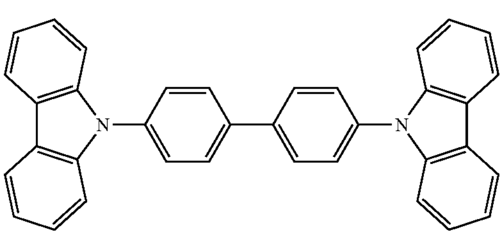
CBP
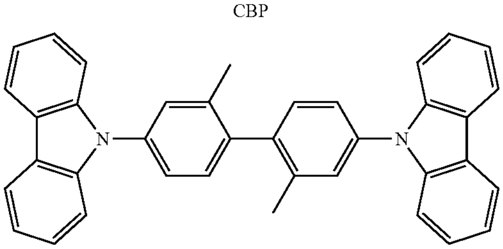
CDBP
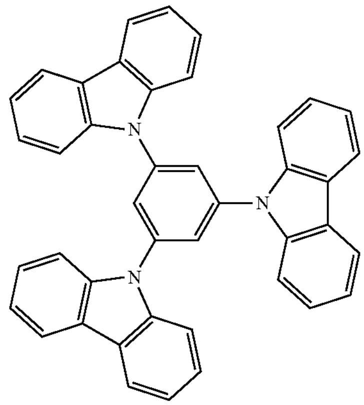
TCP
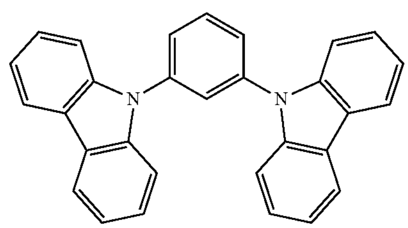
mCP
H50
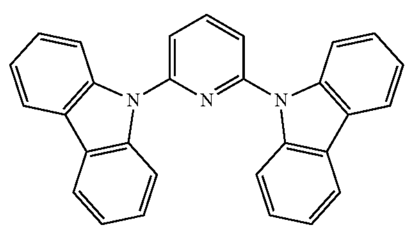
H51
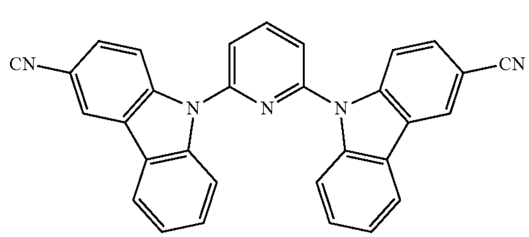

-continued

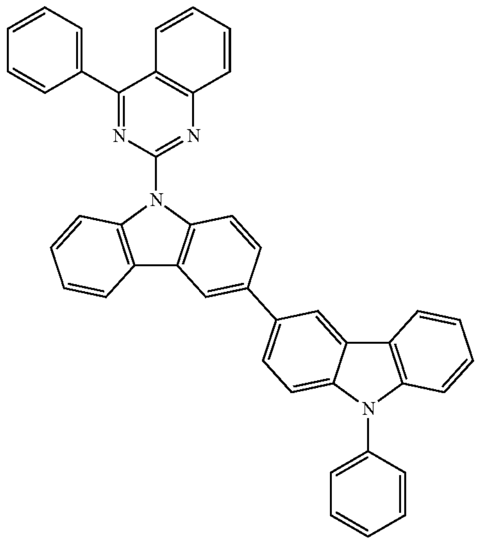

H52

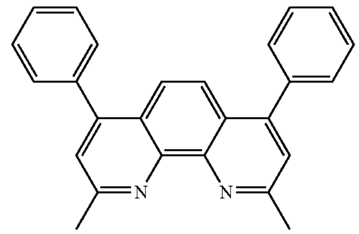

BCP

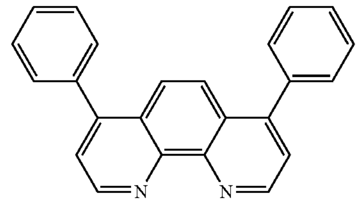

Bphen

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

In one or more embodiments, the hole blocking layer may include the host, a material for forming an electron transport layer, a material for forming an electron injection layer, which will be described later, or any combination thereof.

A thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, $Alq_3$, BAlq, TAZ, NTAZ, or any combination thereof:

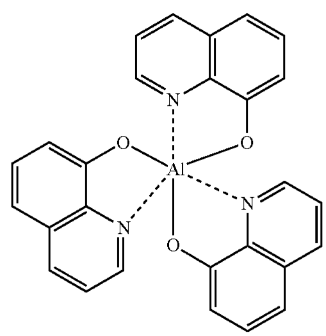

$Alq_3$

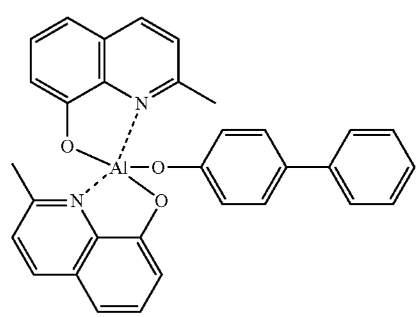

BAlq

-continued
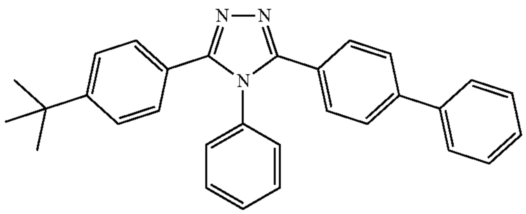
TAZ
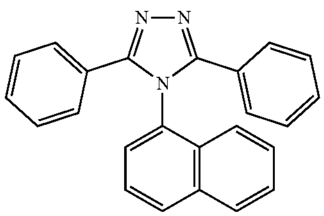
NTAZ
In one or more embodiments, the electron transport layer may include at least one of Compounds ET1 to ET25 or any combination thereof:
ET1
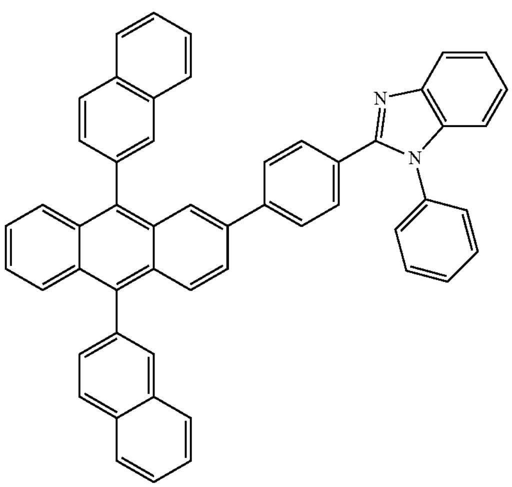
ET2
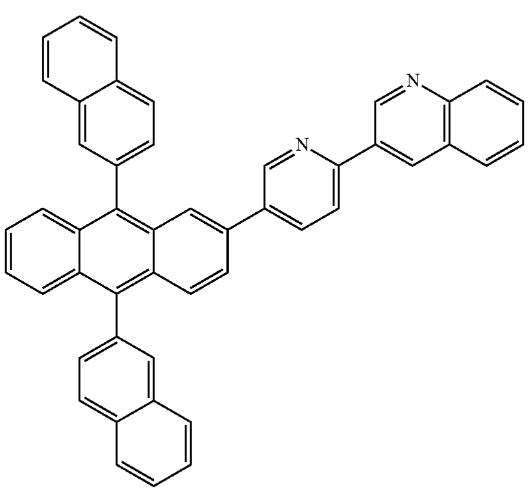
-continued
ET3
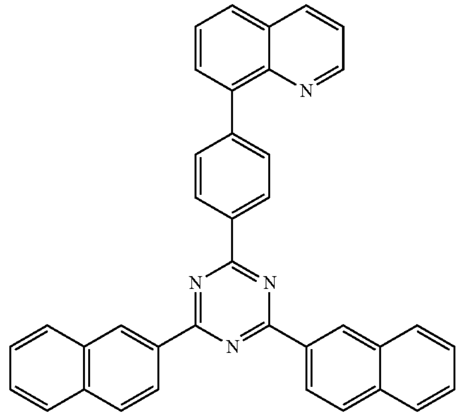
ET4
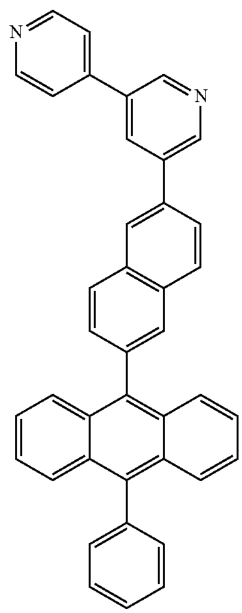
ET5
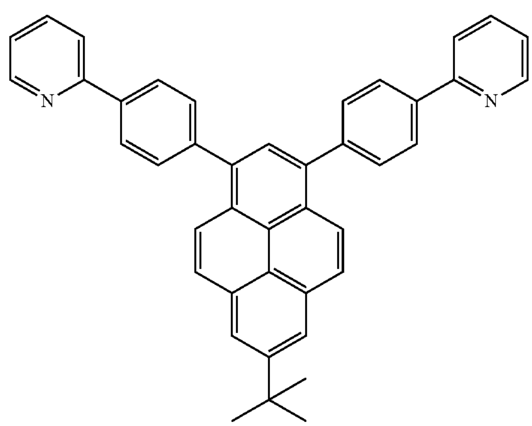

-continued
ET6
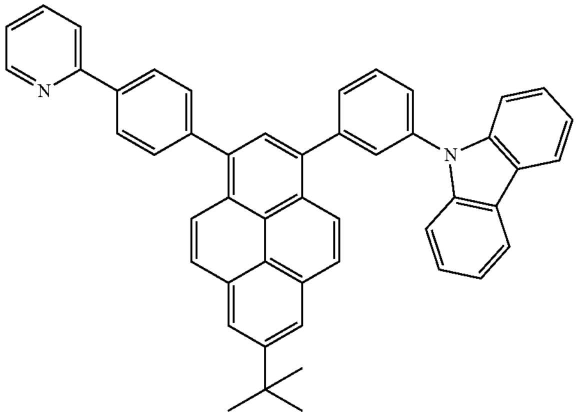
ET7
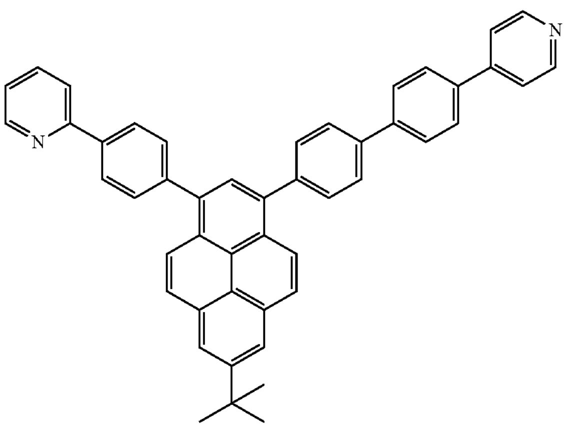
ET8
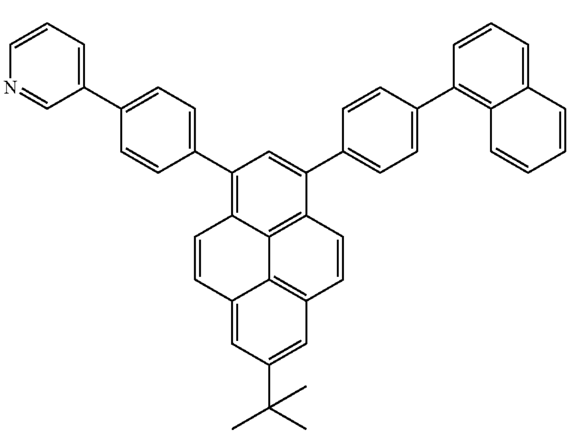
-continued
ET9
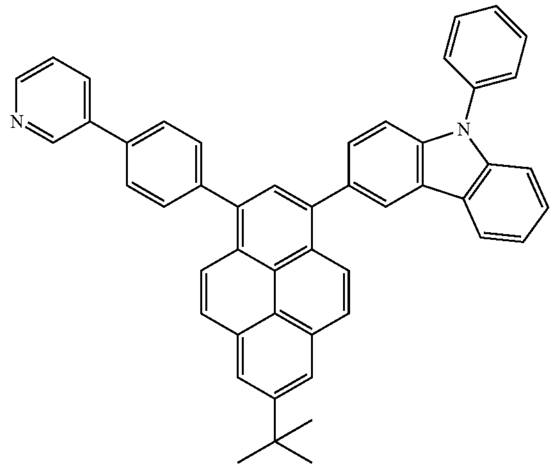
ET10
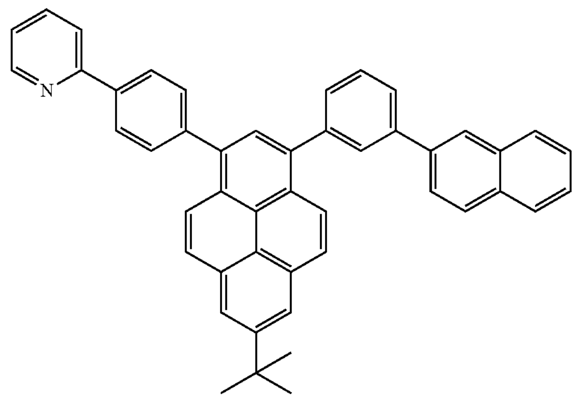
ET11
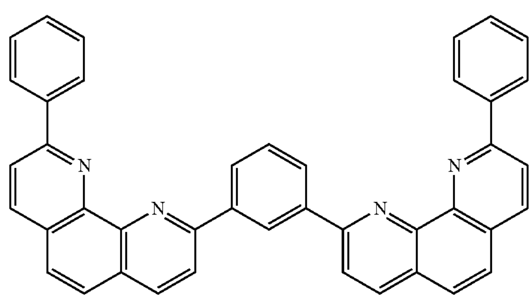
ET12
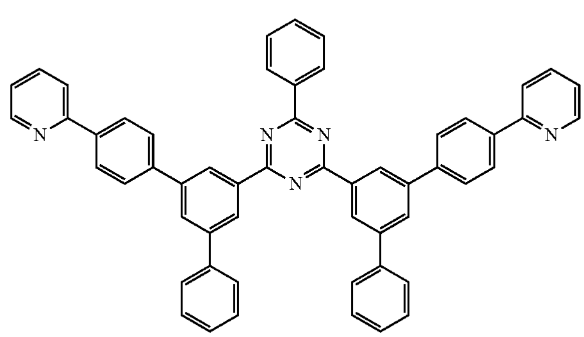

-continued
ET13
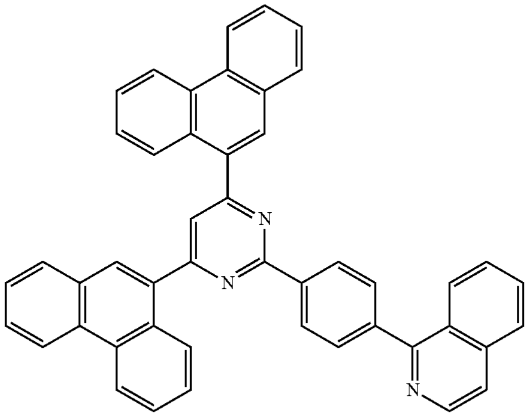
ET14
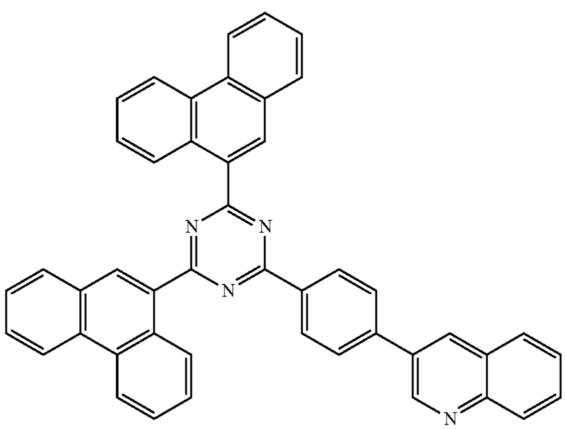
ET15
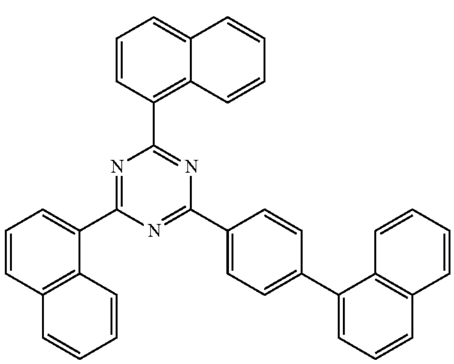
-continued
ET16
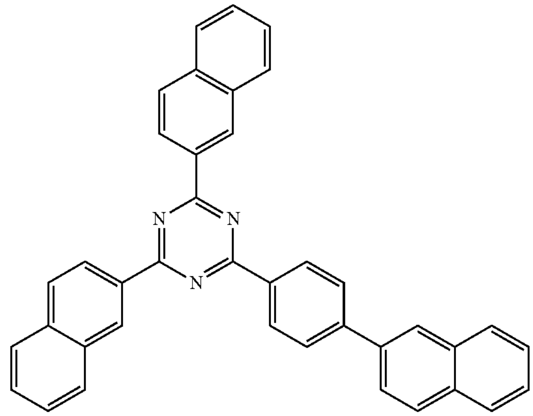
ET17
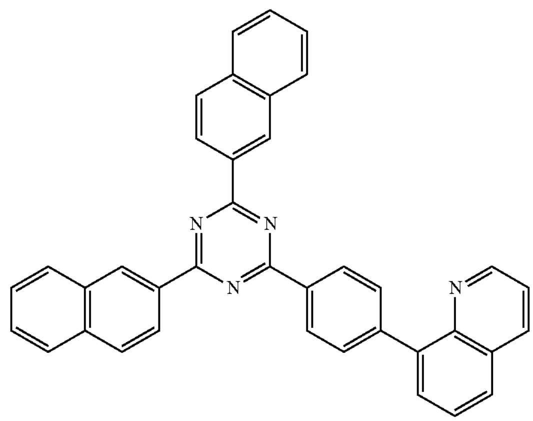
ET18
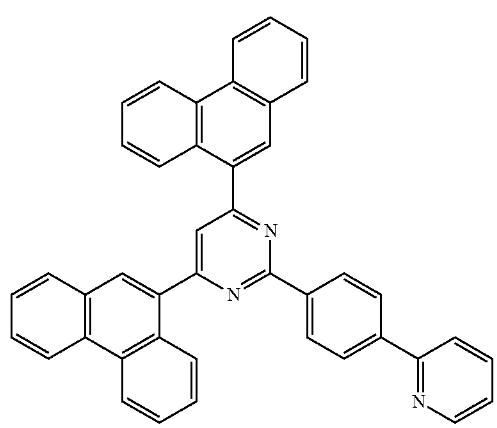

-continued
ET19
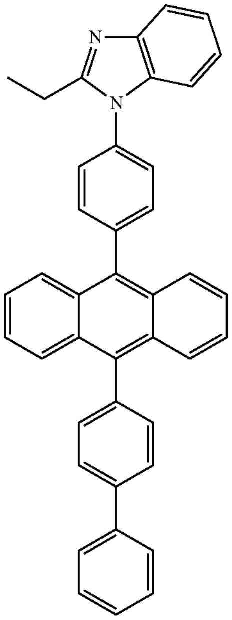
ET20
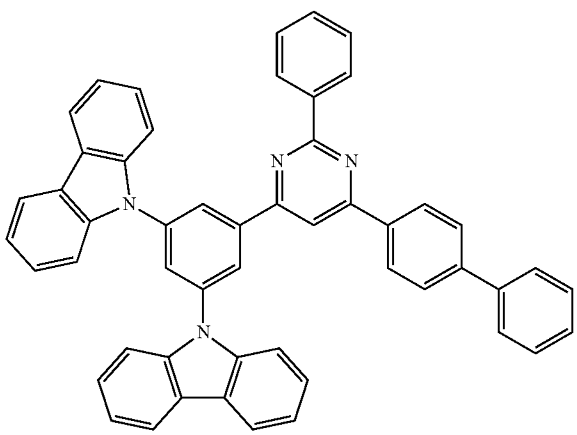
ET21
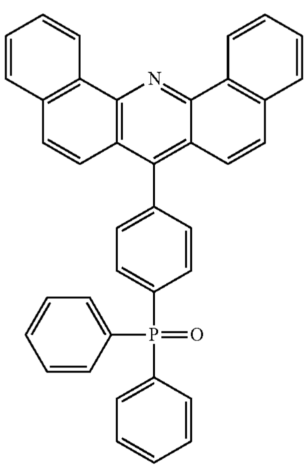
-continued
ET22
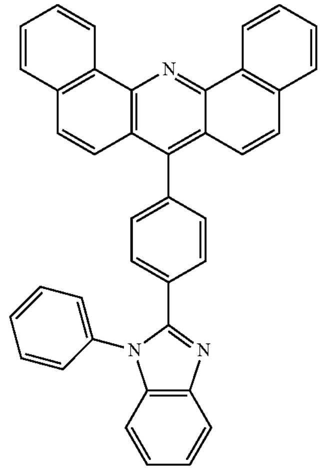
ET23
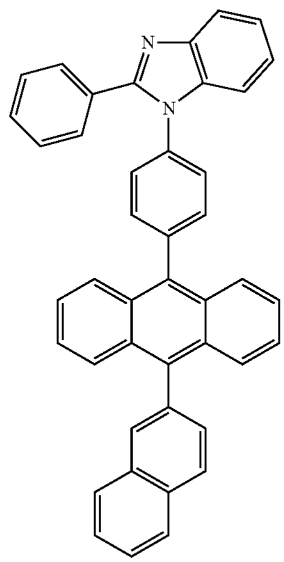
ET24
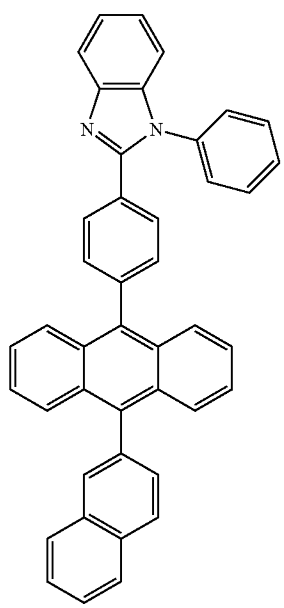

-continued

ET25

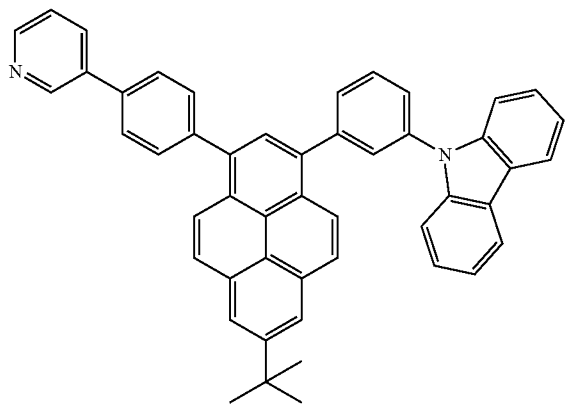

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 or ET-D2:

ET-D1

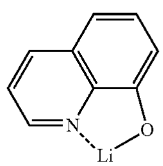

ET-D2

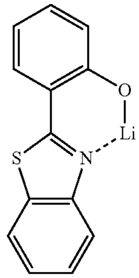

The electron transport region may include an electron injection layer (EIL) that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

Another aspect provides a diagnostic composition including at least one organometallic compound represented by Formula 1.

The organometallic compound represented by Formula 1 provides high emission efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and the $C_3$-$C_{10}$ cycloalkylene group is a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, a bicyclo[2.2.2]octyl group, and the like.

The term "$C_1$-$C_{10}$ heterocycloalkyl group" as used herein refers to a monocyclic group that includes at least one N, O, P, Si, B, Se, Ge, S, or any combination thereof as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, B, Se, Ge, S, or any combination thereof as a ring-forming atom, 2 to 10 carbon atoms, and at least one carbon-carbon double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having at least one N, O, P, Si, B, Se, Ge, S, or any combination thereof as a ring-forming atom and a cyclic aromatic system having 1 to 60 carbon atoms, and the term "$C_1$-$C_{60}$ heteroarylene group" as used herein refers to a divalent group having at least one N, O, P, Si, B, Se, Ge, S, or any combination thereof as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, N, O, P, Si, B, Se, Ge, S, or any combination thereof, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{1a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, a fluorene group (each unsubstituted or substituted with at least one $R_{1a}$).

The term "$C_1$-$C_{30}$ heterocyclic group" as used herein refers to a saturated or unsaturated cyclic group having, as a ring-forming atom, at least one N, O, P, Si, Se, Ge, B, S, or any combination thereof other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{1a}$)" may be, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{1a}$).

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include 13 $CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one carbon ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof.

$Q_1$ to $Q_9$, $Q_{11}$ to $Q_{19}$, $Q_{21}$ to $Q_{29}$ and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 2)

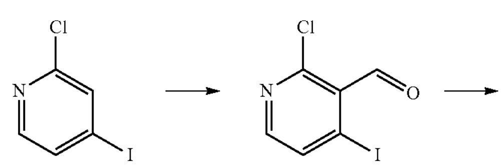

L2-4

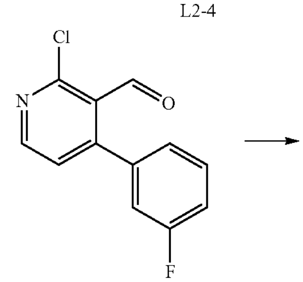

L2-3

-continued

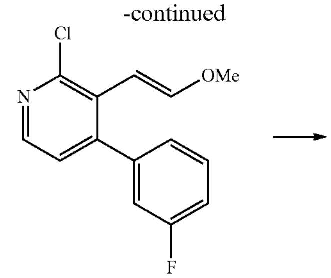

L2-2

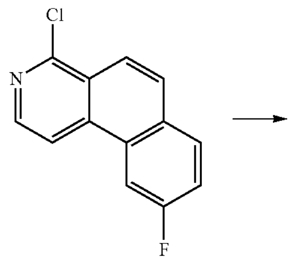

L2-1

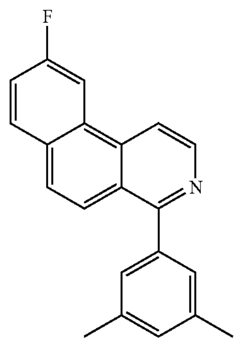

L2

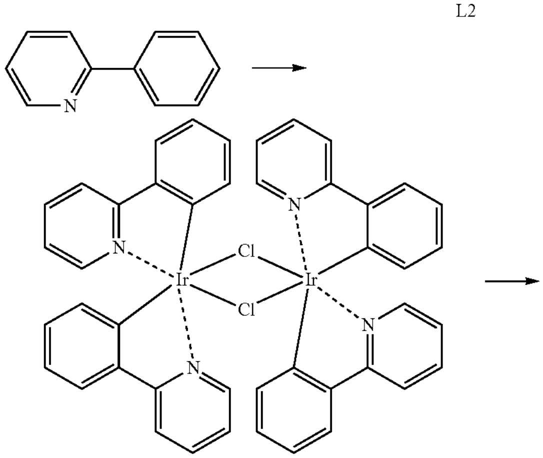

2-2

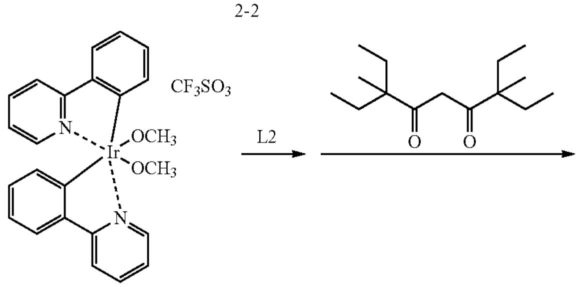

2-1

-continued

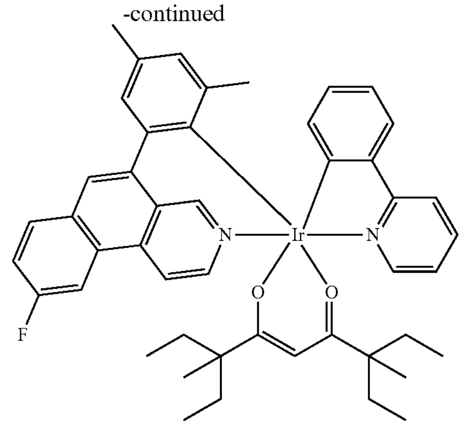

2

Synthesis of Intermediate L2-4

5 g (20.9 mmol) of 2-chloro-4-iodopyridine was dissolved in 50 ml of anhydrous tetrahydrofuran (THF), and 12.5 ml (25 mmol) of 2.0 M lithium diisopropylamide (in THF) was slowly added dropwise thereto at a temperature of −78° C. After about 3 hours, 2.5 ml (32 mmol) of ethylformate was slowly added dropwise thereto, followed by stirring at room temperature for 18 hours. When the reaction was completed, water and ethyl acetate were added to the reaction mixture and an extraction process was performed thereon, and the obtained organic layer was dried using magnesium sulfate and distilled under reduced pressure. The resultant was purified by liquid chromatography to obtain 2.2 g of Intermediate L2-4 (Yield of 40%).

Synthesis of Intermediate L2-3

1.9 g (7.2 mmol) of Intermediate L2-4 was dissolved in 60 ml of acetonitrile and 15 ml of water, and then, 0.4 g (0.5 mmol) of $PdCl_2(PPh_3)2$, 1.0 g (7.2 mmol) of 3-fluorophenylboronic acid, 2.5 g (18.0 mmol) of $K_2CO_3$ were added thereto and refluxed while heating at a temperature of 80° C. for 18 hours. When the reaction was completed, the reaction mixture was concentrated under reduced pressure, dichloromethane and water were added thereto, followed by extraction, and the obtained organic layer was dried using magnesium sulfate and distilled under reduced pressure. The resultant was purified by liquid chromatography to obtain 1.4 g of Intermediate L2-3 (Yield of 78%).

Synthesis of Intermediate L2-2

5.4 g (15.8 mmol) of (methoxymethyl)triphenylphosphonium chloride was dissolved in 50 ml of anhydrous ether, and then, 16 ml of 1.0 M potassium tert-butoxide solution was added dropwise thereto. After stirring at room temperature for about 1 hour, 1.5 g (6.3 mmol) of Intermediate L2-3 dissolved in 30 ml of anhydrous THF was slowly added dropwise thereto and stirred at room temperature for 18 hours. When the reaction was completed, water and ethyl acetate were added to the reaction mixture and an extraction process was performed thereon, and the obtained organic layer was dried using magnesium sulfate and distilled under reduced pressure. The resultant was purified by liquid chromatography to obtain 1.6 g of Intermediate L2-2 (Yield of 95%).

Synthesis of Intermediate L2-1

1.4 g (5.1 mmol) of Intermediate L2-2 was dissolved in 40 ml of dichloromethane, and 3.0 ml of methanesulfonic acid was slowly added dropwise thereto, followed by stirring at room temperature for about 18 hours. After the reaction was completed, an extraction process was performed thereon after adding a saturated aqueous hydrogen carbonate solution thereto, and the obtained organic layer was dried using magnesium sulfate and distilled under reduced pressure. The resultant was purified by liquid chromatography to obtain 1.0 g of Intermediate L2-1 (Yield of 90%).

Synthesis of Intermediate L2

1.0 g (4.1 mmol) of Intermediate L2-1 was dissolved in 40 ml of THF and 10 ml of water, and then, 0.9 g (6.2 mmol) of 3,5-dimethylphenylboronic acid, 0.09 g (0.4 mmol) of $Pd(OAc)_2$, and 0.35 g (0.82 mmol) of Sphos, 1.4 g (10.3 mmol) of $K_2CO_3$ was added thereto, followed by refluxing while heating for one day. After the reaction was completed, an extraction process was performed thereon after adding ethyl acetate and water thereto, and the obtained organic layer was dried using magnesium sulfate and distilled under reduced pressure. The resultant was purified by liquid chromatography to obtain 1.1 g of Intermediate L2 (Yield of 85%).

Synthesis of Intermediate 2-2

40 mL of ethoxyethanol and 15 mL of distilled water were mixed with 1.2 g (3.4 mmol) of 2-phenylpyridine and 0.6 g (1.6 mmol) of iridium chloride, followed by refluxing while heating for 24 hours. After the reaction was completed, the temperature was lowered to room temperature, and the solid produced therefrom was filtered and washed sufficiently in the order of water/methanol/hexane. The obtained solid was dried in a vacuum oven to obtain 1.1 g of Intermediate 2-2.

Synthesis of Intermediate 2-1

1.1 g (1 mmol) of Intermediate 2-2 was dissolved in 21 mL of dichloromethane and 0.5 g (2 mmol) of silver trifluoromethanesulfonate dissolved in 7 mL of methanol was added dropwise thereto. The light was blocked with aluminum foil and stirring was performed at room temperature for 18 hours. Solid was filtered with celite and washed with dichloromethane. The filtrate was placed under reduced pressure to obtain 1.2 g of Intermediate 2-1.

Synthesis of Compound 2

1.2 g (1.7 mmol) of Intermediate 2-1 and 1.0 g (3.4 mmol) of Intermediate L2 were dissolved in 70 mL of diethylene glycol dimethyl ether. The mixture was stirred under nitrogen at a temperature of 160° C. for 6 hours. After confirming that the color of the mixture turned into dark red, the temperature was lowered to 120° C., and 3,7-diethyl-3,7-dimethylnonane-4,6-dione 2.0 g (8.5 mmol) was added thereto and stirred for 2 hours to proceed the reaction. After the reaction was completed, the temperature was lowered to room temperature, and the solid produced therefrom was filtered and purified by liquid chromatography to obtain 0.3 g of Compound 2 (Yield of 20%).

$C_{47}H_{60}FIrN_2O_2Pt$: $M^+$886.35

Synthesis Example 2 (Compound 6)

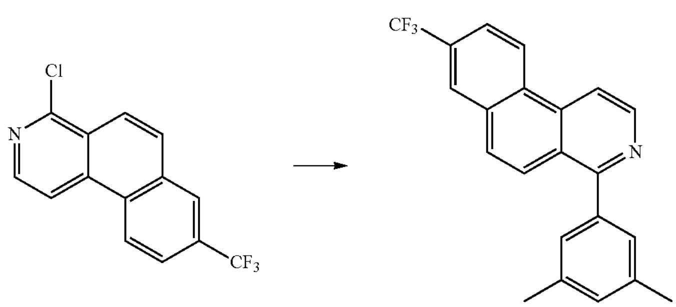

L6-1 L6

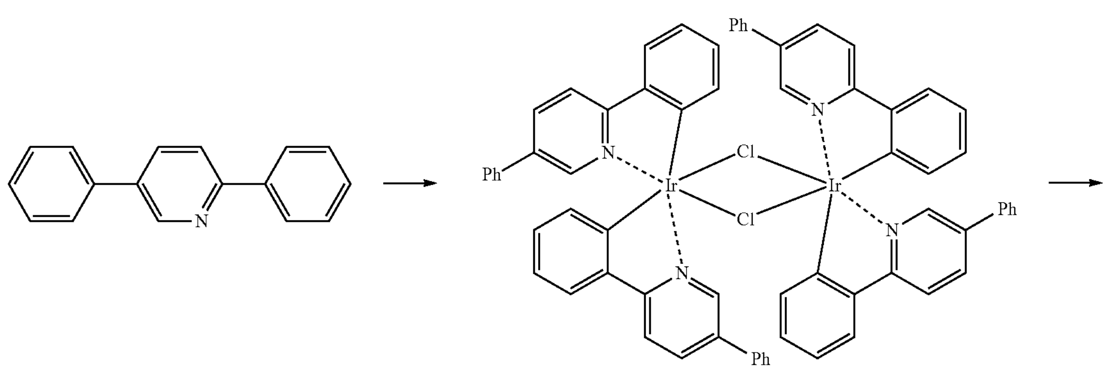

6-2

-continued

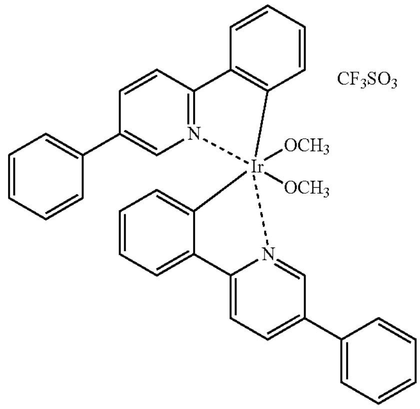

6-1

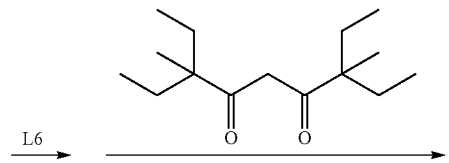

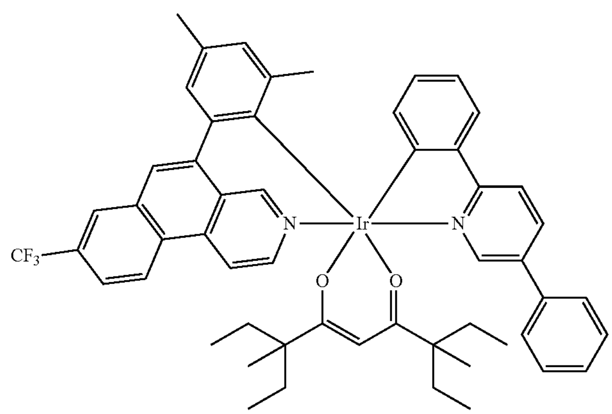

6

Synthesis of Intermediate L6

1 g of Intermediate L6 (Yield of 87%) was obtained in the same manner as used to synthesize Intermediate L2 in Synthesis Example 1, except that Intermediate L6-1 was used instead of Intermediate L2-1

Synthesis of Intermediate 6-2

1.2 g of Intermediate 6-2 was obtained in the same manner as used to synthesize Intermediate 2-2 in Synthesis Example 1, except that 2,5-diphenylpyridine was used instead of 2-phenylpyridine.

Synthesis of Intermediate 6-1

1.3 g of Intermediate 6-1 was obtained in the same manner as used to synthesize Intermediate 2-1 in Synthesis Example 1, except that Intermediate 6-2 was used instead of Intermediate 2-2.

Synthesis of Compound 6

0.3 g of Compound 6 (Yield of 22%) was obtained in the same manner as used to synthesize Compound 2 in Synthesis Example 1, except that Intermediate 6-1 and Intermediate L6 were respectively used instead of Intermediate 2-1 and Intermediate L2.

$C_{54}H_{54}F_3IrN_2O_2$: $M^+$1012.38

Synthesis Example 3 (Compound 24)
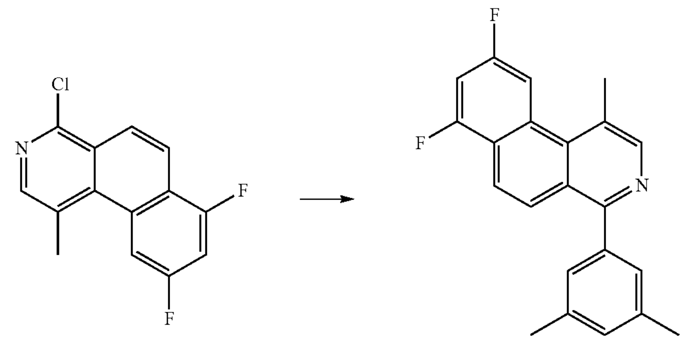
L24-1 L24
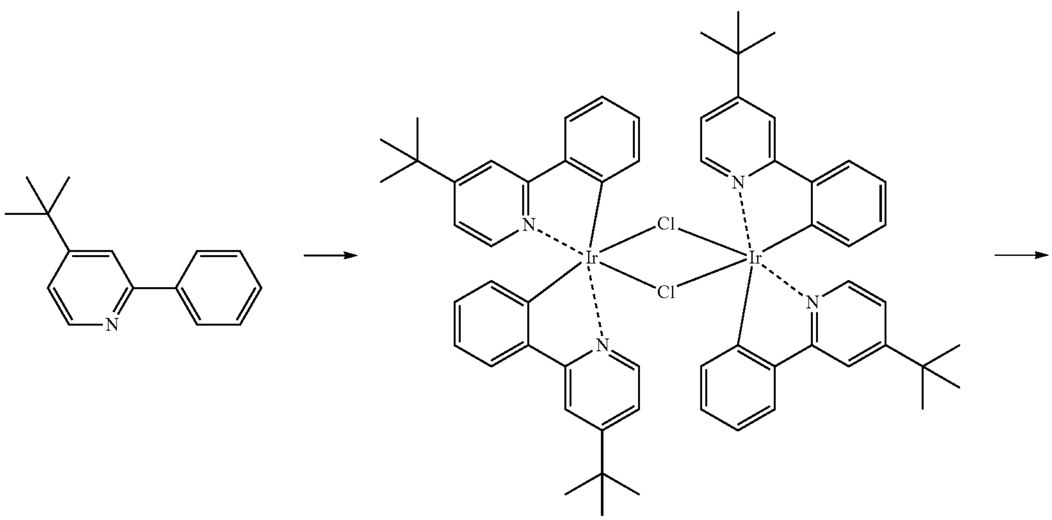
24-2
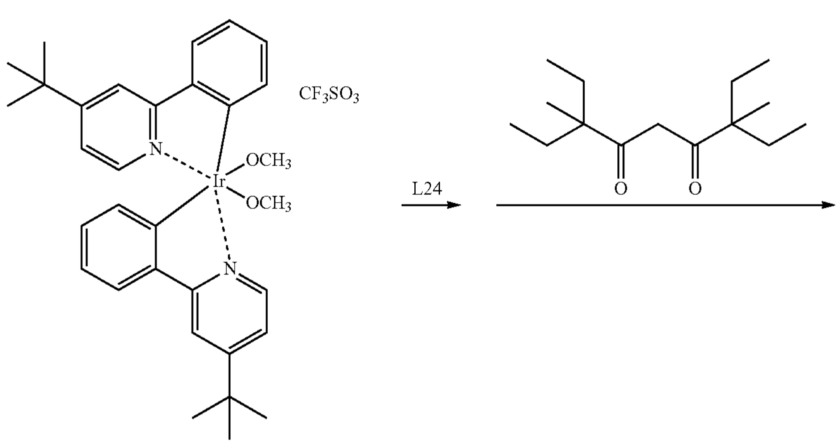
24-1

-continued

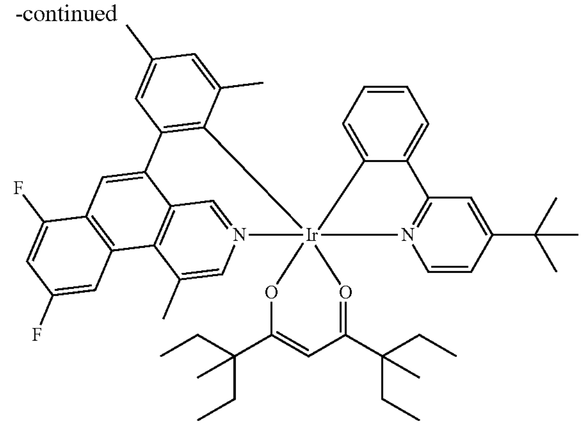

24

Synthesis of Intermediate L24

0.8 g of Intermediate L24 (Yield of 82%) was obtained in the same manner as used to synthesize Intermediate L2 in Synthesis Example 1, except that Intermediate L24-1 was used instead of Intermediate L2-1.

Synthesis of Intermediate 24-2

1.1 g of Intermediate 24-2 was obtained in the same manner as used to synthesize Intermediate 2-2 in Synthesis Example 1, except that 4-tert-butyl-2-phenylpyridine was used instead of 2-phenylpyridine.

Synthesis of Intermediate 24-1

1.2 g of Intermediate 24-1 was obtained in the same manner as used to synthesize Intermediate 2-1 in Synthesis Example 1, except that Intermediate 24-2 was used instead of Intermediate 2-2.

Synthesis of Compound 24

0.4 g of Compound 24 (Yield of 25%) was obtained in the same manner as used to synthesize Compound 2 in Synthesis Example 1, except that Intermediate 24-1 and Intermediate L24 were respectively used instead of Intermediate 2-1 and Intermediate L2.

$C_{54}H_{65}IrN_2O_2$: $M^+$ 966.47

Example 1

As an anode, an ITO-patterned glass substrate was cut to a size of 50 mm×50 mm×0.5 mm, sonicated with isopropyl alcohol and pure water, each for 5 minutes, and then cleaned by exposure to ultraviolet rays and ozone for 30 minutes. Then, the ITO-patterned glass substrate was provided to a vacuum deposition apparatus.

HT3 and F6TCNNQ were vacuum-codeposited on the ITO anode at the weight ratio of 98:2 to form a hole injection layer having a thickness of 100 Å, and HT3 was vacuum-deposited on the hole injection layer to form a hole transport layer having a thickness of 1350 Å, and then, HT21 was vacuum-deposited on the hole transport layer to form an electron blocking layer having a thickness of 300 Å.

Then, H52 (host) and Compound 2 (dopant) were co-deposited at the weight ratio of 98:2 on the electron blocking layer to form an emission layer having a thickness of 400 Å.

Then, ET3 and ET-D1 were co-deposited at the volume ratio of 50:50 on the emission layer to form an electron transport layer having a thickness of 350 Å, and ET-D1 was vacuum-deposited on the electron transport layer to form an electron injection layer having a thickness of 10 Å, and Al was vacuum-deposited on the electron injection layer to form a cathode having a thickness of 1000 Å, thereby completing the manufacture of an organic light-emitting device having the ITO (1500 Å)/HT3+F6TCNNQ (2 wt %) (100 Å)/HT3 (1350 Å)/HT21 (300 Å)/H52+Compound 2 (2 wt %) (400 Å)/ET3+ET-D1 (50%) (350 Å)/ET-D1 (10 Å)/Al(1000 Å) structure.

HT3

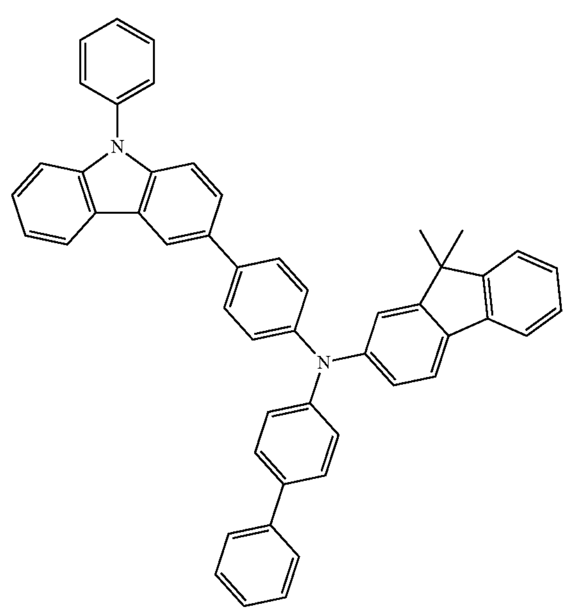

-continued

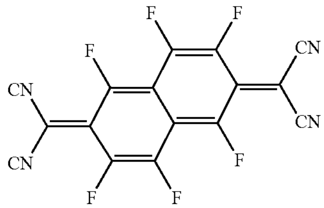

F6-TCNNQ

HT21

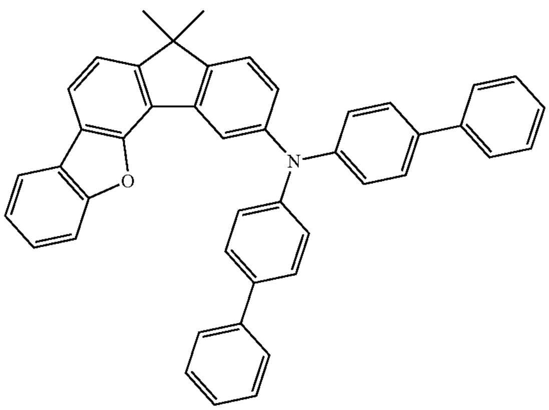

H52

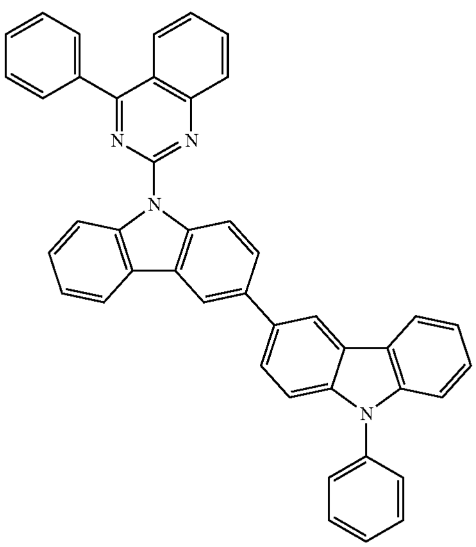

ET3

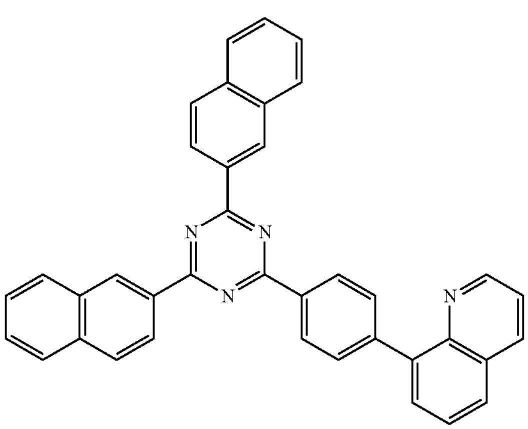

-continued

ET-D1

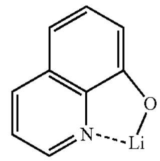

Examples 2 to 3 and Comparative Examples A, A1, B1, and C1

Organic light-emitting devices were manufactured in the same manner as in Example 1, except that in forming an emission layer, for use as a dopant, corresponding compounds shown in Table 1 were used instead of Compound 2.

Evaluation Example 1: Characterization of Organic Light Emitting Device

The driving voltage, current density, external quantum luminescence efficiency (EQE), FWHM of the emission peak in the EL spectrum, emission color, and lifespan ($LT_{97}$) of the organic light-emitting devices manufactured according to Examples 1 to 3 and Comparative Examples A, A1, B1, and C1 were evaluated, and results thereof are shown in Table 1. As an evaluation device, a current-voltmeter (Keithley 2400) and luminance meter (Minolta Cs-1000A) were used, and the lifespan ($LT_{97}$) (at 3500 nit) was evaluated as the time taken for luminance to reduce to 97% of 100% of the initial luminance. Lifespan ($LT_{97}$) of Table 1 was represented as a relative value (%).

TABLE 1

| | Dopant Compound No. | Driving Voltage Voltage (V) | Current density (mA/cm$^2$) | Max EQE (%) | FWHM (nm) | Emission color | $LT_{97}$ (Relative value, %) |
|---|---|---|---|---|---|---|---|
| Example 1 | 2 | 4.2 | 10 | 28 | 53 | 620 | 180 |
| Example 2 | 6 | 4.3 | 10 | 26 | 52 | 623 | 165 |
| Example 3 | 24 | 4.2 | 10 | 27 | 51 | 627 | 170 |
| Comparative Example A | A | 4.5 | 10 | 20 | 60 | 640 | 120 |
| Comparative Example A1 | A1 | 4.5 | 10 | 25 | 76 | 614 | 90 |
| Comparative Example B1 | B1 | 4.7 | 10 | 22 | 78 | 605 | 95 |
| Comparative Example C1 | C1 | 4.4 | 10 | 24 | 65 | 631 | 70 |

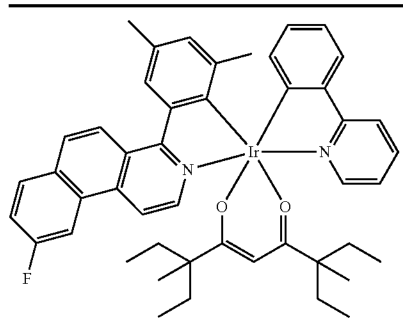

2

TABLE 1-continued

| Dopant Compound No. | Driving Voltage Voltage (V) | Current density (mA/cm$^2$) | Max EQE (%) | FWHM (nm) | Emission color | LT$_{97}$ (Relative value, %) |
|---|---|---|---|---|---|---|

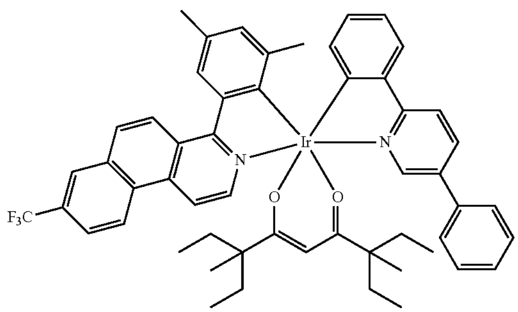

6

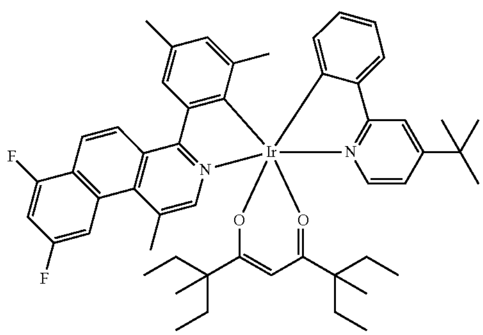

24

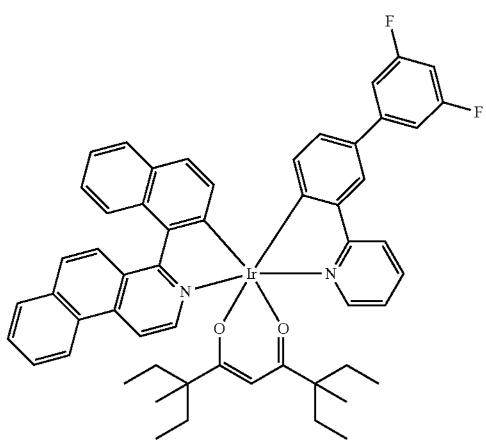

A

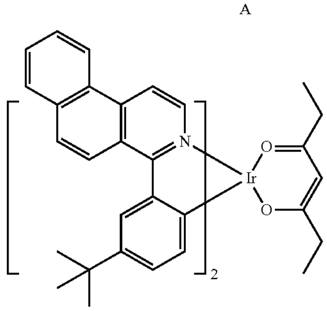

A1

TABLE 1-continued

| Dopant Compound No. | Driving Voltage Voltage (V) | Current density (mA/cm$^2$) | Max EQE (%) | FWHM (nm) | Emission color | LT$_{97}$ (Relative value, %) |
|---|---|---|---|---|---|---|

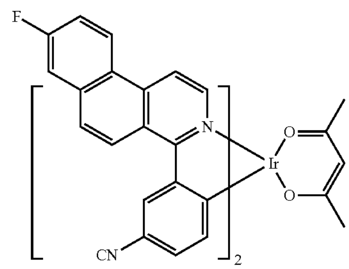

B1

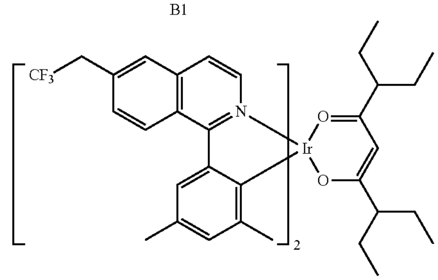

C1

From Table 1, it can be seen that the organic light-emitting devices of Examples 1 to 3, compared to the organic light-emitting devices of Comparative Examples A, A1, B1, and C1, have improved driving voltage, improved external quantum luminescence efficiency (EQE), small FWHM of emission peak of EL spectrum, and improved lifespan (LT$_{97}$) characteristics.

The organometallic compound has excellent electrical characteristics and stability. Accordingly, an electronic device, for example, an organic light-emitting device, using the organometallic compound may have improved driving voltage, improved external quantum efficiency, relatively narrow FWHM of the emission peak of the EL spectrum and improved lifespan characteristics. Therefore, the use of the organometallic compound may enable the embodiment of a high-quality organic light-emitting device and an electron device including the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$Ir(L_1)(L_2)(L_3) \qquad \text{Formula 1}$$

wherein, in Formula 1, $L_1$ is a ligand represented by Formula 1-1, $L_2$ is a ligand represented by Formula 1-2, $L_3$ is a ligand represented by Formula 1-3, and $L_1$ and $L_2$ are different from each other:

Formula 1-1

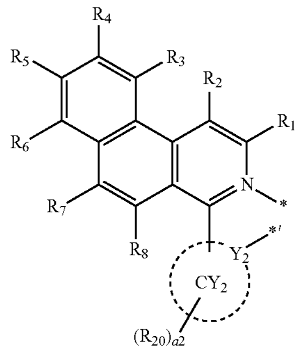

Formula 1-2

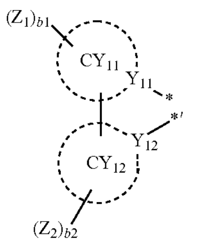

Formula 1-3

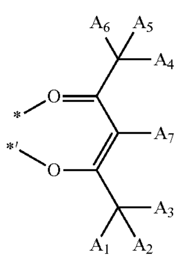

wherein, in Formulae 1-1 to 1-3, $Y_2$ is C, $Y_{11}$ and $Y_{12}$ are each independently C or N, ring $CY_2$, ring $CY_{11}$, and ring $CY_{12}$ are each independently a $C_5$-$C_{30}$ carbocyclic group or a $C_1$-$C_{30}$ heterocyclic group, $R_1$ to $R_8$, $R_{20}$, $Z_1$, $Z_2$, and $A_1$ to $A_7$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a2, b1, and b2 are each independently an integer from 0 to 20, wherein, when a2 is 2 or more, two or more of $R_{20}$(s) are identical to or different from each other, when b1 is 2 or more, two or more of $Z_1$(s) are identical to or different from each other, and when b2 is 2 or more, two or more of $Z_2$(s) are identical to or different from each other, at least one of $R_1$ to $R_8$ and/or at least one of $R_{20}$(s) in the number of a2 is a fluoro group (—F) or a fluorinated group, two or more of $R_1$ to $R_8$ are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $R_{20}$(s) in the number of a2 are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $Z_1$(s) in the number of b1 are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $Z_2$(s) in the number of b2 are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $A_1$ to $A_7$ are optionally linked together to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$,

* and *' each indicate a binding site to Ir in Formula 1, $R_{1a}$ is the same as described in connection with $A_7$, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is independently:

deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or a monovalent non-aromatic condensed heteropolycyclic group, each unsubstituted or substituted with deuterium, —F, —Cl, —Br, —I, -$CD_3$, -$CD_2$H, -$CDH_2$, —$CF_3$, —$CF_2$H, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$);

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$) or —P($Q_{38}$)($Q_{39}$); or any combination thereof, wherein $Q_1$ to $Q_9$, $Q_{11}$ to $Q_{19}$, $Q_{21}$ to $Q_{29}$ and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof, a phosphoric acid group or a salt thereof, a $C_1$-$C_{60}$ alkyl group which is unsubstituted or substituted with deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; or a $C_6$-$C_{60}$ aryl group which is unsubstituted or substituted with deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, wherein the group represented by

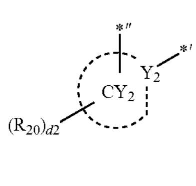

in Formula 1-1 is represented by one of Formulae A(1) to A(10):

A(1)

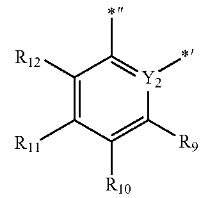

A(2)

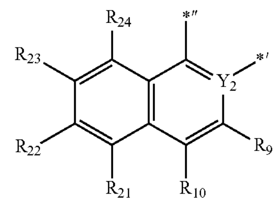

A(3)

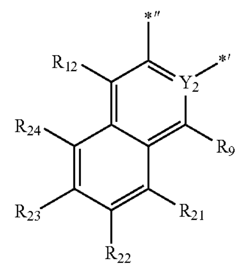

A(4)

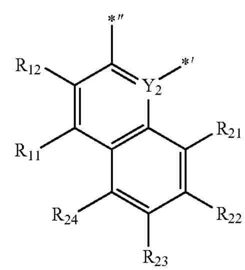

A(5)

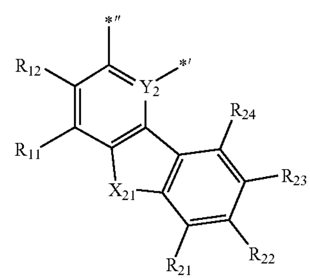

A(6)

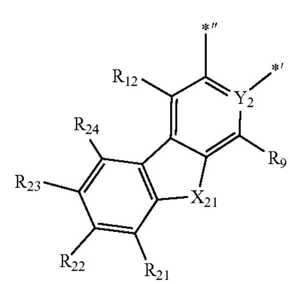

-continued
A(7)
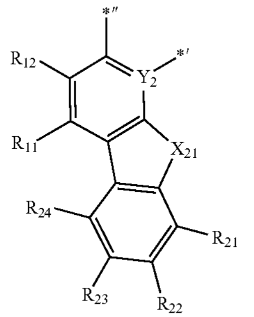
A(8)
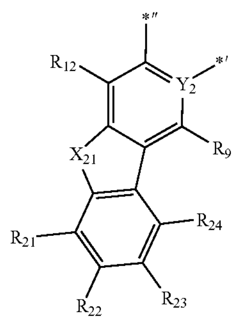
A(9)
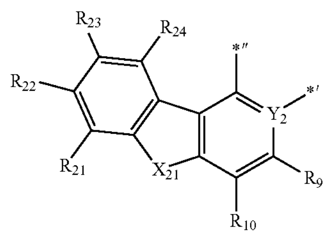
A(10)
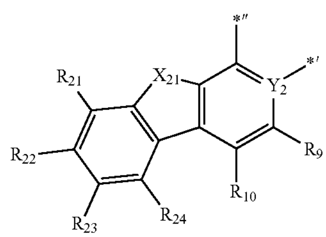
wherein, in Formulae A(1) to A(10),
$Y_2$ is C,
$X_{21}$ is O, S, $N(R_{25})$, $C(R_{25})(R_{26})$, or $Si(R_{25})(R_{26})$,
$R_9$ to $R_{12}$ and $R_{21}$ to $R_{26}$ are the same as described in connection with $R_{20}$,
*' is a binding site to Ir in Formula 1, and
*" is a binding site to a neighboring atom in Formula 1-1,
wherein the group represented by
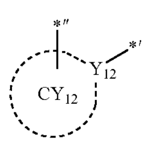
in Formula 1-2 is a group represented by one of Formulae CY12-1 to CY12-22:
CY12-1
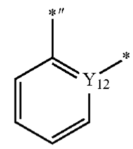
CY12-2
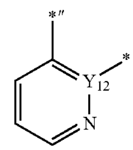
CY12-3
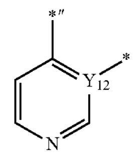
CY12-4
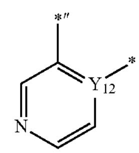
CY12-5
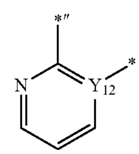
CY12-6
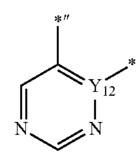
CY12-7
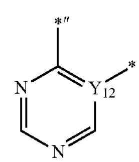
CY12-8
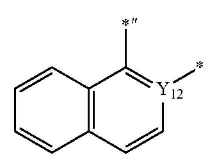
CY12-9
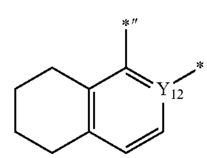
CY12-10
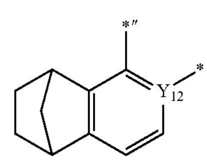

-continued

CY12-11

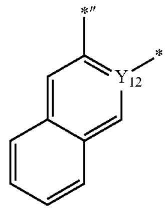

CY12-12

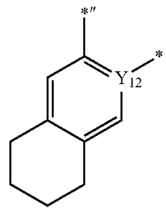

CY12-13

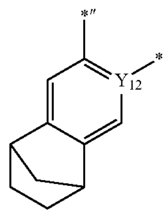

CY12-14

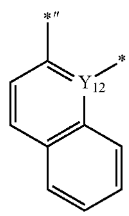

CY12-15

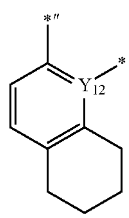

CY12-16

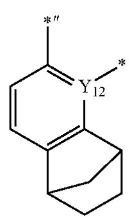

CY12-17

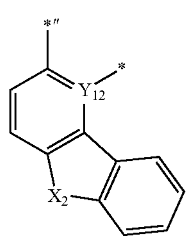

-continued

CY12-18

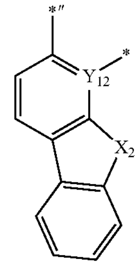

CY12-19

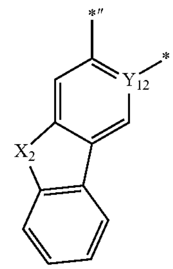

CY12-20

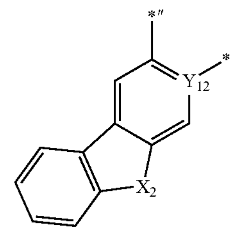

CY12-21

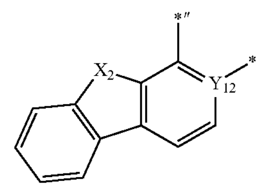

CY12-22

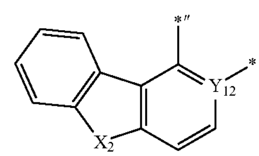

wherein, in Formulae Formulae CY12-1 to CY12-22, $Y_{12}$ is C, $X_2$ is O, S, $N(Z_{25})$, $C(Z_{25})(Z_{26})$, or $Si(Z_{25})(Z_{26})$, $Z_{25}$ and $R_{26}$ are the same as described in connection with $Z_2$,

* and *' each indicate a binding site to Ir in Formula 1, and each *" indicates a binding site to a neighboring atom.

2. The organometallic compound of claim 1, wherein ring $CY_2$, ring $CY_{11}$, and ring $CY_{12}$ in Formulae 1-1 and 1-2 are each independently a benzene group, a naphthalene group, a 1,2,3,4-tetrahydronaphthalene group, a thiophene group, a furan group, a pyrrole group, cyclopentadiene group, a silole group, a benzothiophene group, a benzofuran group, an indole group, an indene group, a benzosilole group, a dibenzothiophene group, a dibenzofuran group, a carbazole group, a fluorene group, a dibenzosilole group, a pyridine group condensed with a cyclohexane group, a pyridine group condensed with an adamantane group, a benzene group condensed with an adamantane group, a benzene group condensed with a pyridine group, a benzene group condensed with a quinoline group, or a benzene group condensed with an isoquinoline group.

3. The organometallic compound of claim 1, wherein $R_1$ to $R_8$, $R_{20}$, $Z_1$, $Z_2$ and $A_1$ to $A_7$ in Formulae 1-1 to 1-3 are each independently hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted phenyl group, a substituted or unsubstituted biphenyl group, —Si($Q_3$)($Q_4$)($Q_5$), or —Ge($Q_3$)($Q_4$)($Q_5$), wherein a substituent of the substituted $C_1$-$C_{20}$ alkyl group, the substituted $C_3$-$C_{10}$ cycloalkyl group, the substituted $C_1$-$C_{10}$ heterocycloalkyl group, the phenyl group and the biphenyl group is:

deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group or a monovalent non-aromatic condensed heteropolycyclic group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), or —P($Q_{28}$)($Q_{29}$); or —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$) or —P($Q_{38}$)($Q_{39}$);

wherein $Q_3$ to $Q_5$, $Q_{11}$ to $Q_{19}$, $Q_{21}$ to $Q_{29}$ and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, or a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group which is unsubstituted or substituted with deuterium, a $C_1$-$C_{60}$ alkyl group, or a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

4. The organometallic compound of claim 1, wherein $R_1$ to $R_8$ and $A_7$ in Formulae 1-1 and 1-3 are each independently:

hydrogen, deuterium, or —F;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated biphenyl group, a fluorinated biphenyl group, or a ($C_1$-$C_{20}$ alkyl)biphenyl group; or —Si($Q_3$)($Q_4$)($Q_5$) or —Ge($Q_3$)($Q_4$)($Q_5$), $R_{20}$, $Z_1$ and $Z_2$ in Formulae 1-1 and 1-2 are each independently:

hydrogen or deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each substituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, or a ($C_1$-$C_{20}$ alkyl)biphenyl group; or —Si($Q_3$)($Q_4$)($Q_5$) or —Ge($Q_3$)($Q_4$)($Q_5$).

5. The organometallic compound of claim 1, wherein at least one of $R_4$ to $R_7$ in Formula 1-1 is each independently a fluoro group (—F) or a fluorinated group.

6. The organometallic compound of claim 1, wherein at least one of $R_1$ to $R_8$ in Formula 1-1 is:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, or a fluorinated biphenyl group, each unsubstituted or substituted with deuterium, —F, $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a fluorinated a phenyl group, a ($C_1$-$C_{20}$ alkyl)phenyl group, a biphenyl group, a deuterated biphenyl group, a fluorinated biphenyl group, or a ($C_1$-$C_{20}$ alkyl)biphenyl group.

7. The organometallic compound of claim 1, wherein at least one of $Z_1$ and $Z_2$ of Formula 1-2 is each independently:

deuterium;

a $C_1$-$C_{20}$ alkyl group, a $C_3$-$C_{10}$ cycloalkyl group, a $C_1$-$C_{10}$ heterocycloalkyl group, a phenyl group, or a biphenyl group, each unsubstituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, or a ($C_1$-$C_{20}$ alkyl) biphenyl group, or any combination thereof, or —Si($Q_3$)($Q_4$)($Q_5$) or —Ge($Q_3$)($Q_4$)($Q_5$).

8. The organometallic compound of claim 1, wherein at least one of Condition 1, Condition 2, and Condition 3, or a combination thereof is satisfied:

Condition 1

$A_1$ to $A_6$ of Formula 1-3 are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, Condition 2 at least one of $A_1$ to $A_6$ of Formula 1-3 is a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group, Condition 3

$A_7$ of Formula 1-3 is deuterium, —F, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

9. The organometallic compound of claim 1, wherein at least one of Condition 4 and Condition 5 is satisfied:

Condition 4 two or more of $A_1$ to $A_3$ of Formula 1-3 are linked together so that a group represented by *—C($A_1$)($A_2$)($A_3$) becomes a $C_5$-$C_{30}$ carbocyclic group that is unsubstituted or substituted with at least one $R_{1a}$ or a $C_1$-$C_{30}$ heterocyclic group that is unsubstituted or substituted with at least one $R_{1a}$, and Condition 5 two or more of $A_4$ to $A_6$ of Formula 1-3 are linked together so that a group represented by *—C($A_4$)($A_5$)($A_6$) becomes a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$.

10. The organometallic compound of claim 1, wherein a group represented by

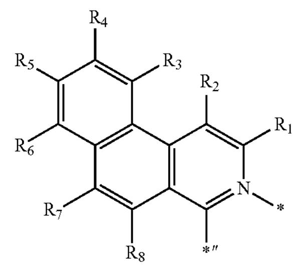

in Formula 1-1 is represented by one of Formulae CY1 to CY112:

CY1

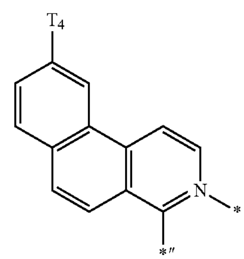

CY2

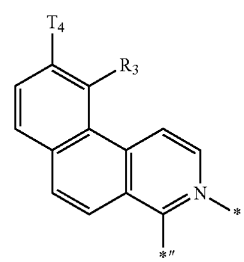

CY3

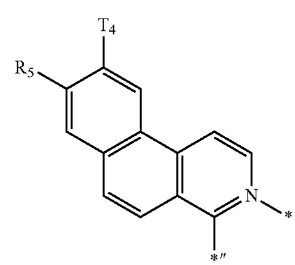

-continued
CY4
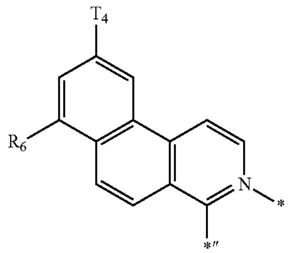
CY5
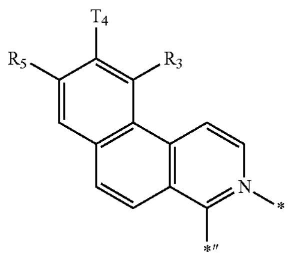
CY6
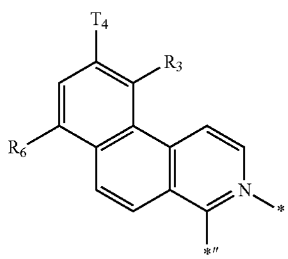
CY7
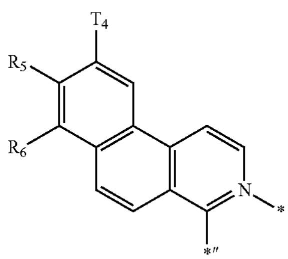
CY8
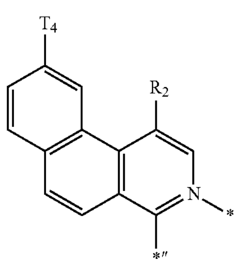
CY9
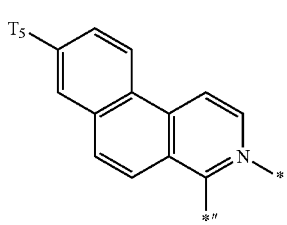
-continued
CY10
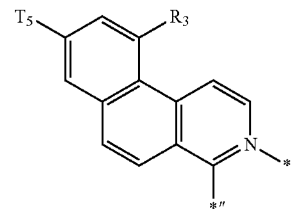
CY11
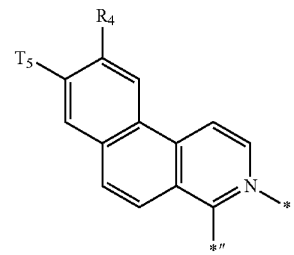
CY12
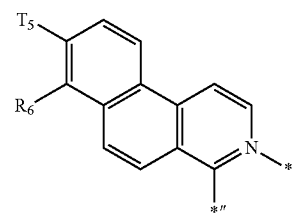
CY13
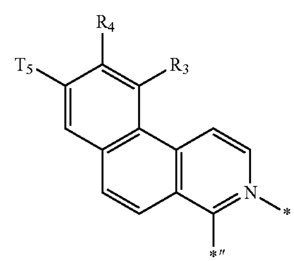
CY14
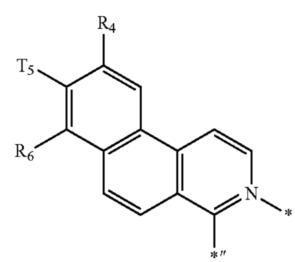
CY15
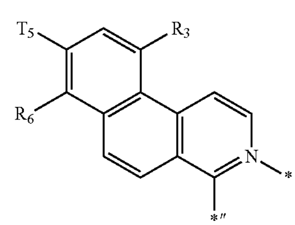

-continued
CY16
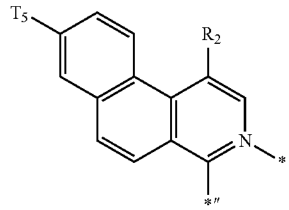
CY17
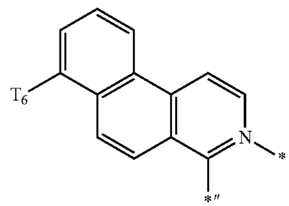
CY18
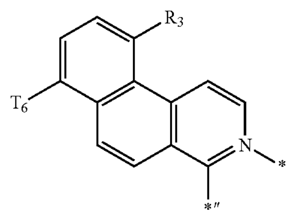
CY19
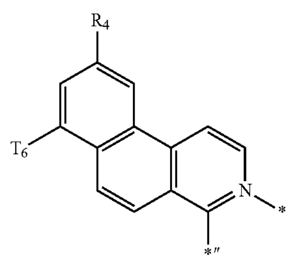
CY20
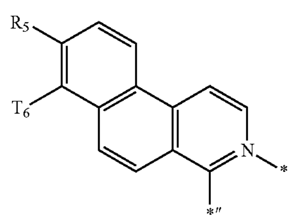
CY21
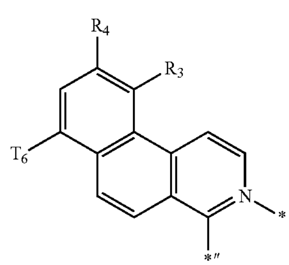
CY22
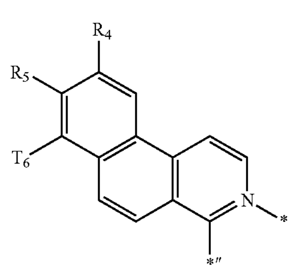
-continued
CY23
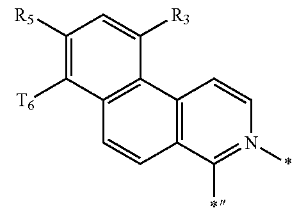
CY24
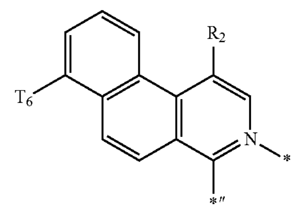
CY25
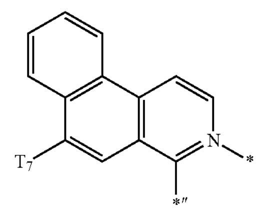
CY26
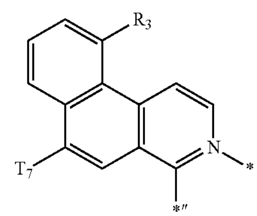
CY27
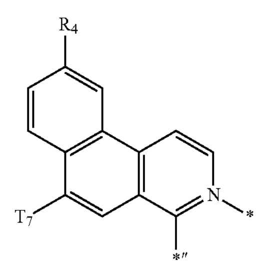
CY28
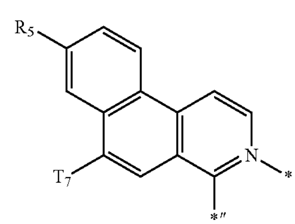
CY29
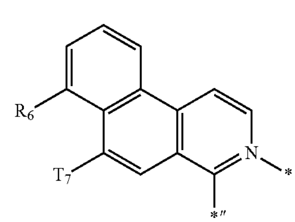

-continued
CY30
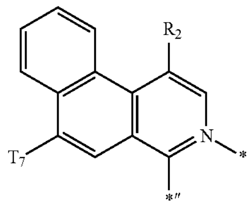
CY31
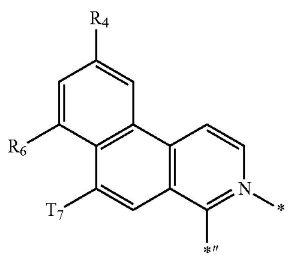
CY32
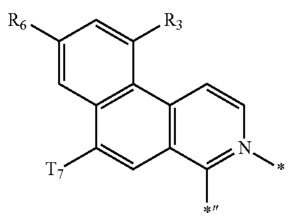
CY33
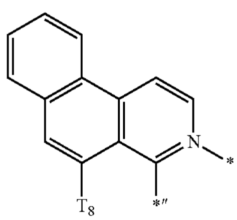
CY34
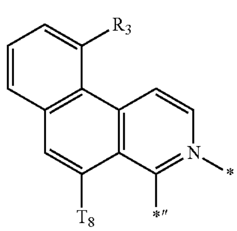
CY35
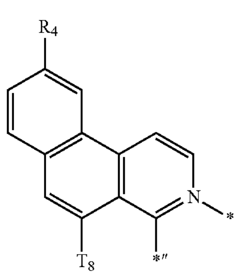
CY36
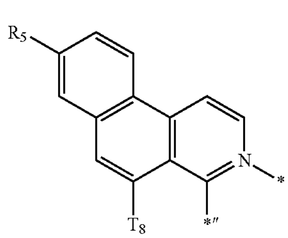
-continued
CY37
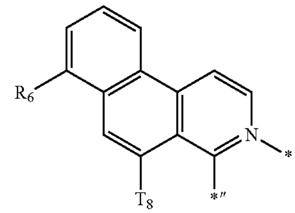
CY38
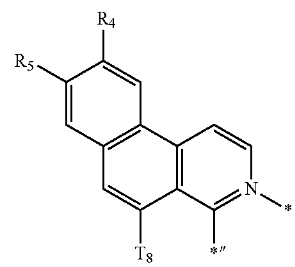
CY39
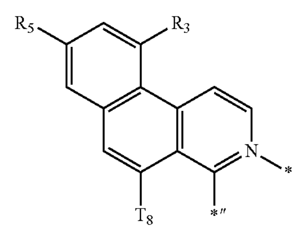
CY40
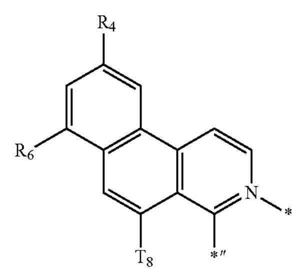
CY41
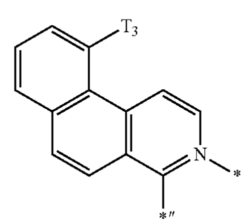
CY42
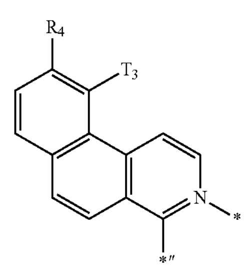

CY43
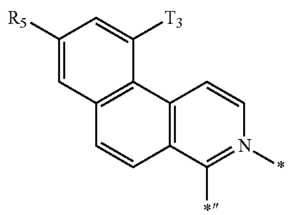
CY44
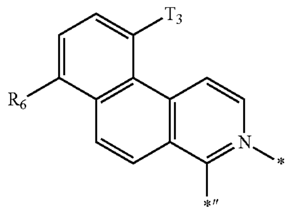
CY45
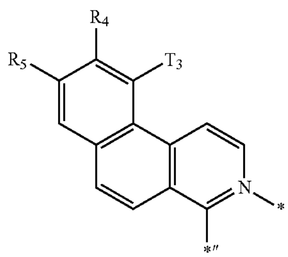
CY46
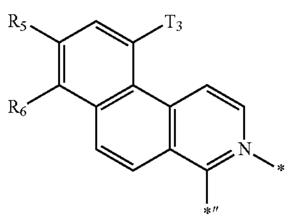
CY47
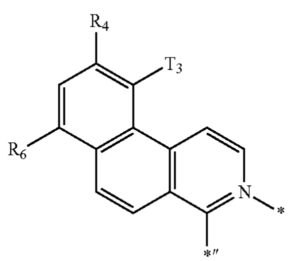
CY48
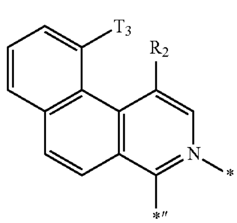
CY49
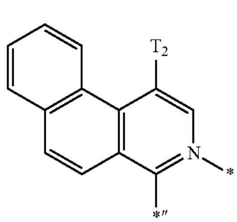
CY50
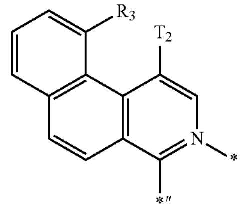
CY51
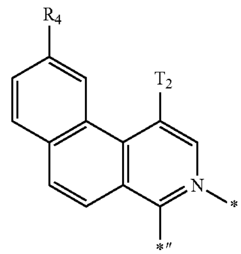
CY52
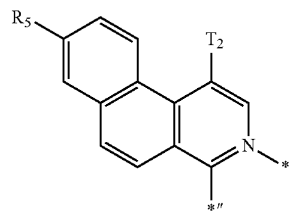
CY53
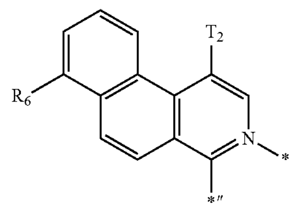
CY54
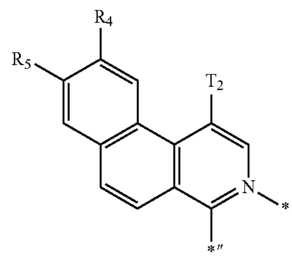
CY55
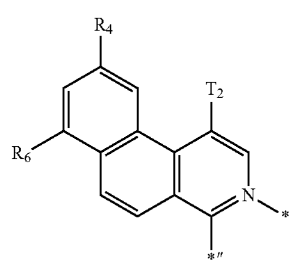
CY56
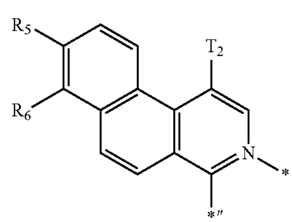

CY57
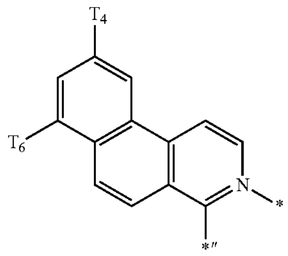
CY58
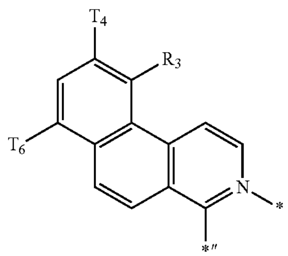
CY59
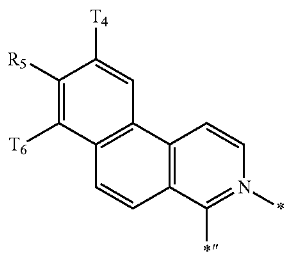
CY60
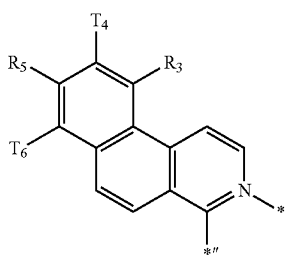
CY61
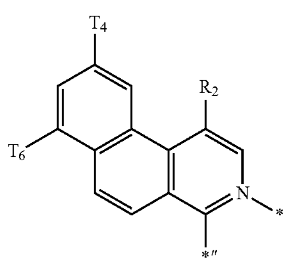
CY62
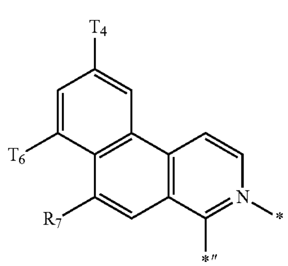
CY63
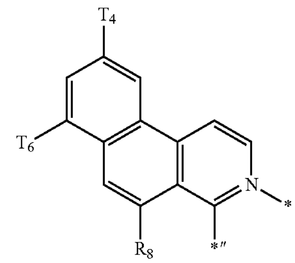
CY64
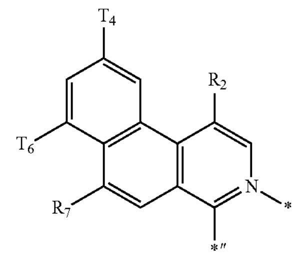
CY65
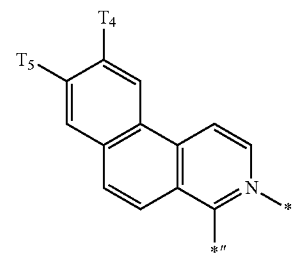
CY66
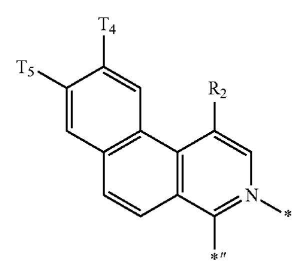
CY67
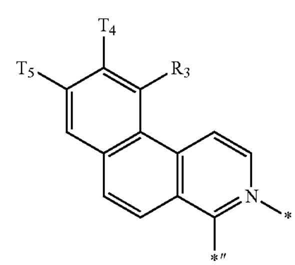
CY68
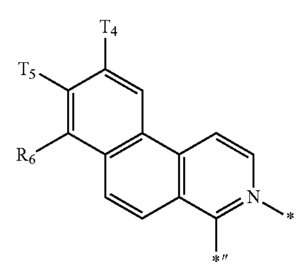

-continued
CY69
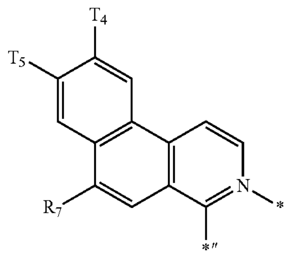
CY70
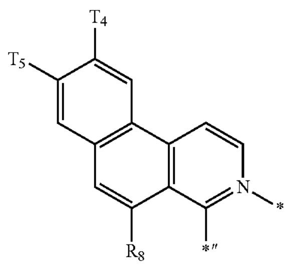
CY71
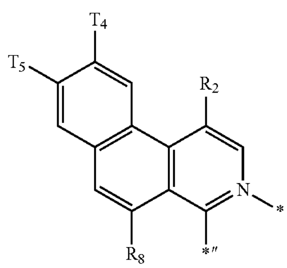
CY72
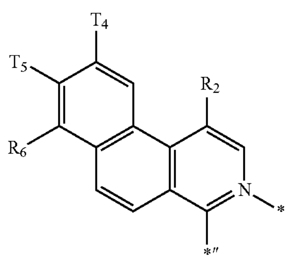
CY73
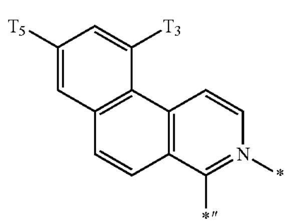
CY74
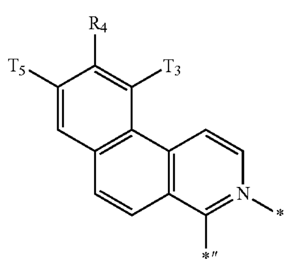
-continued
CY75
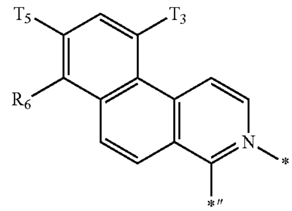
CY76
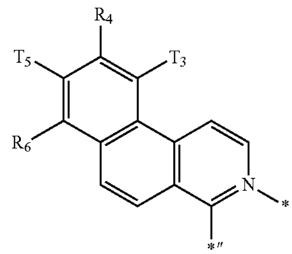
CY77
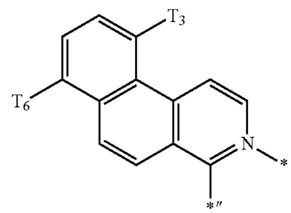
CY78
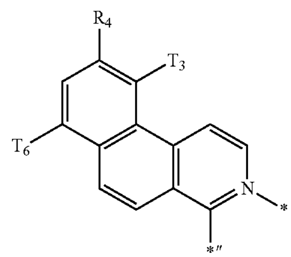
CY79
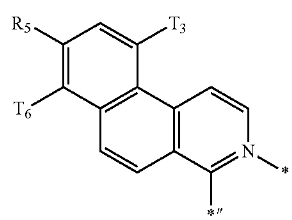
CY80
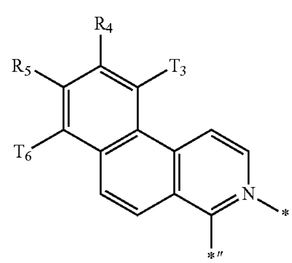
CY81
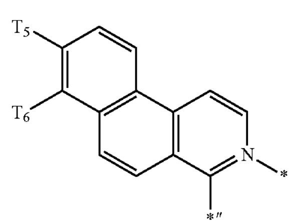

CY82
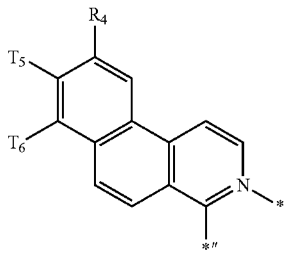
CY83
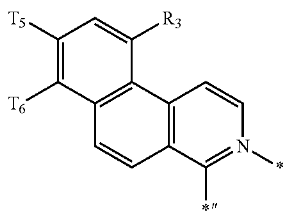
CY84
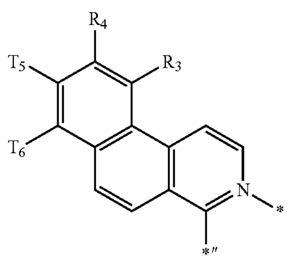
CY85
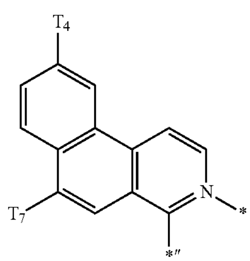
CY86
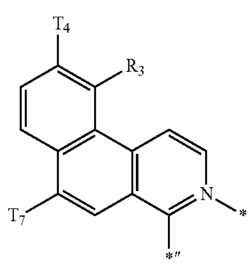
CY87
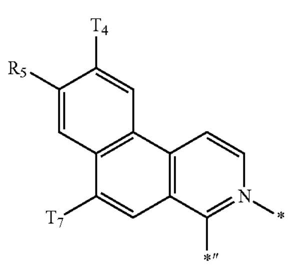
CY88
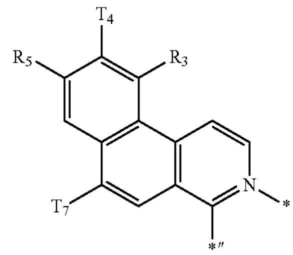
CY89
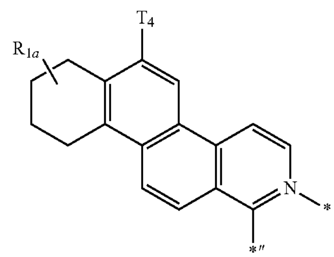
CY90
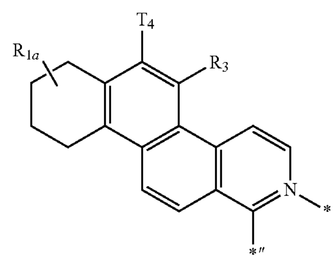
CY91
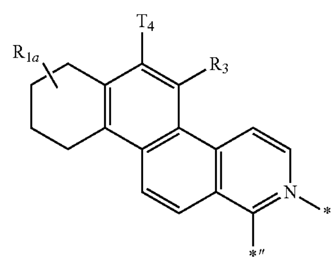
CY92
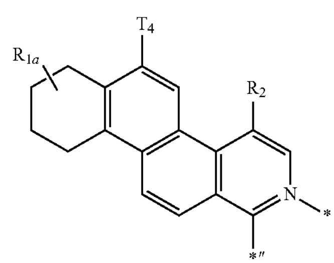
CY93
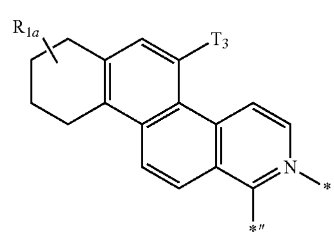

-continued
CY94
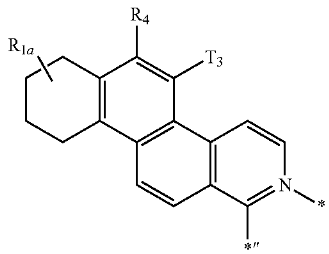
CY95
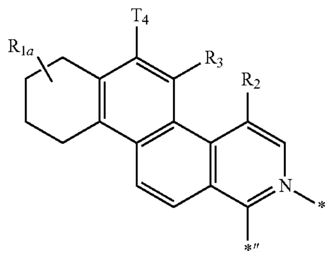
CY96
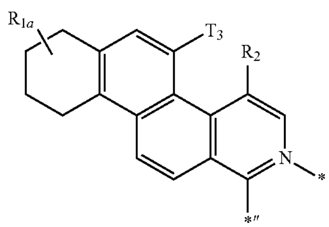
CY97
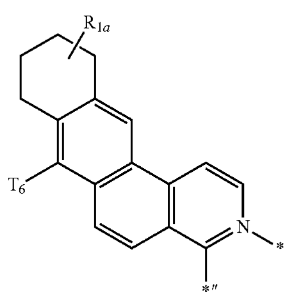
CY98
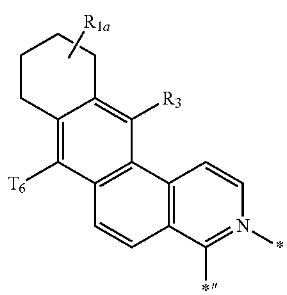
CY99
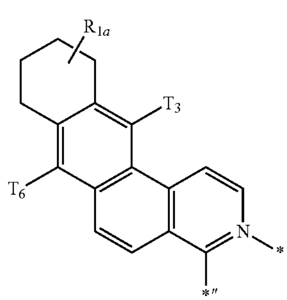
-continued
CY100
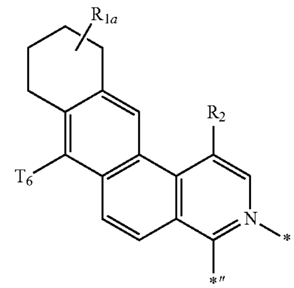
CY101
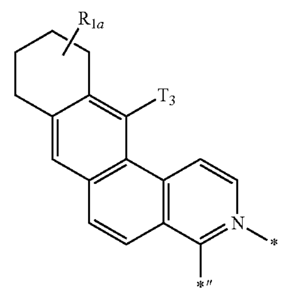
CY102
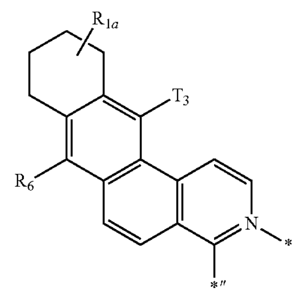
CY103
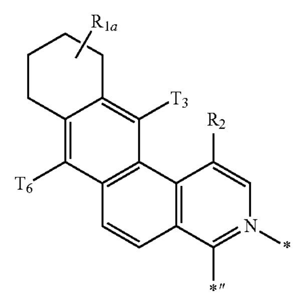
CY104
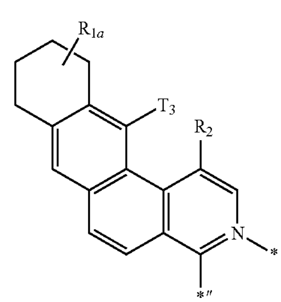

-continued

CY105

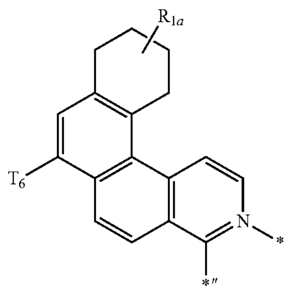

CY106

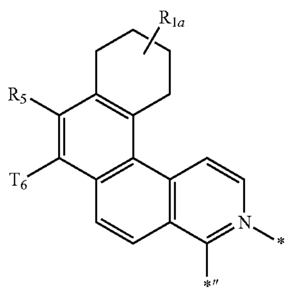

CY107

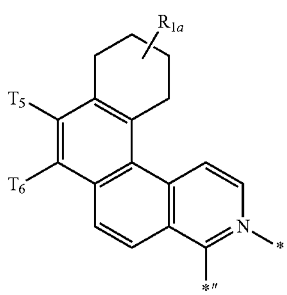

CY108

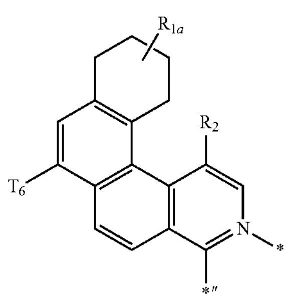

CY109

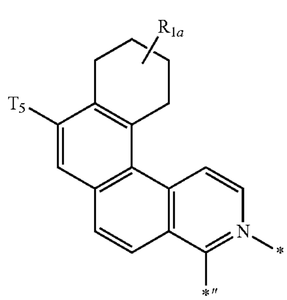

-continued

CY110

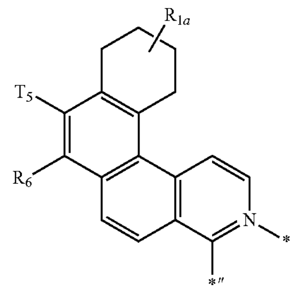

CY111

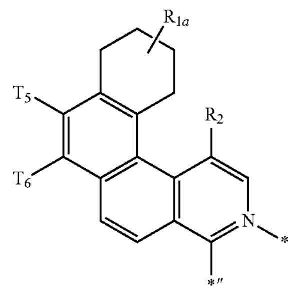

CY112

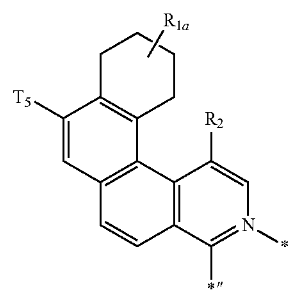

wherein, in Formulae CY1 to CY112, $T_2$ to $T_8$ are each independently a fluoro group or a fluorinated group, $R_{1a}$ is the same as described in claim 1, $R_2$ is $R_2'$, $R_3$ is $R_3'$, $R_4$ is $R_4'$, $R_5$ is $R_5'$, $R_6$ is $R_6'$, $R_7$ is $R_7'$, and $R_8$ is $R_8'$, wherein $R_2'$ to $R_8'$ are each independently deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)$ ($Q_9$), wherein $Q_1$ to $Q_9$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof, a phosphoric acid group or a salt thereof; a $C_1$-$C_{60}$ alkyl group which is unsubstituted or substituted with deuterium, a $C_1$-$C_{60}$ alkyl group, or a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group which is unsubstituted or substituted with deuterium, a $C_1$-$C_{60}$ alkyl group, or a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group,

* is a binding site to Ir in Formula 1, and

*" is a binding site to a neighboring atom in Formula 1-1.

11. The organometallic compound of claim 10, wherein a group represented by

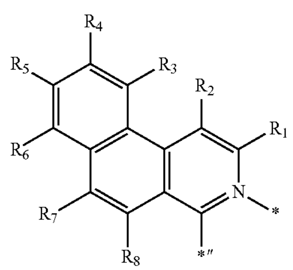

in Formula 1-1 is represented by one of Formula CY1, CY9, CY11, CY17, CY19, CY25, CY30, CY57, CY64, or CY85.

12. The organometallic compound of claim 1, wherein $R_9$ and $R_{11}$ in Formula A(1) are each independently:

deuterium; or a $C_1$-$C_{20}$ alkyl group, a $C_3$-$C_{10}$ cycloalkyl group, a $C_1$-$C_{10}$ heterocycloalkyl group, a phenyl group, or a biphenyl group, each substituted or substituted with deuterium, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a phenyl group, a deuterated a phenyl group, a ($C_1$-$C_{20}$ alkyl)phenyl group, a biphenyl group, a deuterated biphenyl group, or a ($C_1$-$C_{20}$ alkyl)biphenyl group, or any combination thereof.

13. The organometallic compound of claim 1, wherein the group represented by

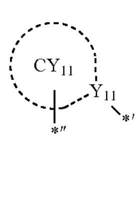

in Formula 1-2 is a group represented by one of Formulae CY11-1 to CY11-16,

CY11-1

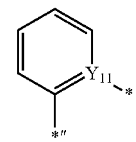

CY11-2

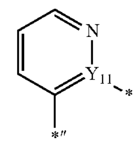

CY11-3

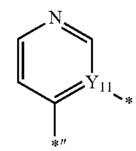

CY11-4

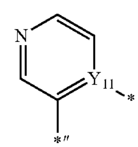

CY11-5

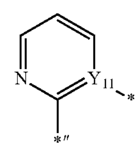

CY11-6

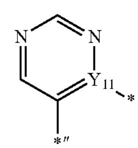

CY11-7

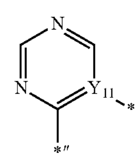

CY11-8

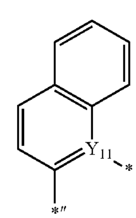

CY11-9

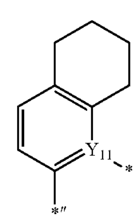

-continued

CY11-10

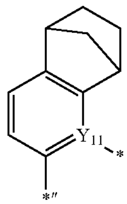

CY11-11

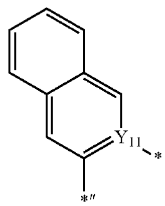

CY11-12

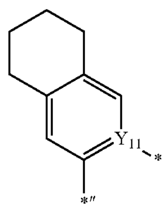

CY11-13

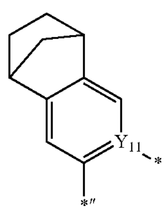

CY11-14

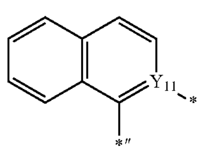

CY11-15

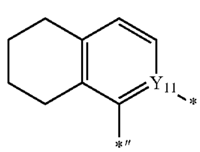

CY11-16

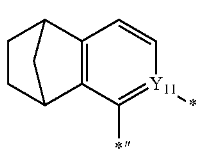

wherein, in Formulae CY11-1 to CY11-16, $Y_{11}$ is N,

* and *' each indicate a binding site to Ir in Formula 1, and each *" indicates a binding site to a neighboring atom.

14. The organometallic compound of claim 1, wherein a group represented by

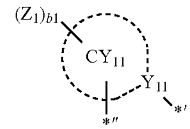

in Formula 1-2 is a group represented by one of Formulae CY11(1) to CY11(22) and CY11-8 to CY11-16, and a group represented by

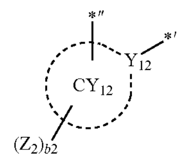

in Formula 1-2 is a group represented by one of Formulae CY12 (1) to CY12-(16) and CY12-8 to CY12-22:

CY11(1)

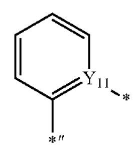

CY11(2)

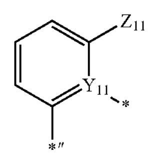

CY11(3)

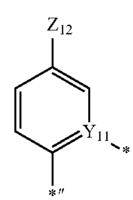

CY11(4)

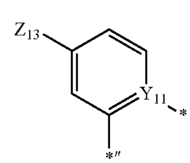

CY11(5)

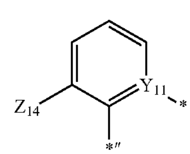

-continued
CY11(6)
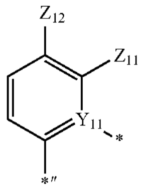
CY11(7)
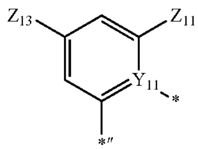
CY11(8)
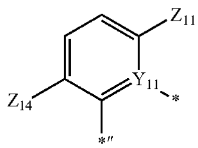
CY11(9)
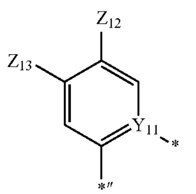
CY11(10)
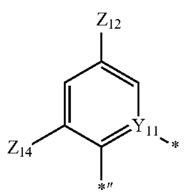
CY11(11)
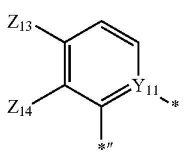
CY11(12)
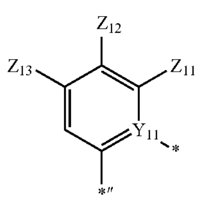
CY11(13)
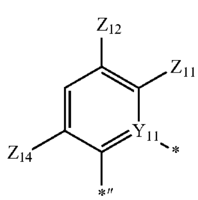
CY11(14)
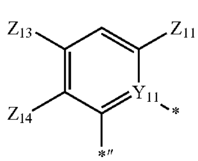
-continued
CY11(15)
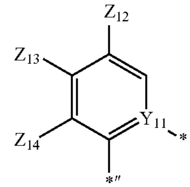
CY11(16)
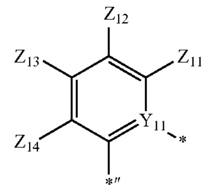
CY11(17)
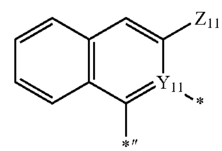
CY11(18)
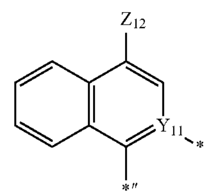
CY11(19)
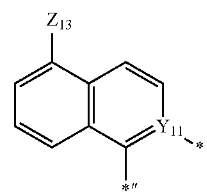
CY11(20)
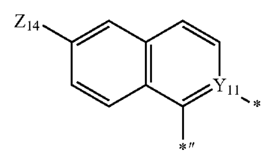
CY11(21)
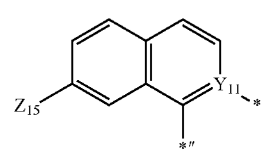
CY11(22)
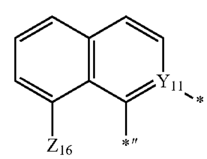
CY11-8
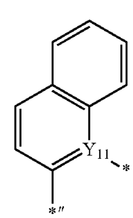

-continued
CY11-9
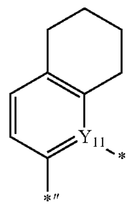
CY11-10
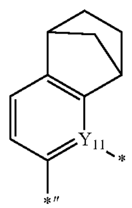
CY11-11
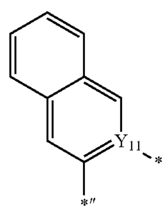
CY11-12
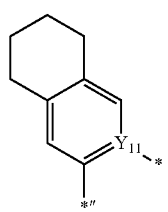
CY11-13
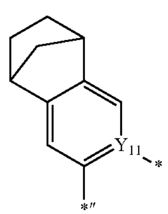
CY11-14
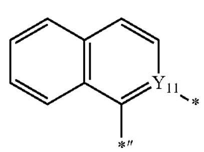
CY11-15
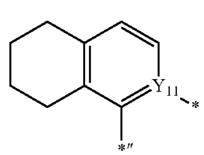
CY11-16
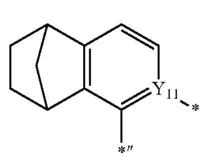
-continued
CY12(1)
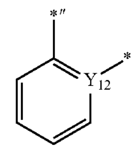
CY12(2)
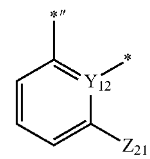
CY12(3)
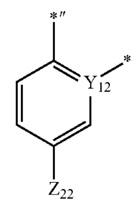
CY12(4)
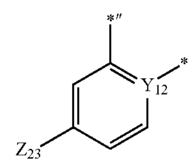
CY12(5)
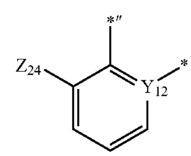
CY12(6)
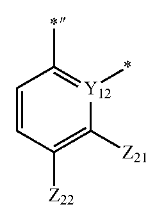
CY12(7)
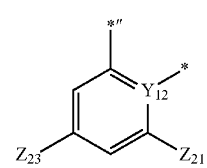
CY12(8)
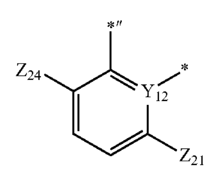
CY12(9)
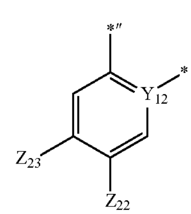

CY12(10)
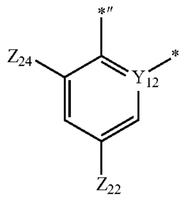
CY12(11)
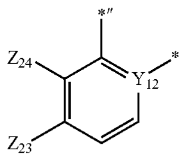
CY12(12)
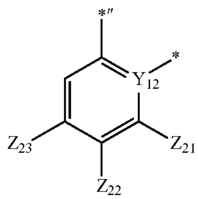
CY12(13)
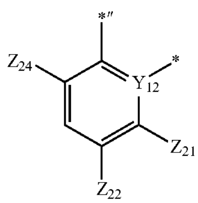
CY12(14)
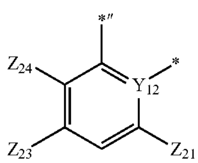
CY12(15)
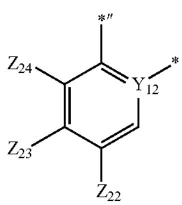
CY12(16)
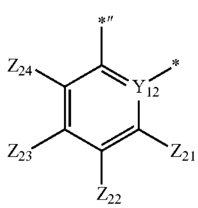
CY12-8
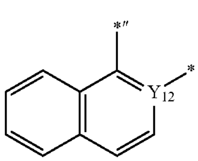
CY12-9
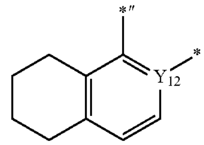
CY12-10
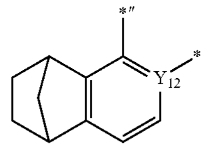
CY12-11
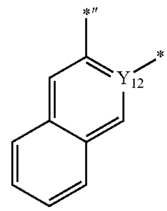
CY12-12
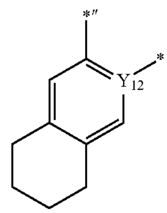
CY12-13
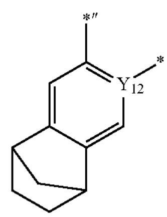
CY12-14
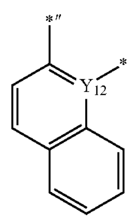
CY12-15
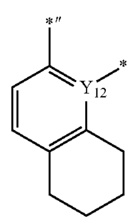
CY12-16
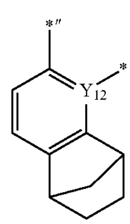

-continued

CY12-17

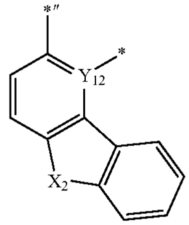

CY12-18

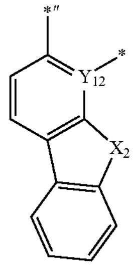

CY12-19

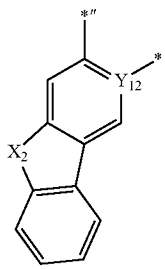

CY12-20

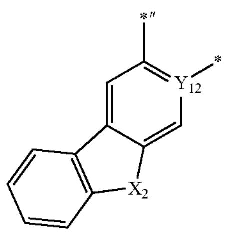

CY12-21

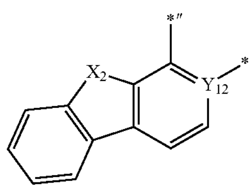

CY12-22

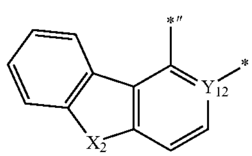

wherein, in Formulae CY11(1) to CY11(16), CY11-8 to CY11-16, CY12(1) to CY12-(16) and CY12-8 to CY12-22, $Y_{11}$ is N, $Y_{12}$ is C, $X_2$ is O, S, $N(Z_{25})$, $C(Z_{25})(Z_{26})$, or $Si(Z_{25})(Z_{26})$, $Z_{11}$ to $Z_{16}$ are the same as described in connection with $Z_1$ in claim 1, and each of $Z_{11}$ to $Z_{16}$ is not hydrogen, $Z_{21}$ to $R_{26}$ are the same as described in connection with $Z_2$ in claim 1 and each of $Z_{21}$ to $Z_{24}$ is not hydrogen,

* and *' each indicate a binding site to Ir in Formula 1, and each *" indicates a binding site to a neighboring atom.

15. The organometallic compound of claim 1, wherein the organometallic compound is one of Compounds 1 to 27:

1

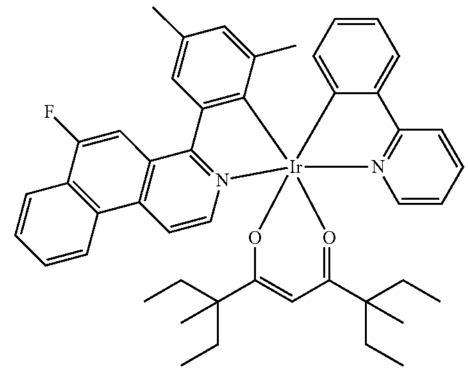

2

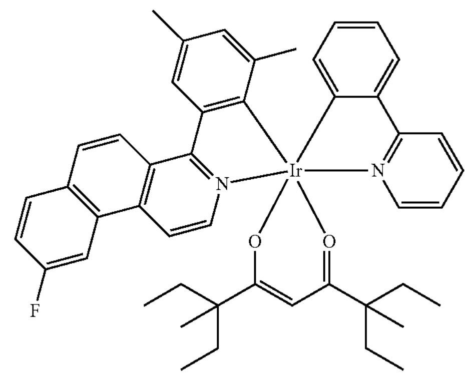

3

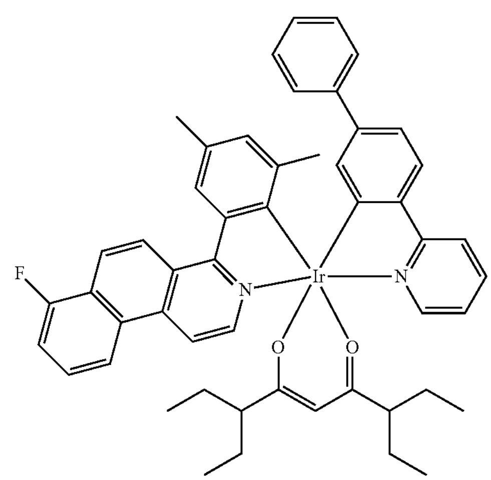

4
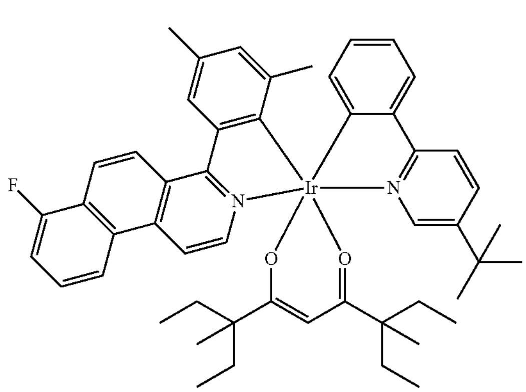
5
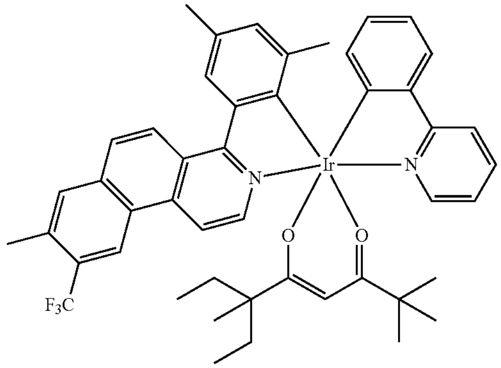
6
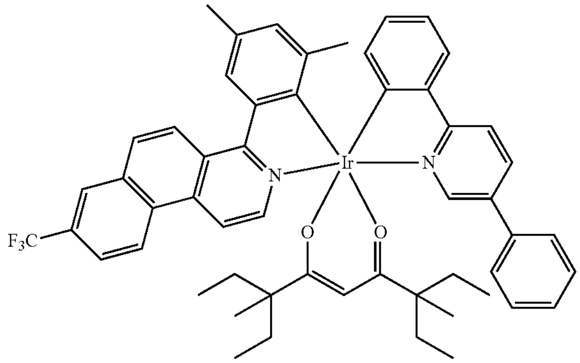
7
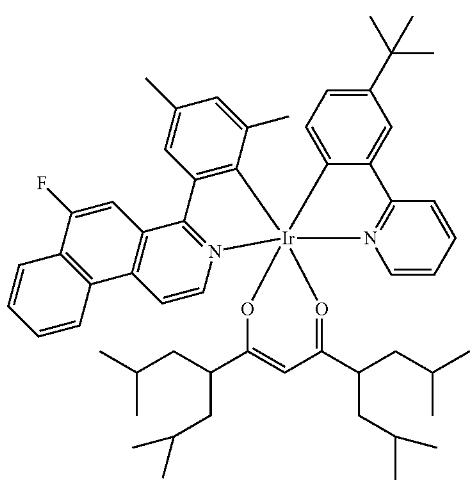
8
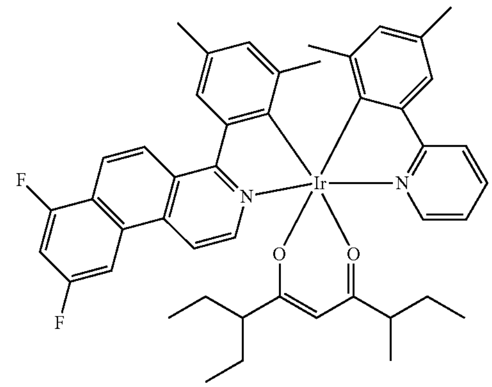
9
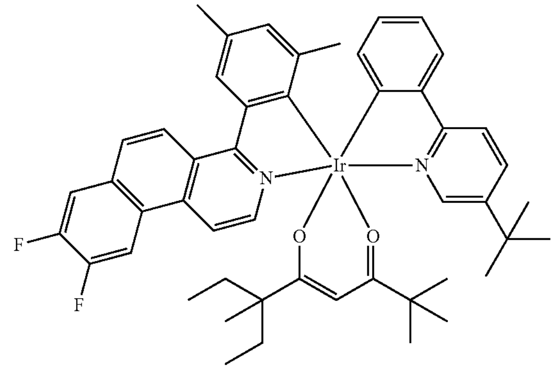
10
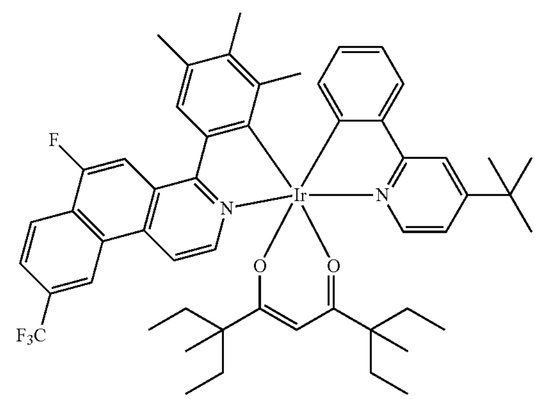
11
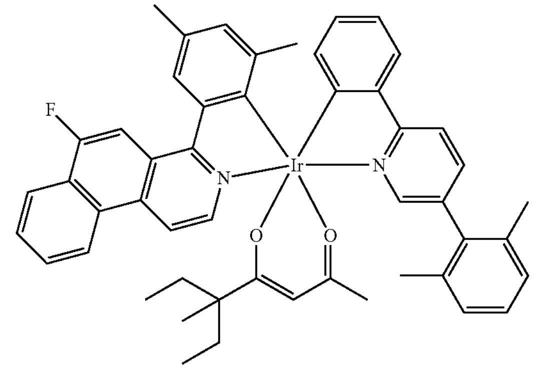

-continued
12
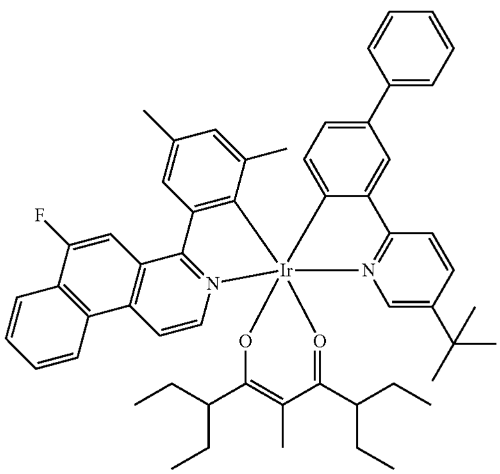
13
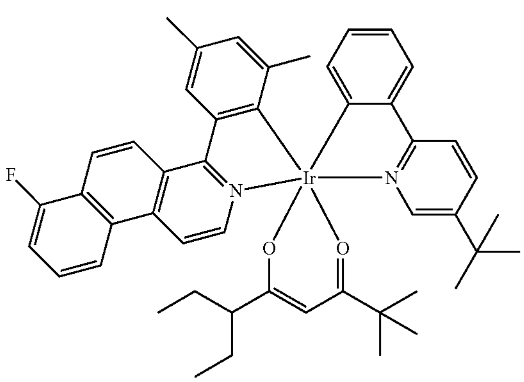
14
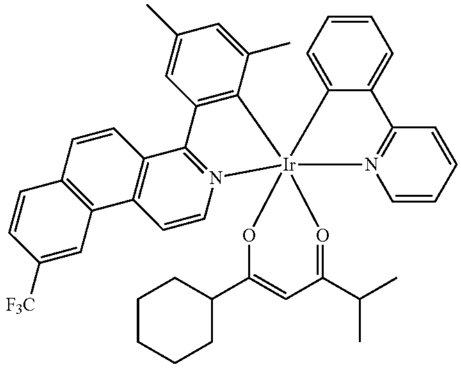
-continued
15
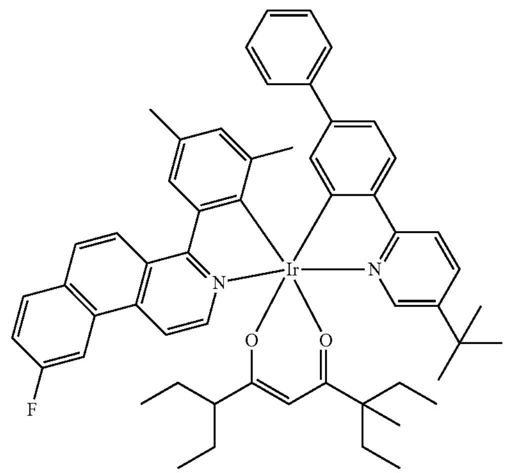
16
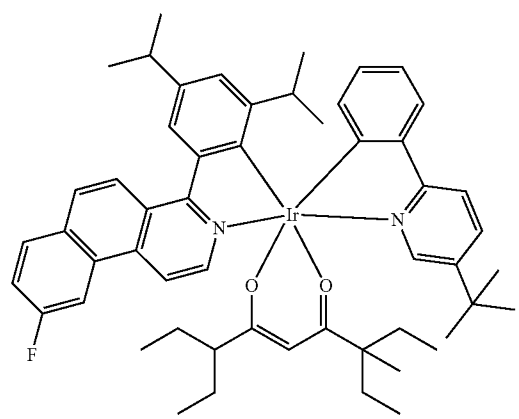
17
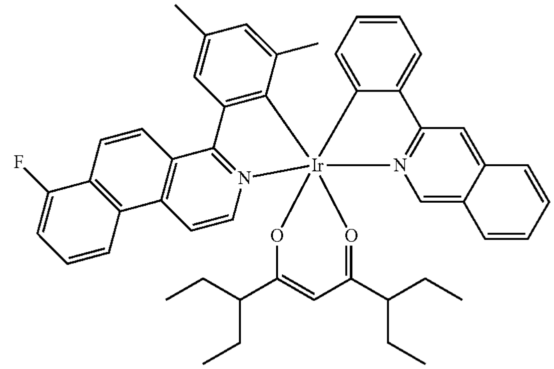

-continued
18
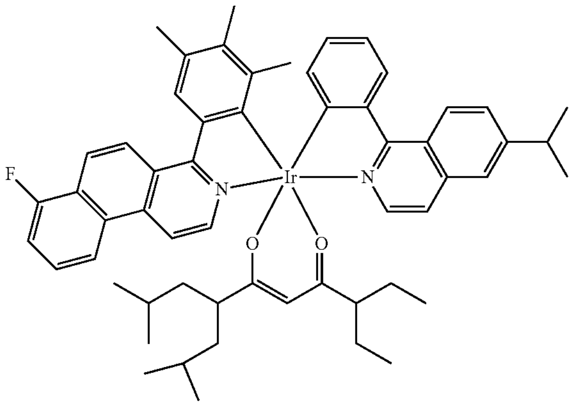
19
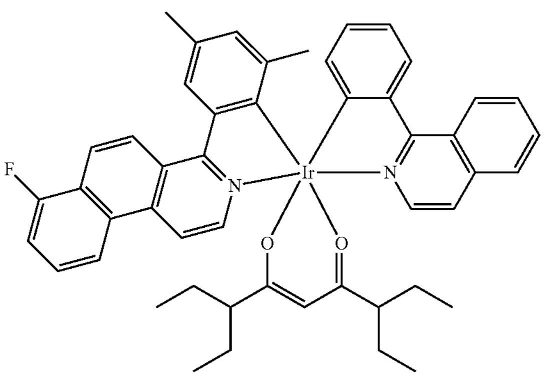
20
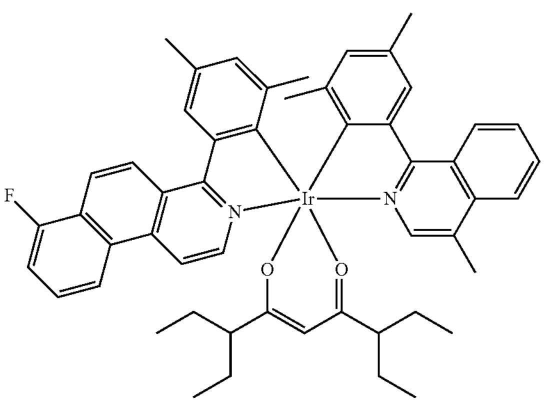
21
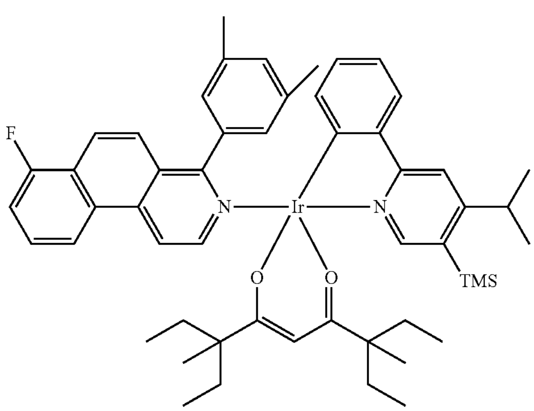
-continued
22
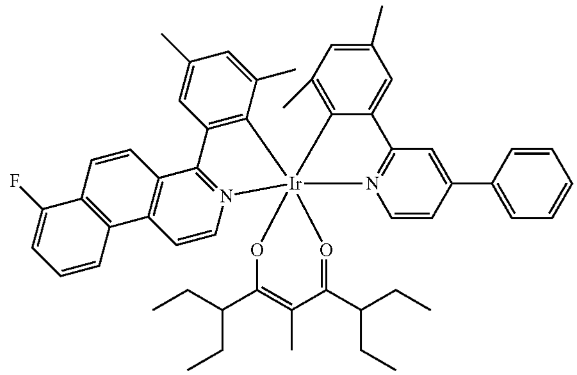
23
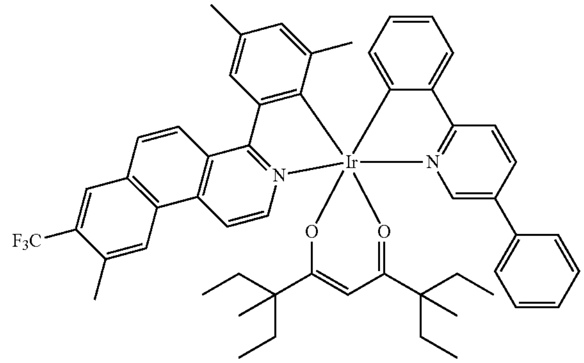
24
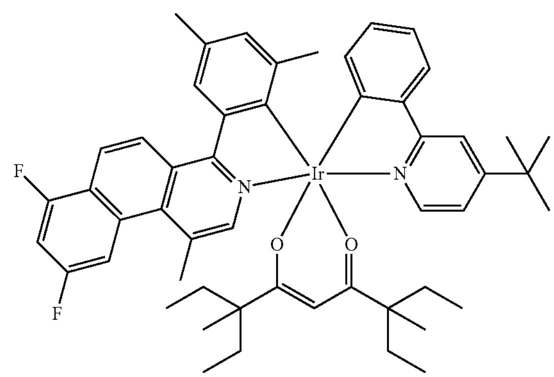
25
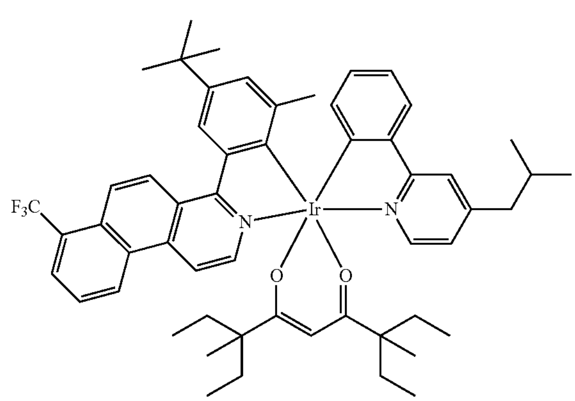

-continued

26

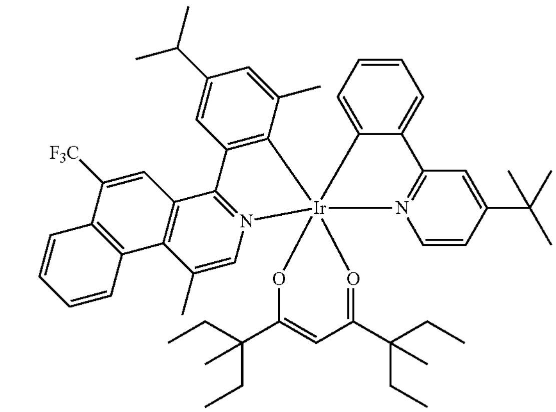

27

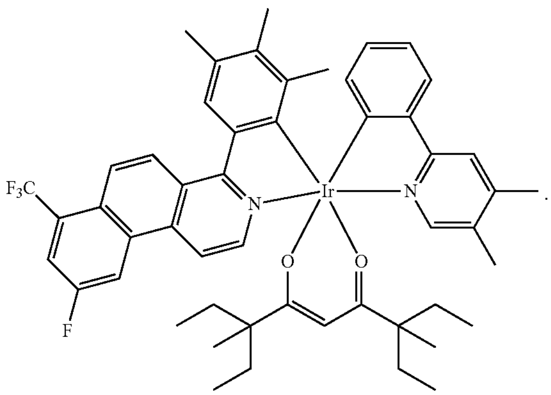

16. An organic light-emitting device comprising:

a first electrode;

a second electrode; and an organic layer between the first electrode and the second electrode, wherein the organic layer comprises an emission layer and at least one organometallic compound of claim 1.

17. The organic light-emitting device of claim 16, wherein the first electrode is an anode, the second electrode is a cathode, the organic layer further comprises a hole transport region between the first electrode and the emission layer and an electron transport region between the emission layer and the second electrode, the hole transport region comprises a hole injection layer, a hole transport layer, an electron blocking layer, or a buffer layer, or any combination thereof, and the electron transport region comprises a hole blocking layer, an electron transport layer, or an electron injection layer, or any combination thereof.

18. The organic light-emitting device of claim 16, wherein the organometallic compound is included in the emission layer.

19. An apparatus comprising the organic light-emitting device of claim 16.

* * * * *